United States Patent
Khurana et al.

(10) Patent No.: US 12,502,665 B2
(45) Date of Patent: Dec. 23, 2025

(54) ON-FLOW CELL THREE DIMENSIONAL POLYMER STRUCTURES

(71) Applicant: ILLUMINA, INC., San Diego, CA (US)

(72) Inventors: Tarun Kumar Khurana, Freemont, CA (US); Elisabet Rosas-Canyelles, El Cerrito, CA (US); Yir-shyuan Wu, Albany, CA (US); Hayden Black, San Diego, CA (US); Mathieu Lessard-Viger, San Diego, CA (US); Maxwell Zimmerley, San Diego, CA (US); Sean Ramirez, San Diego, CA (US)

(73) Assignee: ILLUMINA, INC., San Diego, CA (US)

( * ) Notice: Subject to any disclaimer, the term of this patent is extended or adjusted under 35 U.S.C. 154(b) by 851 days.

(21) Appl. No.: 17/435,229

(22) PCT Filed: Nov. 25, 2020

(86) PCT No.: PCT/US2020/062163
§ 371 (c)(1),
(2) Date: Aug. 31, 2021

(87) PCT Pub. No.: WO2021/108499
PCT Pub. Date: Jun. 3, 2021

(65) Prior Publication Data
US 2022/0143603 A1     May 12, 2022

Related U.S. Application Data

(60) Provisional application No. 62/941,197, filed on Nov. 27, 2019, provisional application No. 62/941,215, (Continued)

(30) Foreign Application Priority Data

Dec. 20, 2019 (NL) .................................. 2024527
Dec. 20, 2019 (NL) .................................. 2024528
Dec. 31, 2019 (NL) .................................. 2024596

(51) Int. Cl.
*B01L 3/00* (2006.01)
*B01L 7/00* (2006.01)
(Continued)

(52) U.S. Cl.
CPC ... *B01L 3/502707* (2013.01); *B01L 3/502715* (2013.01); *B01L 7/52* (2013.01);
(Continued)

(58) Field of Classification Search
CPC ......... B01L 3/502707; B01L 3/502715; B01L 7/52; B01L 2200/16; B01L 2300/069;
(Continued)

(56) References Cited

U.S. PATENT DOCUMENTS 9,309,571 B2    4/2016    Shen et al.
9,815,916 B2    11/2017    Brown et al.
(Continued)

FOREIGN PATENT DOCUMENTS

JP      2019-501635 A    1/2019
WO   WO 2019/028047 A1   2/2019
WO   WO 2019/028166 A1   2/2019

OTHER PUBLICATIONS

Heo, Jinseok, et al. "A Microfluidic Bioreactor Based on Hydrogel-Entrapped *E. coli*: Cell Viability, Lysis, and Intracellular Enzyme Reactions." *Analytical chemistry* 75.1 (2003): 22-26.
(Continued)

*Primary Examiner* — Jill A Warden
*Assistant Examiner* — Alex Ramirez
(74) *Attorney, Agent, or Firm* — Frost Brown Todd LLP

(57) ABSTRACT

A method for making on-flow cell three-dimensional polymer structures includes loading a polymer precursor solution onto a flow cell. The polymer precursor solution includes a monomer, a crosslinker, and a photoinitiator. The flow cell includes at least one channel for receiving the polymer precursor solution. The at least one channel has an upper interior surface and a lower interior surface. The method further includes illuminating the polymer precursor solution through a patterned photomask using a light at a wavelength sufficient to activate the photoinitiator. Activation of the
(Continued)

photoinitiator polymerizes at least some of the polymer precursor solution underneath apertures in the patterned photomask and forms three-dimensional polymer structures that extend from the upper interior surface to the lower interior surface of the at least one channel.

20 Claims, 31 Drawing Sheets

Specification includes a Sequence Listing.

Related U.S. Application Data filed on Nov. 27, 2019, provisional application No. 62/941,242, filed on Nov. 27, 2019.

(51) Int. Cl.
   *C08F 2/48* (2006.01)
   *C08F 220/56* (2006.01)
   *C40B 30/04* (2006.01)
   *G03F 7/00* (2006.01)
   *G03F 7/028* (2006.01)

(52) U.S. Cl.
   CPC ............ *C08F 2/48* (2013.01); *C08F 220/56* (2013.01); *C40B 30/04* (2013.01); *G03F 7/0037* (2013.01); *G03F 7/028* (2013.01); *B01L 2200/16* (2013.01); *B01L 2300/069* (2013.01); *B01L 2300/12* (2013.01); *B01L 2300/16* (2013.01)

(58) Field of Classification Search
   CPC .... B01L 2300/12; B01L 2300/16; C08F 2/48; C08F 220/56; C40B 30/04; G03F 7/0037; G03F 7/028
   See application file for complete search history.

(56) References Cited

U.S. PATENT DOCUMENTS

| | | | |
|---|---|---|---|
| 9,944,924 B2 | 4/2018 | Rigatti et al. | |
| 10,011,872 B1 | 7/2018 | Belgrader et al. | |
| 10,167,505 B2 | 1/2019 | Shen et al. | |
| 10,208,142 B2 | 2/2019 | Brown et al. | |
| 10,323,278 B2 | 6/2019 | Belgrader et al. | |
| 10,400,235 B2 | 9/2019 | Belhocine et al. | |
| 10,428,326 B2 | 10/2019 | Belhocine et al. | |
| 2003/0175824 A1 | 9/2003 | Pishko et al. | |
| 2006/0110722 A1* | 5/2006 | Beebe ................. | B01L 3/5027 435/287.1 |
| 2009/0209436 A1 | 8/2009 | Larman et al. | |
| 2012/0316086 A1 | 12/2012 | Lin et al. | |
| 2015/0119280 A1 | 4/2015 | Srinivas et al. | |
| 2016/0133517 A1 | 5/2016 | Delamarche et al. | |
| 2016/0139110 A1 | 5/2016 | Zantl et al. | |
| 2016/0153999 A1* | 6/2016 | Tibbitt ............ | B01L 3/502761 435/308.1 |
| 2017/0136434 A1 | 5/2017 | Barnard et al. | |
| 2017/0145169 A1* | 5/2017 | Oakey ................... | A61K 35/12 |
| 2019/0153532 A1 | 5/2019 | Bharadwaj et al. | |
| 2019/0194363 A1 | 6/2019 | Brown et al. | |
| 2019/0233878 A1 | 8/2019 | Delaney et al. | |
| 2019/0249226 A1 | 8/2019 | Bent et al. | |
| 2020/0216895 A1* | 7/2020 | Khurana ............. | C12Q 1/6806 |

OTHER PUBLICATIONS

Tan, Swee Jin, et al. "Microdevice for the isolation and enumeration of cancer cells from blood." *Biomedical microdevices* 11.4 (2009): 883-892.

International Search Report and Written Opinion dated May 21, 2021, for International Application No. PCT/US2020/062163, 17 pages.

Netherlands Search Report and Written Opinion dated Oct. 1, 2020, for Application No. 2024527, 12 pages.

Netherlands Search Report and Written Opinion dated Oct. 1, 2020, for Application No. 2024528, 13 pages.

Netherlands Search Report and Written Opinion dated Oct. 1, 2020, for Application No. 2024596, 14 pages.

D'eramo, Loïc, et al. "Microfluidic actuators based on temperature-responsive hydrogels." *Microsystems & Nanoengineering* 4.1 (2018): 1-7.

Faley, Shannon L., et al. "Microfluidic single cell arrays to interrogate signalling dynamics of individual, patient-derived hematopoietic stem cells." *Lab on a Chip* 9.18 (2009): 2659-2664.

Gyarmati, Benjamin, Árpád Némethy, and András Szilágyi. "Reversible disulphide formation in polymer networks: A versatile functional group from synthesis to applications." *European Polymer Journal* 49.6 (2013): 1268-1286.

Hynd, Matthew R., et al. "Functionalized hydrogel surfaces for the patterning of multiple biomolecules." *Journal of Biomedical Materials Research Part A: An Official Journal of The Society for Biomaterials, The Japanese Society for Biomaterials, and The Australian Society for Biomaterials and the Korean Society for Biomaterials* 81.2 (2007): 347-354.

Jeon, Wonjin, and Chee Burm Shin. "Design and simulation of passive mixing in microfluidic systems with geometric variations." *Chemical engineering journal* 152.2-3 (2009): 575-582.

Mitchell, Haydn T., et al. "Poly (N-isopropylacrylamide) hydrogels for storage and delivery of reagents to paper-based Analytical devices." *Chromatography* 2.3 (2015): 436-451.

\* cited by examiner

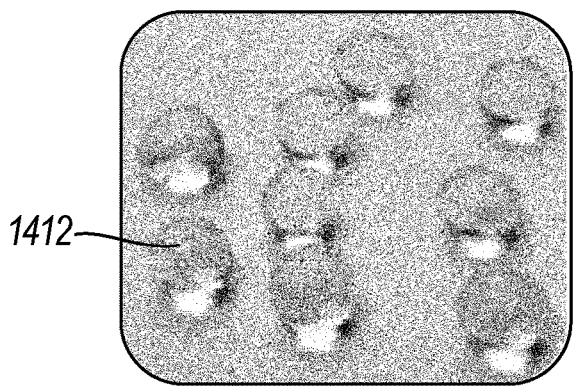
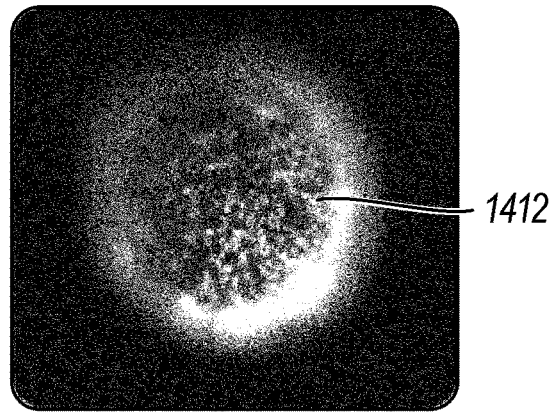
FIG. 11A  FIG. 11B
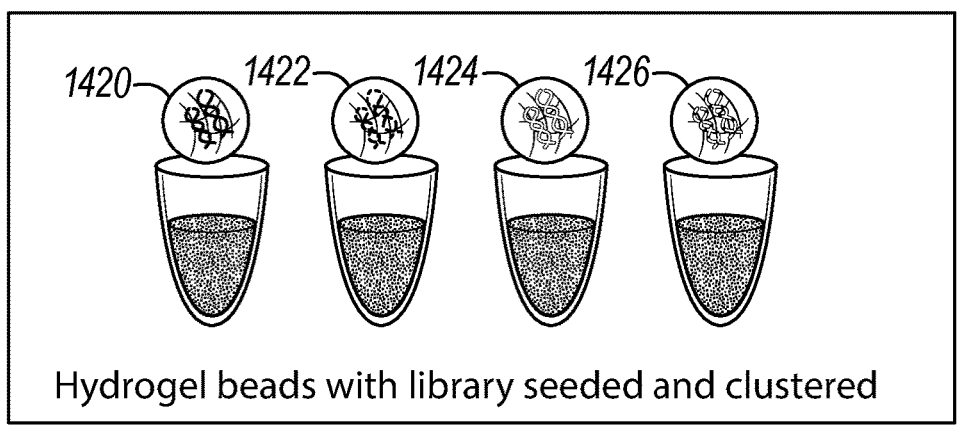
FIG. 12A Hydrogel beads with library seeded and clustered
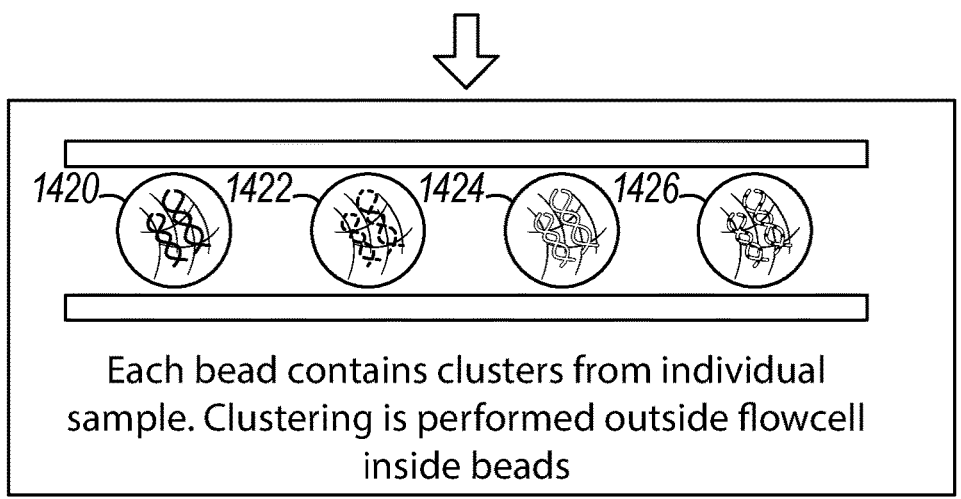
FIG. 12B Each bead contains clusters from individual sample. Clustering is performed outside flowcell inside beads

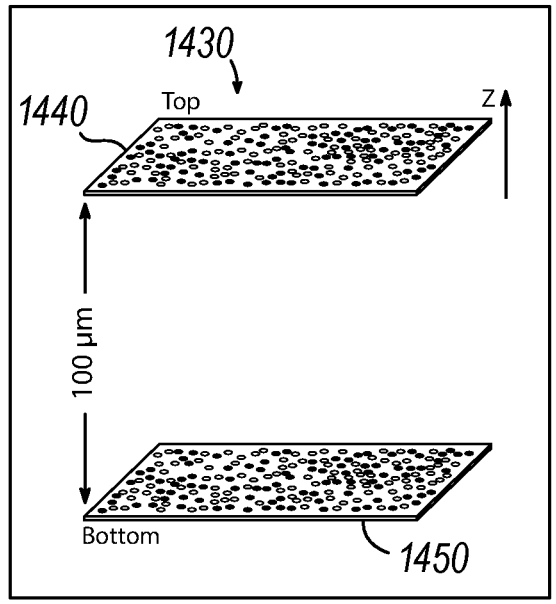 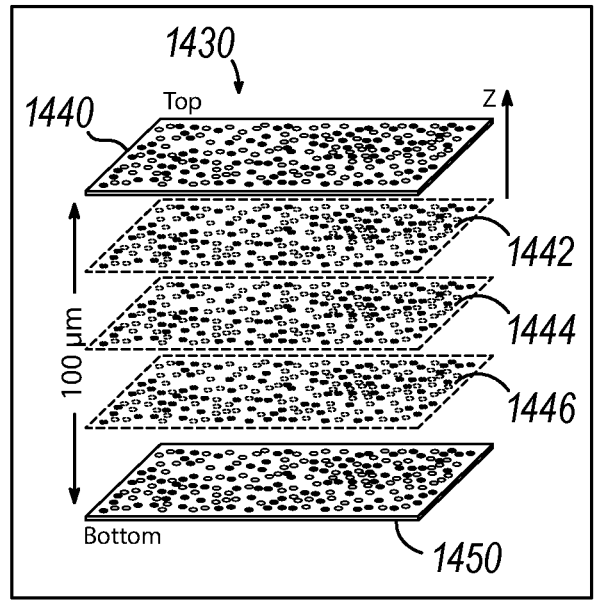
FIG. 13A  FIG. 13B
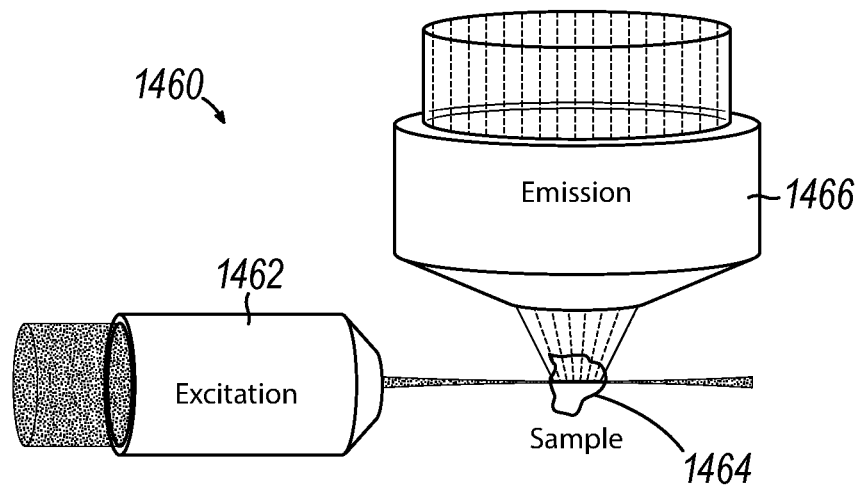
FIG. 14

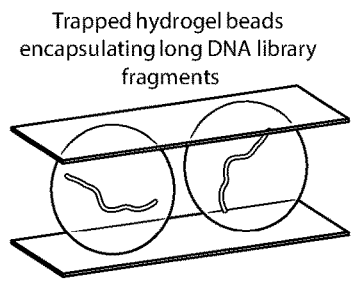
Trapped hydrogel beads encapsulating long DNA library fragments

FIG. 23A

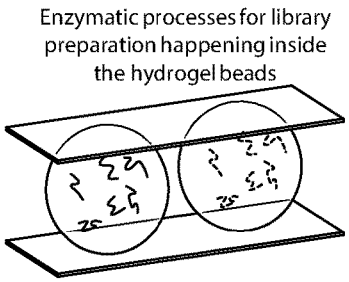
Enzymatic processes for library preparation happening inside the hydrogel beads

FIG. 23B

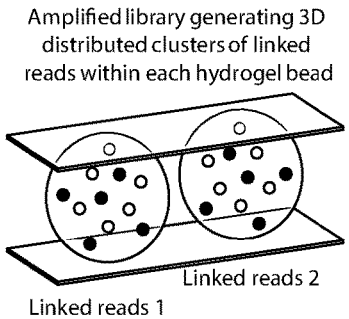
Amplified library generating 3D distributed clusters of linked reads within each hydrogel bead Linked reads 1   Linked reads 2

FIG. 23C

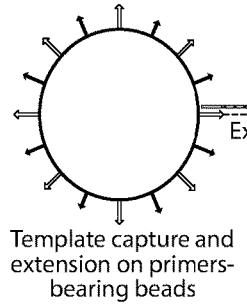
Extension
Template capture and extension on primers-bearing beads

FIG. 24A

Library Amplification

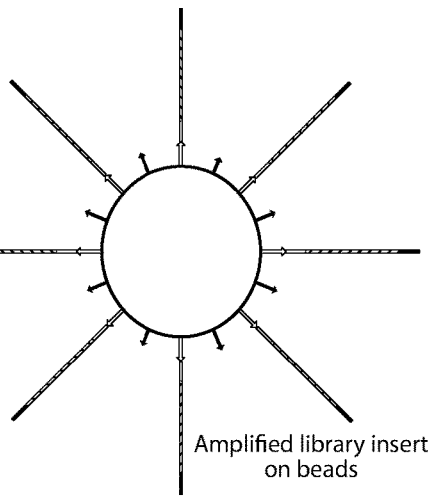
Amplified library insert on beads

FIG. 24B

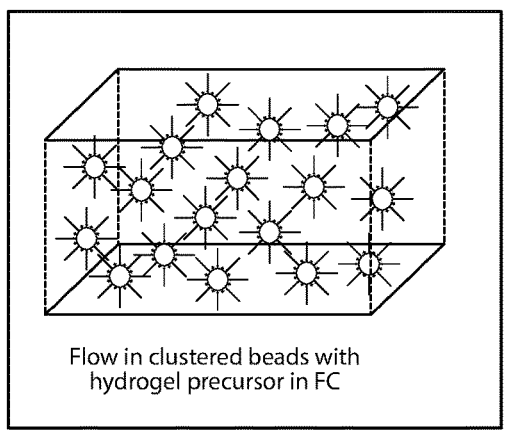
Flow in clustered beads with hydrogel precursor in FC

FIG. 25A

Crosslink hydrogel

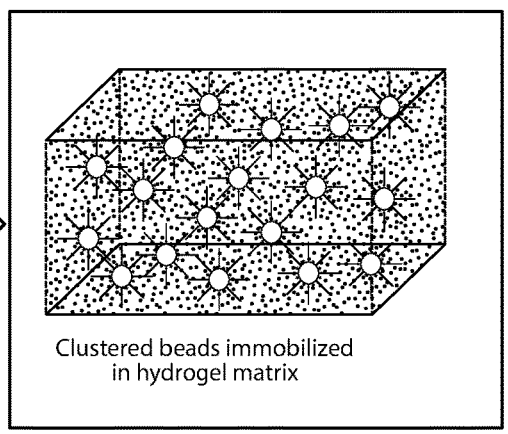
Clustered beads immobilized in hydrogel matrix

FIG. 25B

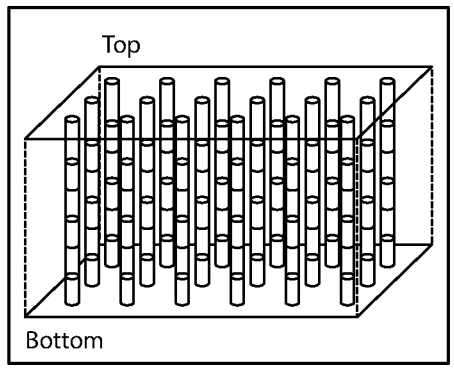
FIG. 28A
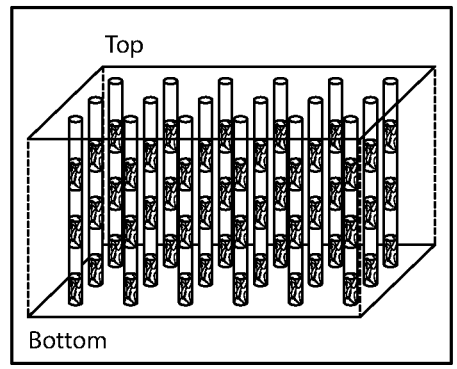
FIG. 28B
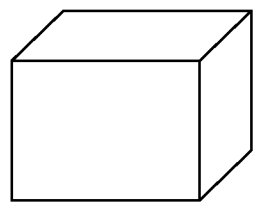
FIG. 29A
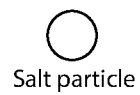
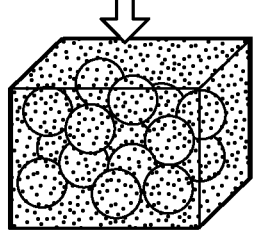
FIG. 29B
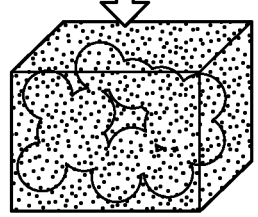
FIG. 29C
FIG. 29D

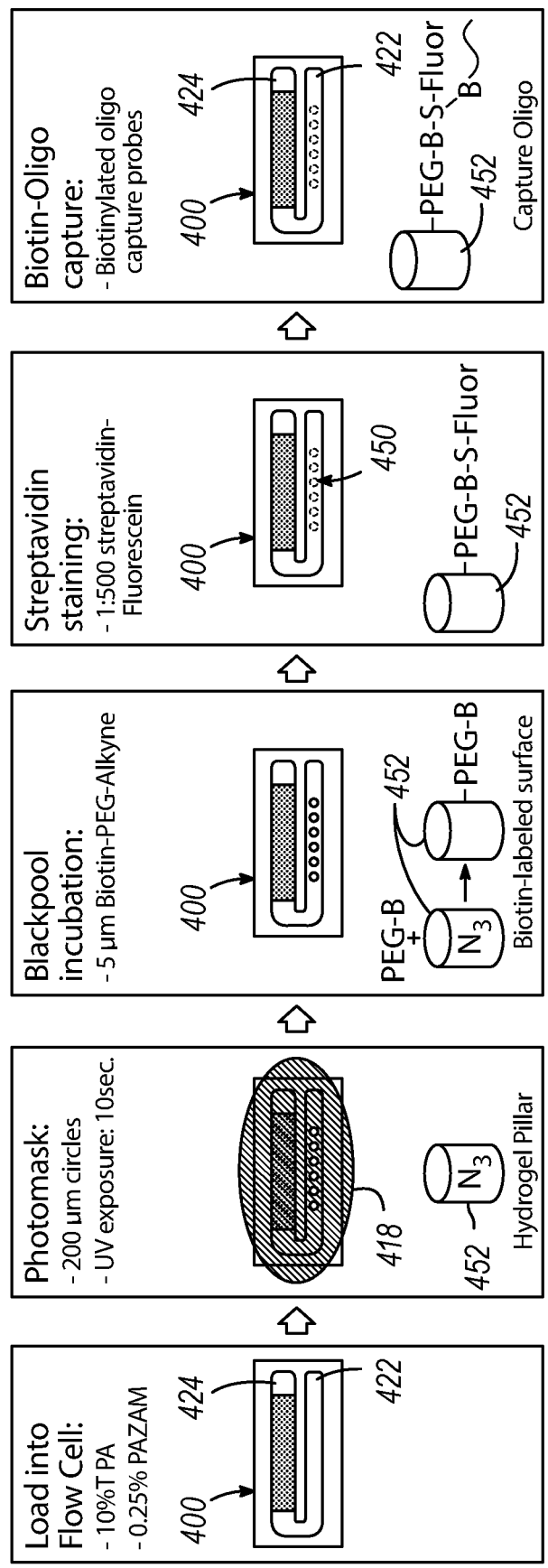

Bright Field 4X

488nm 4X, Strep-Fluor. 5min R.T.

488nm 4X, Strep-Fluor. 10min 40°C

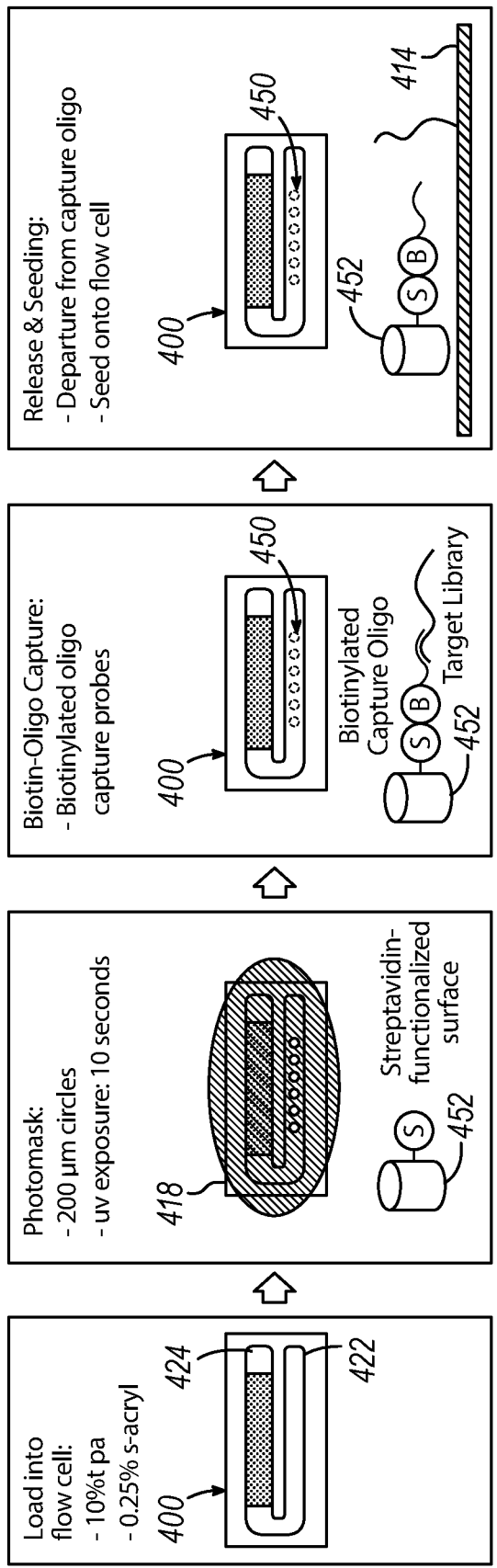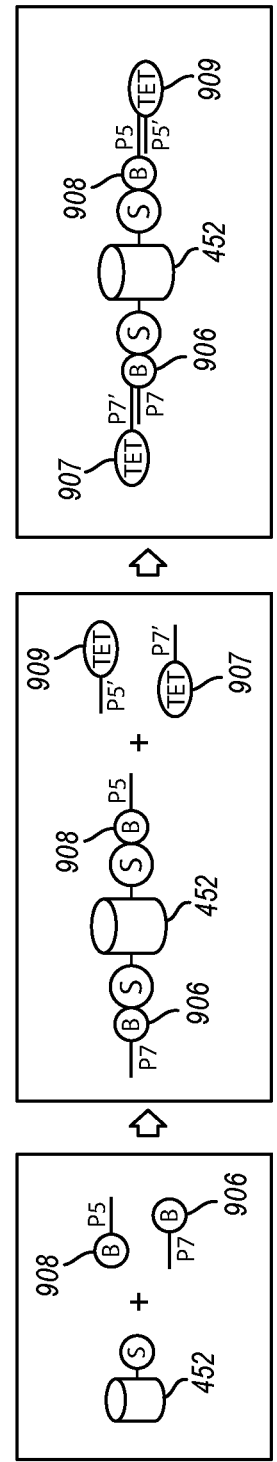

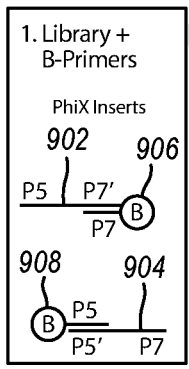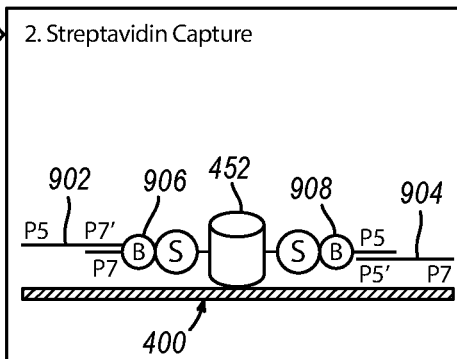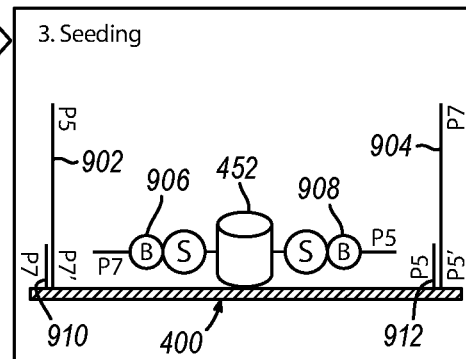
FIG. 41A   FIG. 41B   FIG. 41C
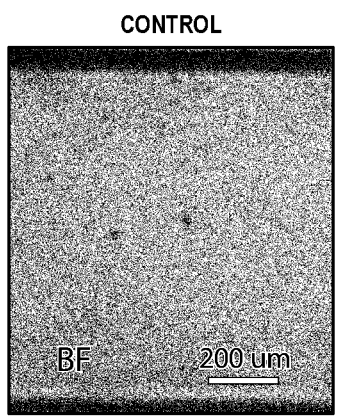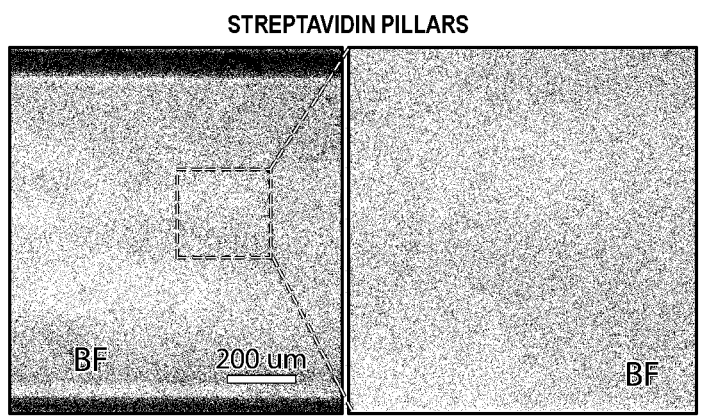
FIG. 42A   FIG. 42C   FIG. 42E
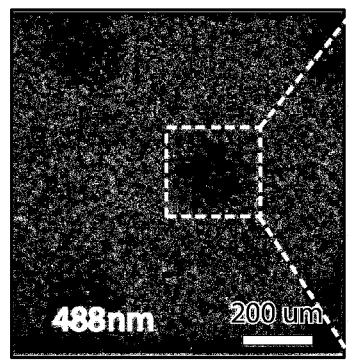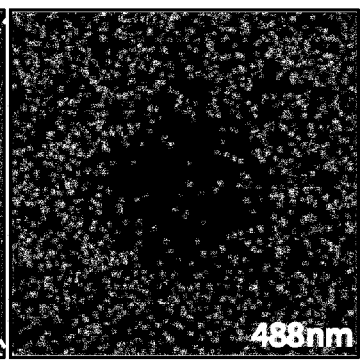
FIG. 42B   FIG. 42D   FIG. 42F

1500

```
┌─────────────────────────────────────────────────────────────────┐
│ LOAD A POLYMER PRECURSOR SOLUTION INTO A FLOW CELL.             │
│ - THE POLYMER PRECURSOR SOLUTION INCLUDES A MONOMER, A CROSSLINKER, │
│   A PHOTOINITIATOR, AND FUNCTIONALIZED POLYMER SUCH AS,         │
│   FOR EXAMPLE, PAZAM CONTAINING AZIDE MOIETIES.                 │──1502
│ - THE FLOW CELL INCLUDES AT LEAST ONE CHANNEL FOR RECEIVING THE │
│   POLYMER PRECURSOR SOLUTION.                                   │
│ - THE AT LEAST ONE CHANNEL HAS AN UPPER INTERIOR SURFACE AND A LOWER │
│   INTERIOR SURFACE.                                             │
└─────────────────────────────────────────────────────────────────┘
                                  ↓
┌─────────────────────────────────────────────────────────────────┐
│ PLACE A PHOTOMASK OVER AT LEAST ONE CHANNEL.                    │──1504
│ - THE PHOTOMASK INCLUDES A SERIES OF APERTURES FORMED THEREIN.  │
└─────────────────────────────────────────────────────────────────┘
                                  ↓
┌─────────────────────────────────────────────────────────────────┐
│ ILLUMIATE THE POLYMER PRECURSOR SOLUTION THROUGH THE PHOTOMASK  │
│ WITH LIGHT AT A WAVELENGTH THAT ACTIVATES THE PHOTOINITIATOR.   │
│ - ACTIVATION OF THE PHOTOINITIATOR POLYMERIZES THE POLYMER      │──1506
│ PRECURSOR SOLUTION UNDERNEATH THE APERTURES IN THE PHOTOMASK AND│
│ FORMS THREE-DIMENSIONAL POLYMER STRUCTURES EXTENDING FROM THE   │
│ UPPER INTERIOR SURFACE TO THE LOWER INTERIOR SURFACE            │
│ OF THE AT LEAST ONE CHANNEL.                                    │
└─────────────────────────────────────────────────────────────────┘
```

FIG. 44

ON-FLOW CELL THREE DIMENSIONAL POLYMER STRUCTURES

RELATED APPLICATIONS

This application is a national stage entry of International Patent Application No. PCT/US2020/062163, entitled "On-Flow Cell Three-Dimensional Polymer Structures," filed on Jun. 3, 2021.

International Patent Application No. PCT/US2020/062163 claims priority to U.S. Provisional Pat. App. No. 62/941,197, entitled "On-Flow Cell Three-Dimensional Polymer Structures," filed Nov. 27, 2019, the disclosure of which is incorporated by reference herein, in its entirety.

International Patent Application No. PCT/US2020/062163 also claims priority to U.S. Provisional Pat. App. No. 62/941,215, entitled "On-Flow Cell Three-Dimensional Sequencing Matrices," filed Nov. 27, 2019, the disclosure of which is incorporated by reference herein, in its entirety.

International Patent Application No. PCT/US2020/062163 application also claims priority to U.S. Provisional Pat. App. No. 62/941,242, entitled "On-Flow Cell Three-Dimensional Polymer Structures Having Functionalized Surfaces," filed Nov. 27, 2019, the disclosure of which is incorporated by reference herein, in its entirety.

International Patent Application No. PCT/US2020/062163 application also claims priority to Netherlands Pat. App. No. N2024527, entitled "On-Flow Cell Three-Dimensional Polymer Structures," filed Dec. 20, 2019, the disclosure of which is incorporated by reference herein, in its entirety.

International Patent Application No. PCT/US2020/062163 application also claims priority to Netherlands Pat. App. No. N2024596, entitled "On-Flow Cell Three-Dimensional Sequencing Matrices," filed Dec. 31, 2019, the disclosure of which is incorporated by reference herein, in its entirety.

International Patent Application No. PCT/US2020/062163 application also claims priority to Netherlands Pat. App. No. N2024528, entitled "On-Flow Cell Three-Dimensional Polymer Structures Having Functionalized Surfaces," filed Dec. 20, 2019, the disclosure of which is incorporated by reference herein, in its entirety.

SEQUENCE LISTING IN ELECTRONIC FORMAT

The present application is being filed along with a Sequence Listing in electronic format. The Sequence Listing is provided as a file entitled Illumina0737385SequenceListing_ST25.txt, created and last saved Nov. 20, 2020 which is one kilobyte in size. The information in the electronic format of the Sequence Listing is incorporated herein by reference in its entirety.

BACKGROUND

Next-generation sequencing ("NGS") is a high-throughput sequencing technology capable of sequencing entire genomes in a rapid and cost-effective manner. In at least one implementation, NGS begins with the creation of a sequencing library that includes genomic DNA that has been randomly fragmented, extracted, and purified. NGS processes such as sequencing-by-synthesis can then be utilized for massively parallel sequencing of the entire genomic library. Single-cell sequencing decodes variation in genomes and transcriptomes of single cells, helping to unravel the mechanisms underlying both health and disease. Many questions surrounding cell-to-cell variation require sequencing hundreds to thousands of cells. However, high-throughput single-cell sequencing may be limited by difficulty in processing hundreds to thousands of single cells while achieving (i) efficient library preparation, (ii) indexing of library molecules, and (iii) minimal losses. Compartmentalization strategies may overcome these challenges by partitioning single cells in separate compartments that both: (i) isolate cells from one another, and (ii) allow for efficient reagent exchange, such that library preparation may occur in parallel across hundreds to thousands of samples and free of cross-contamination.

Some NGS platforms may rely on optical interrogation of surface-bound nucleic acid clusters and produce data at a fairly static rate and at somewhat significant cost per genome. Increasing the throughput of nucleic sequencing methods may be important for driving the cost of sequencing down and improving overall sequencing accuracy. This desired outcome may be achievable by sequencing a greater number of nucleic clusters. Thus, in some cases, either a larger flow cell surface area or a higher cluster density may be implemented to increase the number of clusters that can be sequenced. However, to the extent that sequencing flow cells are approaching size and cluster density limits, making significant improvements to throughput may be increasingly challenging using traditional surface-bound sequencing processes. Accordingly, overcoming these limitations would be beneficial.

In some instances, the large amount of data generated by whole genome sequencing can complicate data processing and analysis. Therefore, as a workaround, portions of genomes may be enriched using various techniques to focus on genes or other specific targets of interest. However, some current methods for library preparation and library enrichment may require multiple manual operation and reagents transfer that lead to losses of targeted library. Accordingly, automatic systems and processes for mitigating losses associated with current sequencing library preparation and enrichment methods may be beneficial; and are disclosed herein.

SUMMARY

The following provides a summary of certain examples. This summary is not an extensive overview and is not intended to identify key or critical aspects or elements of the disclosed system, devices, and methods or to delineate their scope. It is to be understood that any respective features/examples of each of the aspects of the disclosure as described herein may be implemented together in any combination to achieve the results as described herein, and that any features/examples from any one or more of these aspects may be implemented together with any of the features of the other aspect(s) as described herein in any combination to achieve the benefits as described here.

An implementation relates to a method for making on-flow cell three-dimensional polymer structures, comprising: loading a polymer precursor solution onto a flow cell, wherein the polymer precursor solution includes a monomer, a crosslinker, and a photoinitiator, and wherein the flow cell includes at least one channel for receiving the polymer precursor solution, and wherein the at least one channel has an upper interior surface and a lower interior surface; and illuminating the polymer precursor solution through a patterned photomask using a light at a wavelength sufficient to activate the photoinitiator, wherein activation of the photoinitiator polymerizes at least some of the polymer precursor solution underneath apertures in the patterned photomask and forms three-dimensional polymer structures that extend from the upper interior surface to the lower interior surface of the at least one channel.

Variations on any one or more of the above implementations exist, wherein the method further comprises washing unpolymerized polymer precursor solution out of the flow cell.

Variations on any one or more of the above implementations exist, wherein the method further comprises cleaving at least some of the three-dimensional polymer structures from the flow cell using heat, cleaving chemicals, or a combination of heat and cleaving chemicals.

Variations on any one or more of the above implementations exist, wherein the flow cell has oligonucleotides of predetermined lengths on both the upper and lower surfaces of the at least one channel, and wherein the oligonucleotides include primers.

Variations on any one or more of the above implementations exist, wherein the polymer is a hydrogel.

Variations on any one or more of the above implementations exist, wherein the monomer is the compound of formula I:

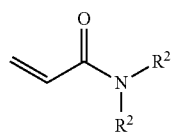

(I)

wherein each $R^2$ is independently hydrogen or $(C_{1-6})$ alkyl.

Variations on any one or more of the above implementations exist, wherein the crosslinker is a compound of formula II:

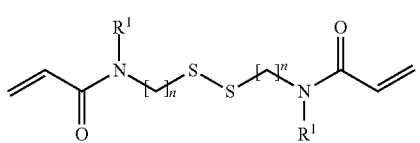

(II)

wherein:
each n is independently an integer from 1-6; and
each $R^1$ is independently hydrogen or $(C_{1-6})$ alkyl.

Variations on any one or more of the above implementations exist, wherein the photoinitiator is a diazosulfonate initiator; a monoacylphosphineoxide (MAPO) salt; a bisacylphosphineoxide (BAPO) salt; or combinations thereof.

Variations on any one or more of the above implementations exist, wherein the monomer is acrylamide, the crosslinker is N,N'-Bis(acryloyl)cystamine (BACy), and the photoinitiator is lithium phenyl-2,4,6-trimethylbenzoylphosphinate (LAP).

Variations on any one or more of the above implementations exist, wherein the polymer precursor solution includes polyethylene glycol (PEG)-thiol, PEG-acrylate, acrylamide, N,N'-Bis(acryloyl)cystamine (BACy), PEG, polypropylene oxide (PPO), polyacrylic acid, poly(hydroxyethyl methacrylate) (PHEMA), poly(methyl methacrylate) (PMMA), poly(N-isopropylacrylamide) (PNIPAAm), poly(lactic acid) (PLA), poly(lactic-co-glycolic acid) (PLGA), polycaprolactone (PCL), poly(vinylsulfonic acid) (PVSA), poly(L-aspartic acid), poly(L-glutamic acid), polylysine, agar, agarose, alginate, heparin, alginate sulfate, dextran sulfate, hyaluronan, pectin, carrageenan, gelatin, chitosan, cellulose, collagen, bisacrylamide, diacrylate, diallylamine, triallylamine, divinyl sulfone, diethyleneglycol diallyl ether, ethyleneglycol diacrylate, polymethyleneglycol diacrylate, polyethyleneglycol diacrylate, trimethylopropoane trimethacrylate, ethoxylated trimethylol triacrylate, ethoxylated pentaerythritol tetracrylate, or combinations thereof.

Variations on any one or more of the above implementations exist, wherein the polymer precursor solution includes polyethylene glycol (PEG)-thiol/PEG-acrylate; acrylamide/N,N'-bis(acryloyl)cystamine (BACy); PEG/polypropylene oxide (PPO), or combinations thereof.

Variations on any one or more of the above implementations exist, wherein the photomask comprises polyethylene terephthalate, carbon ink, a chemically etched metal film, or combinations thereof.

Variations on any one or more of the above implementations exist, wherein the photomask is laminated to the upper exterior surface of the flow cell.

Variations on any one or more of the above implementations exist, wherein illuminating the polymer precursor comprises using an ultraviolet light source to emit the light.

Variations on any one or more of the above implementations exist, wherein the three-dimensional polymer structures are cylindrical.

Variations on any one or more of the above implementations exist, wherein the three-dimensional polymer structures are reverse C-shaped.

Another implementation relates to a method for making on-flow cell three-dimensional polymer structures, comprising: loading a polymer precursor solution onto a flow cell, wherein the polymer precursor solution includes biological cells or colonies of biological cells containing genetic material, a monomer, a crosslinker, and a photoinitiator, and wherein the flow cell includes at least one channel for receiving the polymer precursor solution, wherein the at least one channel has an upper interior surface and a lower interior surface, and wherein primers are bound to both the upper and lower surfaces of the at least one channel; and illuminating the polymer precursor solution through a patterned photomask using a light source that emits light at a wavelength that activates the photoinitiator, and wherein activation of the photoinitiator polymerizes at least some of the polymer precursor solution underneath apertures in the photomask and forms three-dimensional polymer structures that extend from the upper interior surface to the lower interior surface of the at least one channel, and wherein the biological cells or colonies of biological cells are compartmentalized in the three-dimensional polymer structures.

Variations on any one or more of the above implementations exist, wherein the method further comprises washing unpolymerized polymer precursor solution out of the flow cell.

Variations on any one or more of the above implementations exist, wherein the method further comprises diffusing reagents into the three-dimensional polymer structures, wherein the reagents include lysis reagents that lyse the biological cells and release the genetic material therefrom, and wherein the genetic material includes nucleic acid.

Variations on any one or more of the above implementations exist, wherein the method further comprises fragmenting the released nucleic acid and ligating adapters to the ends of the nucleic acid fragments.

Variations on any one or more of the above implementations exist, wherein the method further comprises seeding the nucleic acid fragments on the upper and lower surfaces of the at least one sequencing channel by: introducing a diffusion barrier into the at least one channel, heating the flow cell to a temperature that cleaves the polymer structures and releases the nucleic acid fragments therefrom, hybridizing the nucleic acid fragments to the oligonucleotides on the upper and lower surfaces of the at least one channel, and washing the cleaved polymer structures out of the flow cell.

Variations on any one or more of the above implementations exist, wherein the method further comprises clonally amplifying the hybridized nucleic acid using bridge amplification to create clusters for nucleic acid.

Variations on any one or more of the above implementations exist, wherein the polymer is a hydrogel and wherein the diffusion barrier includes a hydrophobic liquid or a viscous aqueous solution, wherein the hydrophobic liquid includes mineral oil, silicone oil, or perfluorinated oil, or combinations thereof, and wherein the viscous aqueous solution, includes polyethylene glycol (PEG), polyvinylpyrrolidone, pluronic dextran, sucrose, poly (N-isopropylacrylamide) or polyethylene oxide-polypropylene oxide-polyethylene oxide, PEO-PPO-PEOyiaponite, or combinations thereof.

Variations on any one or more of the above implementations exist, wherein the monomer is the compound of formula I:

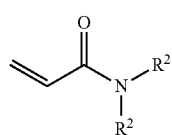

(I)

wherein each $R^2$ is independently hydrogen or $(C_{1-6})$ alkyl.

Variations on any one or more of the above implementations exist, wherein the crosslinker is a compound of formula II:

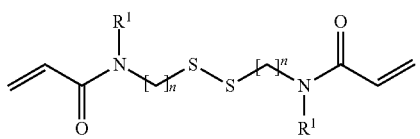

(II)

wherein:
  each n is independently an integer from 1-6; and
  each $R^1$ is independently a hydrogen or $(C_{1-6})$ alkyl.

Variations on any one or more of the above implementations exist, wherein the photoinitiator is a diazosulfonate initiator; a monoacylphosphineoxide (MAPO) salt; a bisacylphosphineoxide (BAPO) salt; or combinations thereof.

Variations on any one or more of the above implementations exist, wherein the monomer is acrylamide, the crosslinker is N,N'-Bis(acryloyl)cystamine (BACy), and the photoinitiator is lithium phenyl-2,4,6-trimethylbenzoylphosphinate (LAP).

Variations on any one or more of the above implementations exist, wherein the polymer precursor solution includes polyethylene glycol (PEG)-thiol, PEG-acrylate, acrylamide, N,N'-Bis(acryloyl)cystamine (BACy), PEG, polypropylene oxide (PPO), polyacrylic acid, poly(hydroxyethyl methacrylate) (PHEMA), poly(methyl methacrylate) (PMMA), poly(N-isopropylacrylamide) (PNIPAAm), poly(lactic acid) (PLA), poly(lactic-co-glycolic acid) (PLGA), polycaprolactone (PCL), poly(vinylsulfonic acid) (PVSA), poly(L-aspartic acid), poly(L-glutamic acid), polylysine, agar, agarose, alginate, heparin, alginate sulfate, dextran sulfate, hyaluronan, pectin, carrageenan, gelatin, chitosan, cellulose, collagen, bisacrylamide, diacrylate, diallylamine, triallylamine, divinyl sulfone, diethyleneglycol diallyl ether, ethyleneglycol diacrylate, polymethyleneglycol diacrylate, polyethyleneglycol diacrylate, trimethylopropoane trimethacrylate, ethoxylated trimethylol triacrylate, or ethoxylated pentaerythritol tetracrylate, or combinations thereof.

Variations on any one or more of the above implementations exist, wherein the polymer precursor solution includes polyethylene glycol (PEG)-thiol/PEG-acrylate; acrylamide/N,N'-bis(acryloyl)cystamine (BACy); PEG/polypropylene oxide (PPO); or combinations thereof.

Variations on any one or more of the above implementations exist, wherein the photomask is polyethylene terephthalate, carbon ink, or a chemically etched metal film.

Variations on any one or more of the above implementations exist, wherein the photomask is laminated to the upper exterior surface of the flow cell.

Variations on any one or more of the above implementations exist, wherein the light source is an ultraviolet light source.

Variations on any one or more of the above implementations exist, wherein the three-dimensional polymer structures are cylindrical.

Variations on any one or more of the above implementations exist, wherein the three-dimensional polymer structures are reverse C-shaped.

Variations on any one or more of the above implementations exist, wherein the biological cells are mammalian.

Variations on any one or more of the above implementations exist, wherein the biological cells are bacterial.

Variations on any one or more of the above implementations exist, wherein the nucleic acid is deoxyribonucleic acid.

Variations on any one or more of the above implementations exist, wherein the nucleic acid is ribonucleic acid.

Another implementation relates to a method for making on-flow cell three-dimensional polymer structures, comprising: loading a hydrogel precursor solution onto a flow cell, wherein the hydrogel precursor solution includes biological cells or colonies of biological cells containing genetic material, a monomer, a crosslinker, and a photoinitiator, and wherein the flow cell includes at least one channel for receiving the polymer precursor solution, wherein the at least one channel has an upper interior surface and a lower interior surface, and wherein primers are bound to both the upper interior surface and lower interior surface of the at least one channel; illuminating the hydrogel precursor solution through a patterned photomask using a light source that emits light at a wavelength that activates the photoinitiator, and wherein activation of the photoinitiator polymerizes at least some of the hydrogel precursor solution underneath apertures in the photomask and forms three-dimensional hydrogel structures that extend from the upper interior surface to the lower interior surface of the at least one channel, and wherein the biological cells or colonies of biological cells are compartmentalized in the three-dimensional hydrogel structures; diffusing a lysis reagent into the three-dimensional hydrogel structures, wherein the lysis reagent lyses the biological cells and releases the genetic material therefrom, and wherein the genetic material includes nucleic acid; fragmenting the released nucleic acid and ligating adapters to the ends of the fragments; and seeding the nucleic acid fragments on the upper interior surface and lower interior surface of the at least one channel by: introducing a diffusion barrier into the at least one channel, wherein the diffusion barrier prevents cross-contamination between hydrogel structures, heating the flow cell to a temperature that cleaves the hydrogel structures and releases the nucleic acid fragments, hybridizing the nucleic acid fragments to the primers on the upper and lower interior surfaces of the at least one channel, and washing the cleaved hydrogel structures out of the flow cell; and clonally amplifying the hybridized nucleic acid fragments to create clusters for sequencing.

Variations on any one or more of the above implementations exist, wherein the monomer is the compound of formula I:

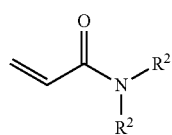

(I)

wherein each $R^2$ is independently hydrogen or $(C_{1-6})$ alkyl.

Variations on any one or more of the above implementations exist, wherein the crosslinker is a compound of formula II:

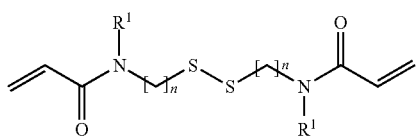

(II)

wherein:
    each n is independently an integer from 1-6; and
    each $R^1$ is independently a hydrogen or $(C_{1-6})$ alkyl.

Variations on any one or more of the above implementations exist, wherein the photoinitiator is a diazosulfonate initiator; a monoacylphosphineoxide (MAPO) salt; a bisacylphosphineoxide (BAPO) salt; or combinations thereof.

Variations on any one or more of the above implementations exist, wherein the monomer is acrylamide, the crosslinker is N,N'-Bis(acryloyl)cystamine (BACy), and the photoinitiator is lithium phenyl-2,4,6-trimethylbenzoylphosphinate (LAP).

Variations on any one or more of the above implementations exist, wherein the hydrogel precursor solution includes polyethylene glycol (PEG)-thiol, PEG-acrylate, acrylamide, N,N'-Bis(acryloyl)cystamine (BACy), PEG, polypropylene oxide (PPO), polyacrylic acid, poly(hydroxyethyl methacrylate) (PHEMA), poly(methyl methacrylate) (PMMA), poly (N-isopropylacrylamide) (PNIPAAm), poly(lactic acid) (PLA), poly(lactic-co-glycolic acid) (PLGA), polycaprolactone (PCL), poly(vinylsulfonic acid) (PVSA), poly(L-aspartic acid), poly(L-glutamic acid), polylysine, agar, agarose, alginate, heparin, alginate sulfate, dextran sulfate, hyaluronan, pectin, carrageenan, gelatin, chitosan, cellulose, collagen, bisacrylamide, diacrylate, diallylamine, triallylamine, divinyl sulfone, diethyleneglycol diallyl ether, ethyleneglycol diacrylate, polymethyleneglycol diacrylate, polyethyleneglycol diacrylate, trimethylopropoane trimethacrylate, ethoxylated trimethylol triacrylate, or ethoxylated pentaerythritol tetracrylate, or combinations thereof.

Variations on any one or more of the above implementations exist, wherein the hydrogel precursor solution includes polyethylene glycol (PEG)-thiol/PEG-acrylate; acrylamide/N,N'-bis(acryloyl)cystamine (BACy); PEG/polypropylene oxide (PPO); or combinations thereof.

Variations on any one or more of the above implementations exist, wherein the diffusion barrier includes a hydrophobic liquid or a viscous aqueous solution, wherein the hydrophobic liquid includes mineral oil, silicone oil, or perfluorinated oil, or combinations thereof, and wherein the viscous aqueous solution, includes polyethylene glycol (PEG), polyvinyl-pyrrolidone, pluronic dextran, sucrose, poly (N-isopropylacrylamide) or polyethylene oxide-polypropylene oxide-polyethylene oxide, PEO-PPO-PEOyiaponite, or combinations thereof.

Variations on any one or more of the above implementations exist, wherein the photomask is polyethylene terephthalate, carbon ink, or a chemically etched metal film, and wherein the photomask is laminated to the upper exterior surface of the flow cell.

Variations on any one or more of the above implementations exist, wherein the light source is an ultraviolet light source.

Variations on any one or more of the above implementations exist, wherein the hydrogel structures are cylindrical.

Variations on any one or more of the above implementations exist, wherein the hydrogel structures are reverse C-shaped.

Variations on any one or more of the above implementations exist, wherein the biological cells are mammalian.

Variations on any one or more of the above implementations exist, wherein the biological cells are bacterial.

Variations on any one or more of the above implementations exist, wherein the nucleic acid is deoxyribonucleic acid.

Variations on any one or more of the above implementations exist, wherein the nucleic acid is ribonucleic acid.

Another implementation relates to a flow cell, comprising: a channel, wherein the channel includes an upper interior surface having primers coated thereon and a lower interior surface having primers coated thereon; and reversible, permeable, three-dimensional polymer structures in the channel from a polymer precursor solution, wherein the three-dimensional polymer structures extend from the upper interior surface of the channel to the lower interior surface of the channel.

Variations on any one or more of the above implementations exist, wherein the flow cell further comprises a photomask placed over an outer exterior surface of the channel.

Variations on any one or more of the above implementations exist, wherein the three-dimensional polymer structures are cylindrical, reverse C-shaped, tubular, or combinations thereof.

Variations on any one or more of the above implementations exist, wherein the three-dimensional polymer structures include hydrogels.

Variations on any one or more of the above implementations exist, wherein the flow cell, polymer precursor solutions, and photomask are provided in a kit.

Another implementation relates to a method for making an on-flow cell three-dimensional sequencing matrix, comprising: embedding oligonucleotides within a permeable three-dimensional matrix, wherein the oligonucleotides facilitate nucleic acid fragment clonal amplification within the matrix; introducing the oligonucleotide-containing permeable three-dimensional matrix into a flow cell, wherein the flow cell includes at least one channel for receiving the oligonucleotide-containing permeable three-dimensional matrix; and immobilizing the oligonucleotide-containing permeable three-dimensional matrix in the at least one channel.

Variations on any one or more of the above implementations exist, wherein the permeable three-dimensional matrix includes a polymer.

Variations on any one or more of the above implementations exist, wherein the permeable three-dimensional matrix is a hydrogel.

Variations on any one or more of the above implementations exist, wherein the permeable three-dimensional matrix includes hydrogel networks of a predetermined size.

Variations on any one or more of the above implementations exist, wherein the permeable three-dimensional matrix includes a matrix of particles of the same size or particles of different sizes.

Variations on any one or more of the above implementations exist, wherein the permeable three-dimensional matrix includes columnar posts.

Variations on any one or more of the above implementations exist, wherein the permeable three-dimensional matrix includes mesoporous crystalline materials.

Variations on any one or more of the above implementations exist, wherein the method further comprises patterning, by photolithography, the permeable three-dimensional matrix in the flow cell.

Variations on any one or more of the above implementations exist, wherein the oligonucleotides are adapted for sequencing-by-synthesis.

Variations on any one or more of the above implementations exist, wherein the flow cell has an internal volume, and wherein the oligonucleotide-containing permeable three-dimensional matrix occupies the entire internal volume of the flow cell.

Variations on any one or more of the above implementations exist, wherein the method further comprises imaging the permeable three-dimensional matrix in discrete two-dimensional layers.

Another implementation relates to a method for sequencing in three-dimensions using an on flow-cell three-dimensional sequencing matrix, comprising: loading a polymer precursor solution into a flow cell, wherein the polymer precursor solution includes monomers and oligonucleotides; polymerizing the polymer precursor solution to create a permeable three-dimensional matrix within the flow cell; diffusing a sequencing library into the permeable three-dimensional polymer matrix, wherein the sequencing library includes nucleic acid fragments; diffusing enzymes and reagents into the permeable three-dimensional polymer matrix; hybridizing the nucleic acid fragments to the oligonucleotides in the permeable three-dimensional polymer matrix; clonally amplifying the hybridized nucleic acid fragments to create clusters for sequencing within the permeable three-dimensional polymer matrix; sequencing the clusters within the permeable three-dimensional polymer matrix; and optically imaging the sequenced clusters within three-dimensional matrix in multiple, discrete two-dimensional slices to characterize the sequencing library, wherein the multiple, discrete two-dimensional slices represent the entire three-dimensional internal volume of the flow cell.

Variations on any one or more of the above implementations exist, wherein the monomer is the compound of formula I:

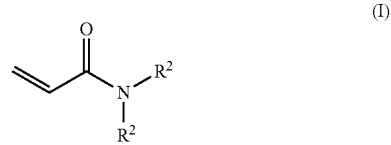

wherein each $R^2$ is independently hydrogen or $(C_{1-6})$ alkyl.

Variations on any one or more of the above implementations exist, wherein the monomers include polyethylene glycol (PEG)-thiol, PEG-acrylate, acrylamide, N,N'-Bis (acryloyl)cystamine (BACy), PEG, polypropylene oxide (PPO), polyacrylic acid, poly(hydroxyethyl methacrylate) (PHEMA), poly(methyl methacrylate) (PMMA), poly(N-isopropylacrylamide) (PNIPAAm), poly(lactic acid) (PLA), poly(lactic-co-glycolic acid) (PLGA), polycaprolactone (PCL), poly(vinylsulfonic acid) (PVSA), poly(L-aspartic acid), poly(L-glutamic acid), polylysine, agar, agarose, alginate, heparin, alginate sulfate, dextran sulfate, hyaluronan, pectin, carrageenan, gelatin, chitosan, cellulose, collagen, bisacrylamide, diacrylate, diallylamine, triallylamine, divinyl sulfone, diethyleneglycol diallyl ether, ethyleneglycol diacrylate, polymethylene glycol diacrylate, polyethyleneglycol diacrylate, trimethylopropoane trimethacrylate, ethoxylated trimethylol triacrylate, or ethoxylated pentaerythritol tetracrylate, or combinations thereof.

Variations on any one or more of the above implementations exist, wherein the monomers include polyethylene glycol (PEG)-thiol/PEG-acrylate; acrylamide/N,N'-Bis (acryloyl)cystamine (BACy); PEG/polypropylene oxide (PPO); or combinations thereof.

Variations on any one or more of the above implementations exist, wherein the polymer precursor solution further includes poly(N-(5-azidoacetamidylpentyl) acrylamide-co-acrylamide) (PAZAM) containing azide moieties.

Variations on any one or more of the above implementations exist, wherein the oligonucleotides are alkyne-linked oligonucleotides adapted to bind to the azide moieties in the PAZAM.

Variations on any one or more of the above implementations exist, wherein the oligonucleotides are adapted for sequencing-by-synthesis.

Variations on any one or more of the above implementations exist, wherein the permeable three-dimensional matrix includes a hydrogel.

Variations on any one or more of the above implementations exist, wherein the permeable three-dimensional matrix includes hydrogel networks of predetermined sizes Variations on any one or more of the above implementations exist, wherein the permeable three-dimensional matrix includes a matrix of particles of the same size or particles of different sizes.

Variations on any one or more of the above implementations exist, wherein the permeable three-dimensional matrix includes columnar posts.

Variations on any one or more of the above implementations exist, wherein the columnar posts are fabricated to include alternating materials in a Z-direction.

Variations on any one or more of the above implementations exist, wherein the optical imaging includes the use of a confocal microscope, multiphoton, or a light-sheet illumination microscope.

Another implementation relates to a method for sequencing in three-dimensions using an on flow-cell three-dimensional sequencing matrix, comprising: loading a polymer precursor solution into a flow cell, wherein the polymer precursor solution includes monomer, crosslinker, photoinitiator, and oligonucleotides; polymerizing the polymer precursor solution using ultraviolet light to create a permeable three-dimensional matrix within the flow cell; diffusing a sequencing library into the permeable three-dimensional polymer matrix, wherein the sequencing library includes nucleic acid fragments to which adapters have been added; diffusing enzymes and reagents into the permeable three-dimensional polymer matrix; hybridizing the nucleic acid fragments to the oligonucleotides in the permeable three-dimensional polymer matrix; clonally amplifying the hybridized nucleic acid fragments to create clusters for sequencing within the permeable three-dimensional polymer matrix; sequencing the clusters within the permeable three-dimensional polymer matrix; and using a confocal microscope, multiphoton, or a light-sheet illumination microscope to image the sequenced clusters within three-dimensional matrix in multiple, discrete two-dimensional slices to characterize the sequencing library, wherein the multiple, discrete two-dimensional slices represent the entire three-dimensional internal volume of the flow cell.

Variations on any one or more of the above implementations exist, wherein the monomer is the compound of formula I:

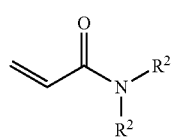

(I)

wherein each $R^2$ is independently hydrogen or $(C_{1-6})$ alkyl.

Variations on any one or more of the above implementations exist, wherein the crosslinker is a compound of formula II:

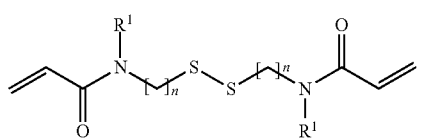

(II)

wherein:
each n is independently an integer from 1-6; and
each $R^1$ is independently hydrogen or $(C_{1-6})$ alkyl.

Variations on any one or more of the above implementations exist, wherein the photoinitiator is a diazosulfonate initiator; a monoacylphosphineoxide (MAPO) salt; a bisacylphosphineoxide (BAPO) salt; or combinations thereof.

Variations on any one or more of the above implementations exist, wherein the monomer includes polyethylene glycol (PEG)-thiol, PEG-acrylate, acrylamide, N,N'-Bis (acryloyl)cystamine (BACy), PEG, polypropylene oxide (PPO), polyacrylic acid, poly(hydroxyethyl methacrylate) (PHEMA), poly(methyl methacrylate) (PMMA), poly(N-isopropylacrylamide) (PNIPAAm), poly(lactic acid) (PLA), poly(lactic-co-glycolic acid) (PLGA), polycaprolactone (PCL), poly(vinylsulfonic acid) (PVSA), poly(L-aspartic acid), poly(L-glutamic acid), polylysine, agar, agarose, alginate, heparin, alginate sulfate, dextran sulfate, hyaluronan, pectin, carrageenan, gelatin, chitosan, cellulose, collagen, bisacrylamide, diacrylate, diallylamine, triallylamine, divinyl sulfone, diethyleneglycol diallyl ether, ethylene glycol diacrylate, polymethyleneglycol diacrylate, polyethyleneglycol diacrylate, trimethylopropoane trimethacrylate, ethoxylated trimethylol triacrylate, or ethoxylated pentaerythritol tetracrylate, or combinations thereof.

Variations on any one or more of the above implementations exist, wherein the monomer includes polyethylene glycol (PEG)-thiol/PEG-acrylate; acrylamide/N,N'-Bis (acryloyl)cystamine (BACy); PEG/polypropylene oxide (PPO); or combinations thereof.

Variations on any one or more of the above implementations exist, wherein the photoinitiator is lithium phenyl-2, 4,6-trimethylbenzoylphosphinate (LAP), a diazosulfonate initiator; a monoacylphosphineoxide (MAPO) salt, or a bisacylphosphineoxide (BAPO) salt.

Variations on any one or more of the above implementations exist, wherein the polymer precursor solution further includes poly(N-(5-azidoacetamidylpentyl) acrylamide-co-acrylamide) (PAZAM) to which azide moieties have been bound.

Variations on any one or more of the above implementations exist, wherein the oligonucleotides are alkyne-linked oligonucleotides adapted to bind to the azide moieties in the PAZAM.

Variations on any one or more of the above implementations exist, wherein the oligonucleotides are adapted for sequencing-by-synthesis.

Variations on any one or more of the above implementations exist, wherein the permeable three-dimensional matrix includes a hydrogel.

Variations on any one or more of the above implementations exist, wherein the permeable three-dimensional matrix includes hydrogel networks of a predetermined size.

Variations on any one or more of the above implementations exist, wherein the permeable three-dimensional matrix includes a matrix of particles of the same size or particles of different sizes.

Variations on any one or more of the above implementations exist, wherein the permeable three-dimensional matrix includes columnar posts, and wherein the columnar posts are fabricated to include alternating materials in Z-direction.

Variations on any one or more of the above implementations exist, wherein the nucleic acid fragments to which adapters have been added are circularized after the adapters are added to create nanoballs.

Another implementation relates to a kit, comprising: a flow cell, wherein the flow cell includes at least one channel; and an oligonucleotide-containing permeable three-dimensional matrix, wherein the oligonucleotide-containing permeable three-dimensional matrix is adapted to be introduced into the at least one channel and subsequently immobilized therein.

Another implementation relates to a method for making on-flow cell three-dimensional polymer structures having functionalized surfaces, comprising: loading a polymer precursor solution into a flow cell, wherein the polymer precursor solution includes a monomer, a crosslinker, a photoinitiator, and a functionalized polymer, and wherein the flow cell includes at least one channel for receiving the polymer precursor solution, and wherein the at least one channel has an upper interior surface and a lower interior surface; and illuminating the polymer precursor solution through a photomask with light at a wavelength that activates the photoinitiator, wherein the photomask includes a series of apertures formed therein, wherein the photomask has been placed over an exterior surface of the channel, and wherein activation of the photoinitiator polymerizes at least some of the polymer precursor solution underneath the apertures in the photomask and forms three-dimensional polymer structures extending from the upper interior surface to the lower interior surface of the at least one channel.

Variations on any one or more of the above implementations exist, wherein the method further comprises reacting a bi-functional linker, having a first end and a second end, with the functionalized polymer, wherein the first end of the bi-functional linker is chemically or enzymatically attached to the functionalized polymer, and wherein the second end of the bi-functional linker selectively binds predetermined types of molecules.

Variations on any one or more of the above implementations exist, wherein the functionalized polymer is poly(N-(5-azidoacetamidylpentyl) acrylamide-co-acrylamide (PAZAM) containing azide moieties and wherein the bi-functional linker is a biotin-PEG-alkyne complex, and the method further comprising reacting the biotin-PEG-alkyne complex with the azide moieties in the PAZAM using an azide-alkyne click reaction a click reaction.

Variations on any one or more of the above implementations exist, wherein the method further comprises binding streptavidin to the biotin in the biotin-PEG-alkyne complex.

Variations on any one or more of the above implementations exist, wherein the method further comprises binding biotinylated capture oligonucleotides to the streptavidin, wherein the biotinylated capture oligonucleotides are specific for targets of interest in a sequencing library.

Variations on any one or more of the above implementations exist, wherein the method further comprises washing unpolymerized polymer precursor solution out of the flow cell.

Variations on any one or more of the above implementations exist, wherein the method further comprises cleaving at least some the three-dimensional polymer structures from the flow cell using heat, cleaving chemicals, or a combination of heat and cleaving chemicals.

Variations on any one or more of the above implementations exist, wherein the flow cell has oligonucleotides of predetermined lengths and sequences bound to both the upper and lower interior surfaces of the at least one channel, and wherein the oligonucleotides include primers adapted for nucleic acid amplification.

Variations on any one or more of the above implementations exist, wherein polymer is a hydrogel.

Variations on any one or more of the above implementations exist, wherein the monomer is the compound of formula I:

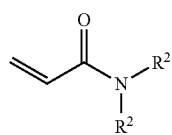

(I)

wherein each $R^2$ is independently hydrogen or $(C_{1-6})$ alkyl.

Variations on any one or more of the above implementations exist, wherein the crosslinker is a compound of formula II:

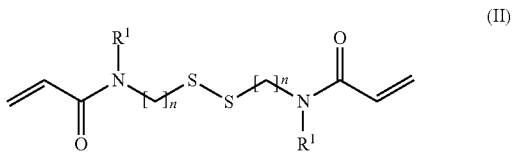

(II)

wherein:
each n is independently an integer from 1-6; and
each $R^1$ is independently a hydrogen or $(C_{1-6})$ alkyl.

Variations on any one or more of the above implementations exist, wherein the photoinitiator is a diazosulfonate initiator; a monoacylphosphineoxide (MAPO) salt; a bisacylphosphineoxide (BAPO) salt; or combinations thereof.

Variations on any one or more of the above implementations exist, wherein the monomer is acrylamide, the crosslinker is N,N'-Bis(acryloyecystamine (BACy), and the photoinitiator is lithium phenyl-2,4,6-trimethylbenzoylphosphinate (LAP).

Variations on any one or more of the above implementations exist, wherein the polymer precursor solution includes polyethylene glycol (PEG)-thiol, PEG-acrylate, acrylamide, N,N'-Bis(acryloyl)cystamine (BACy), PEG, polypropylene oxide (PPO), polyacrylic acid, poly(hydroxyethyl methacrylate) (PHEMA), poly(methyl methacrylate) (PMMA), poly(N-isopropylacrylamide) (PNIPAAm), poly(lactic acid) (PLA), poly(lactic-co-glycolic acid) (PLGA), polycaprolactone (PCL), poly(vinylsulfonic acid) (PVSA), poly(L-aspartic acid), poly(L-glutamic acid), polylysine, agar, agarose, alginate, heparin, alginate sulfate, dextran sulfate, hyaluronan, pectin, carrageenan, gelatin, chitosan, cellulose, collagen, bisacrylamide, diacrylate, diallylamine, triallylamine, divinyl sulfone, diethyleneglycol diallyl ether, ethyleneglycol diacrylate, polymethyleneglycol diacrylate, polyethyleneglycol diacrylate, trimethylopropoane trimethacrylate, ethoxylated trimethylol triacrylate, or ethoxylated pentaerythritol tetracrylate, or combinations or mixtures thereof.

Variations on any one or more of the above implementations exist, wherein the polymer precursor solution includes polyethylene glycol (PEG)-thiol/PEG-acrylate; acrylamide/N,N'-Bis(acryloyl)cystamine (BACy); PEG/polypropylene oxide (PPO); or combinations thereof.

Variations on any one or more of the above implementations exist, wherein the photomask is polyethylene terephthalate.

Variations on any one or more of the above implementations exist, wherein the photomask is laminated to the upper surface of the flow cell.

Variations on any one or more of the above implementations exist, wherein illuminating the polymer precursor solution comprises using an ultraviolet light source.

Variations on any one or more of the above implementations exist, wherein the three-dimensional polymer structures are cylindrical.

Another implementation relates to a method for making on-flow cell three-dimensional polymer structures having functionalized surfaces, comprising: loading a hydrogel precursor solution into a flow cell, wherein the hydrogel precursor solution includes a monomer, a crosslinker, a photoinitiator, and PAZAM containing azide moieties, and wherein the flow cell includes at least one channel for receiving the hydrogel precursor solution, and wherein the at least one channel has an upper interior surface and a lower interior surface; placing a photomask over the at least one channel, wherein the photomask includes a series of apertures formed therein; and illuminating the hydrogel precursor solution through the photomask with light at a wavelength that activates the photoinitiator, and wherein activation of the photoinitiator polymerizes at least some of the hydrogel precursor solution underneath the apertures in the photomask and forms three-dimensional hydrogel structures extending from the upper interior surface to the lower interior surface of the at least one channel; reacting a biotin-PEG-alkyne complex with the azide moieties in the PAZAM in the three-dimensional polymer structures using an azide-alkyne click reaction; binding streptavidin to the biotin in the biotin-PEG-alkyne complex; and binding biotinylated capture oligonucleotides to the streptavidin, wherein the biotinylated capture oligonucleotides are specific for target molecules of interest in a sequencing library.

Variations on any one or more of the above implementations exist, wherein the monomer is the compound of formula I:

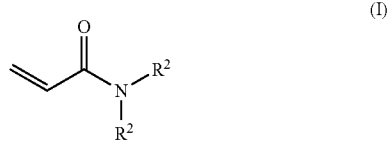

wherein each $R^2$ is independently hydrogen or $(C_{1-6})$ alkyl.

Variations on any one or more of the above implementations exist, wherein the crosslinker is a compound of formula II:

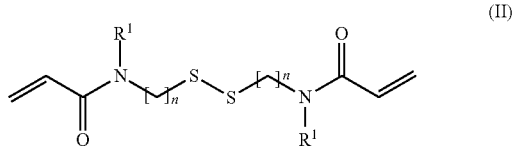

wherein:
each n is independently an integer from 1-6; and
each $R^1$ is independently hydrogen or $(C_{1-6})$ alkyl.

Variations on any one or more of the above implementations exist, wherein the photoinitiator is a diazosulfonate initiator; a monoacylphosphineoxide (MAPO) salt; a bisacylphosphineoxide (BAPO) salt; or combinations or mixtures thereof.

Variations on any one or more of the above implementations exist, wherein the monomer is acrylamide, the crosslinker is N,N'-Bis(acryloyecystamine (BACy), and the photoinitiator is lithium phenyl-2,4,6-trimethylbenzoylphosphinate (LAP).

Variations on any one or more of the above implementations exist, wherein the polymer precursor solution includes polyethylene glycol (PEG)-thiol, PEG-acrylate, acrylamide, N,N'-Bis(acryloyl)cystamine (BACy), PEG, polypropylene oxide (PPO), polyacrylic acid, poly(hydroxyethyl methacrylate) (PHEMA), poly(methyl methacrylate) (PMMA), poly(N-isopropylacrylamide) (PNIPAAm), poly(lactic acid) (PLA), poly(lactic-co-glycolic acid) (PLGA), polycaprolactone (PCL), poly(vinylsulfonic acid) (PVSA), poly(L-aspartic acid), poly(L-glutamic acid), polylysine, agar, agarose, alginate, heparin, alginate sulfate, dextran sulfate, hyaluronan, pectin, carrageenan, gelatin, chitosan, cellulose, collagen, bisacrylamide, diacrylate, diallylamine, triallylamine, divinyl sulfone, diethyleneglycol diallyl ether, ethyleneglycol diacrylate, polymethyleneglycol diacrylate, polyethyleneglycol diacrylate, trimethylopropoane trimethacrylate, ethoxylated trimethylol triacrylate, or ethoxylated pentaerythritol tetracrylate, or combinations or mixtures thereof.

Variations on any one or more of the above implementations exist, wherein the polymer precursor solution includes polyethylene glycol (PEG)-thiol/PEG-acrylate; acrylamide/N,N'-Bis(acryloyl)cystamine (BACy); PEG/polypropylene oxide (PPO); or combinations thereof.

Variations on any one or more of the above implementations exist, wherein the photomask comprises a polyester film.

Variations on any one or more of the above implementations exist, wherein the photomask is laminated to the upper surface of the flow cell.

Variations on any one or more of the above implementations exist, wherein the light source is an ultraviolet light source.

Variations on any one or more of the above implementations exist, wherein the three-dimensional polymer structures are cylindrical.

Another implementation relates to a method for making on-flow cell three-dimensional polymer structures having functionalized surfaces, comprising: loading a polymer precursor solution into a flow cell, wherein the polymer precursor solution includes a monomer, a crosslinker, a photoinitiator, and a streptavidin-labeled acrylamide monomer, and wherein the flow cell includes at least one channel for receiving the polymer precursor solution, and wherein the at least one channel has an upper interior surface and a lower interior surface, and wherein oligonucleotides of predetermined lengths are bound to both the upper and lower surfaces of the at least one channel; placing a photomask over the at least one channel, wherein the photomask includes a series of apertures formed therein; illuminating the polymer precursor solution through the photomask with light at a wavelength that activates the photoinitiator, and wherein activation of the photoinitiator polymerizes at least some of the polymer precursor solution underneath the apertures in the photomask and forms three-dimensional polymer structures extending from the upper interior surface to the lower interior surface of the at least one channel; selectively binding biotinylated capture oligonucleotides to the streptavidin in the three-dimensional polymer structures, wherein the biotinylated capture oligonucleotides are specific for target molecules of interest in a library and bind thereto; and eluting the bound target molecules and seeding the eluted target molecules on the surfaces of the flow cell having oligonucleotides bound thereto.

Variations on any one or more of the above implementations exist, wherein the monomer is the compound of formula I:

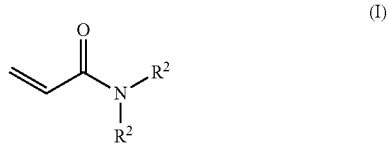

wherein each $R^2$ is independently hydrogen or $(C_{1-6})$ alkyl.

Variations on any one or more of the above implementations exist, wherein the crosslinker is a compound of formula II:

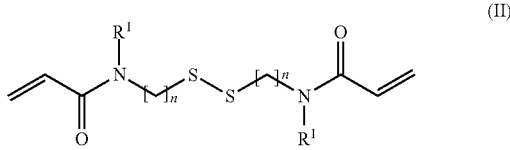

wherein:
each n is independently an integer from 1-6; and
each $R^1$ is independently hydrogen or $(C_{1-6})$ alkyl.

Variations on any one or more of the above implementations exist, wherein the photoinitiator is a diazosulfonate initiator; a monoacylphosphineoxide (MAPO) salt; a bisacylphosphineoxide (BAPO) salt; or combinations or mixtures thereof.

Variations on any one or more of the above implementations exist, wherein the monomer is acrylamide, the crosslinker is N,N'-Bis(acryloyl)cystamine (BACy), and the photoinitiator is lithium phenyl-2,4,6-trimethylbenzoylphosphinate (LAP).

Variations on any one or more of the above implementations exist, wherein the polymer precursor solution includes polyethylene glycol (PEG)-thiol, PEG-acrylate, acrylamide, N,N'-Bis(acryloyl)cystamine (BACy), PEG, polypropylene oxide (PPO), polyacrylic acid, poly(hydroxyethyl methacrylate) (PHEMA), poly(methyl methacrylate) (PMMA), poly (N-isopropylacrylamide) (PNIPAAm), poly(lactic acid) (PLA), poly(lactic-co-glycolic acid) (PLGA), polycaprolactone (PCL), poly(vinylsulfonic acid) (PVSA), poly(L-aspartic acid), poly(L-glutamic acid), polylysine, agar, agarose, alginate, heparin, alginate sulfate, dextran sulfate, hyaluronan, pectin, carrageenan, gelatin, chitosan, cellulose, collagen, bisacrylamide, diacrylate, diallylamine, triallylamine, divinyl sulfone, diethyleneglycol diallyl ether, ethyleneglycol diacrylate, polymethyleneglycol diacrylate, polyethyleneglycol diacrylate, trimethylopropoane trimethacrylate, ethoxylated trimethylol triacrylate, or ethoxylated pentaerythritol tetracrylate, or combinations or mixtures thereof.

Variations on any one or more of the above implementations exist, wherein the polymer precursor solution includes polyethylene glycol (PEG)-thiol/PEG-acrylate; acrylamide/N,N'-Bis(acryloyl)cystamine (BACy); PEG/polypropylene oxide (PPO); or combinations thereof.

Variations on any one or more of the above implementations exist, wherein the photomask is polyethylene terephthalate.

Variations on any one or more of the above implementations exist, wherein the photomask is laminated to the upper surface of the flow cell.

Variations on any one or more of the above implementations exist, wherein the light source is an ultraviolet light source.

Variations on any one or more of the above implementations exist, wherein the three-dimensional polymer structures are cylindrical.

Another implementation relates to a flow cell, comprising: a channel, wherein the channel includes an upper interior surface having primers coated thereon and a lower interior surface having primers coated thereon; and reversible, permeable, three-dimensional polymer structures in the channel from a polymer precursor solution, wherein the three-dimensional polymer structures extend from the upper interior surface of the channel to the lower interior surface of the channel.

Variations on any one or more of the above implementations exist, wherein the flow cell further comprises a photomask placed over an outer exterior surface of the channel.

Variations on any one or more of the above implementations exist, wherein the three-dimensional polymer structures include hydrogels.

Variations on any one or more of the above implementations exist, wherein the flow cell, polymer precursor solutions, and photomask are provided in a kit.

It should be appreciated that all combinations of the foregoing concepts and additional concepts discussed in greater detail below (provided such concepts are not mutually inconsistent) are contemplated as being part of the inventive subject matter disclosed herein and may be implemented to achieve the benefits as described herein. Additional features and aspects of the disclosed system, devices, and methods will become apparent to those of ordinary skill in the art upon reading and understanding the following detailed description of the example embodiments. As will be appreciated by the skilled artisan, further implementations are possible without departing from the scope and spirit of what is disclosed herein. Accordingly, the drawings and associated descriptions are to be regarded as illustrative and not restrictive in nature.

BRIEF DESCRIPTION OF THE DRAWINGS

The details of one or more implementations are set forth in the accompanying drawings and the description below. Other features, aspects, and advantages will become apparent from the description, the drawings, and the claims, in which:

FIGS. 11A-11B depict hydrogel beads doped with poly (N-(5-azidoacetamidylpentyl) acrylamide-co-acrylamide) (PAZAM) containing P5/P7 primers, wherein the beads are initially soaked with a sequencing library and then soaked in ExAmp to generate clusters throughout the three-dimensional volume of each bead;

FIGS. 12A-12B depict index-free sequencing, wherein each hydrogel bead contains clusters from a sample in which it was incubated, wherein hydrogel beads containing such clusters are loaded on a flow cell and sequenced, and wherein the beads from each sample type can be distinguished from one another other using a variety of means such as, for example, fluorophores embedded in beads that are removed before sequencing;

FIG. 13A depicts a sequencing flow cell, wherein sequencing is occurring in a two-dimensional network of clusters on a top surface and on a bottom surface, and wherein the top surface and the bottom surface are separated by a known distance (e.g., 100 µm) along the Z-axis;

FIG. 13B depicts a sequencing flow cell, wherein sequencing is occurring in a three-dimensional network of clusters on a top surface and a bottom surface and in discrete regions that are located between the top surface and the bottom surface, and wherein the top surface and the bottom surface are separated by a distance of 100 µm along the Z-axis;

FIG. 14 depicts an example SPIM setup, wherein excitation is delivered by way of a low-NA objective into a sample, and wherein fluorescence emission is collected by a high-NA emission objective;

FIG. 23A depicts hydrogel beads in which long DNA fragments have been encapsulated trapped within a flow cell;

FIG. 23B depicts enzymatic processes for library preparation occurring within the trapped hydrogel beads of FIG. 23A;

FIG. 23C depicts an amplified library generating clusters of linked reads distributed in three-dimensions within each hydrogel bead;

FIG. 24A depicts template capture and extension occurring on hydrogel beads bearing oligonucleotides;

FIG. 24B depicts clonal amplification of library inserts on the hydrogel beads for creating clusters;

FIG. 25A depicts clustered beads delivered into a flow cell in a hydrogel precursor solution;

FIG. 25B depicts immobilization of the clustered beads within a crosslinked hydrogel matrix to preserve the spatial locations of the beads in three dimensions during sequencing and subsequent imaging;

FIGS. 28A and 28B depict spatial control of clusters in three dimensions using a three-dimensional matrix of columnar posts having alternating material composition in the Z-direction;

FIGS. 29A-29D depict a simplified example method for creating a polymer scaffold, wherein an unpolymerized monomer solution is embedded with salt particles having a predetermined size distribution; wherein the salt particles displace the monomer, thereby creating a three-dimensional network within the solution; wherein the monomer solution is polymerized to form a three-dimensional polymer scaffold around the salt particles; and wherein the salt particles are dissolved, resulting in a random, three-dimensional array of pores, which define the scaffold.

FIG. 35A depicts an example method for on-flow cell fabrication of functionalized hydrogel structures, wherein a hydrogel precursor solution containing 10% polyacrylamide (PA), crosslinker, and 0.25% PAZAM into which azide moieties have been incorporated is loaded onto a flow cell;

FIG. 35B depicts an example method for on-flow cell fabrication of functionalized hydrogel structures, wherein a photomask, which includes a plurality of apertures formed therein, is placed on top of the flow cell of FIG. 35A and then exposed to UV light for 10 seconds to co-polymerize the acrylamide and PAZAM and form an array of azide-functionalized hydrogel micropillars in the narrow channel of the flow cell;

FIG. 35C depicts an example method for on-flow cell fabrication of functionalized hydrogel structures, wherein a biotin-PEG-alkyne complex is clicked onto the azide moieties of the hydrogel micropillars of FIG. 35B;

FIG. 35D depicts an example method for on-flow cell fabrication of functionalized hydrogel structures, wherein streptavidin labeled with Fluorescein binds the biotin in hydrogel micropillars of FIG. 35C;

FIG. 35E depicts an example method for on-flow cell fabrication of functionalized hydrogel structures, wherein streptavidin binds biotinylated capture oligonucleotides to enable immobilization of target sequencing library molecules;

FIG. 37A depicts another example method for on-flow cell fabrication of functionalized hydrogel structures, wherein a hydrogel precursor solution containing 10% polyacrylamide (PA) and 0.25% streptavidin-labeled acrylamide monomer is loaded onto a flow cell;

FIG. 37B depicts another example method for on-flow cell fabrication of functionalized hydrogel structures, wherein a photomask, which includes a plurality of apertures formed therein, is placed on top of the flow cell of FIG. 37A and then exposed to UV light for 10 seconds to co-polymerize the acrylamide streptavidin-labeled acrylamide monomers and form an array of streptavidin functionalized hydrogel micropillars in the narrow channel of the flow cell;

FIG. 37C depicts another example method for on-flow cell fabrication of functionalized hydrogel structures, wherein biotinylated capture oligonucleotides are bound to the streptavidin moieties in the hydrogel micropillars of FIG. 37B, and wherein target library molecules hybridize to the biotinylated capture oligonucleotides and become immobilized on the hydrogel micropillars of FIG. 37B;

FIG. 37D depicts another example method for on-flow cell fabrication of functionalized hydrogel structures, wherein immobilized target molecules are eluted from the capture oligonucleotides of FIG. 37C and seeded on the wide channel of the flow cell;

FIG. 38A depicts biotinylated P5 and P7 primers binding to a streptavidin functionalized hydrogel micropillar;

FIG. 38B depicts the biotinylated P5 and P7 primers of FIG. 38A being incubated with TET-labeled complementary P5' and P7' oligonucleotides;

FIG. 38C depicts the TET-labeled complementary P5' and P7' oligonucleotides of FIG. 38B hybridized to the biotinylated P5 and P7 primers;

FIG. 41A depicts hybridizing P7' and P5' regions of sequencing library molecules to biotinylated P5 and P7 oligonucleotides;

FIG. 41B depicts capturing sequencing library molecules with streptavidin-functionalized hydrogel pillars, which are attached to the surface of a flow cell;

FIG. 41C depicts seeding bound sequencing library molecules by incubation at 85° C. to denature hybridized biotinylated primers and then ramping the temperature to 20° C. to allow hybridization of sequencing library molecules to surface primers;

FIG. 42A is a bright field micrograph of an untreated flow cell (control);

FIG. 42B is a fluorescence micrograph (488 nm) of a SYTOX-stained untreated flow cell (control) showing no clusters;

FIG. 42C is a bright field micrograph of a flow cell having streptavidin micropillars;

FIG. 42D is a fluorescence micrograph (488 nm) of a SYTOX-stained flow cell having streptavidin micropillars;

FIG. 42E is bright field micrograph of the hydrogel micropillar of FIG. 42C;

FIG. 42F is a fluorescence micrograph (488 nm) of the SYTOX-stained micropillar of FIG. 42D;

FIG. 44 is a flowchart depicting a first method for making functionalized three-dimensional polymer structures on a flow cell;

DETAILED DESCRIPTION

I. Overview

Figure 1A:
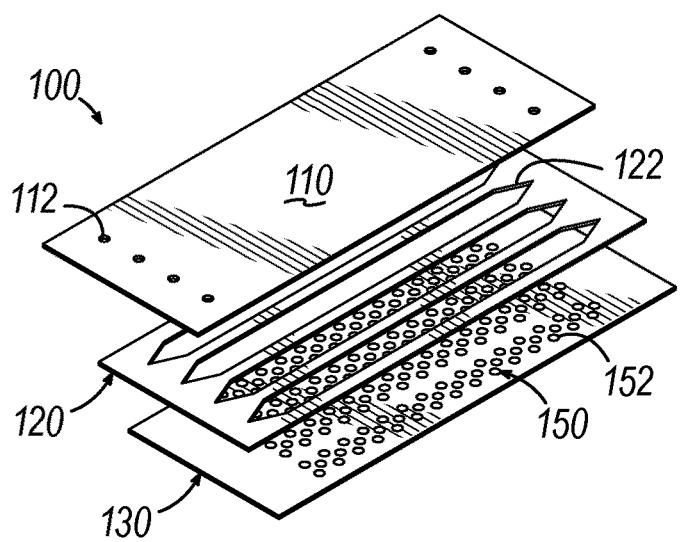
FIG. 1A is a perspective view of a flow cell in accordance with one implementation of the disclosed systems and methods.

Implementations of the disclosed systems and methods may be useful for creating reversible hydrogel polymer structures on flow cells used, which may be used as part of the workflow for sequencing-by-synthesis and other sequencing methodologies. The workflow may include library preparation and sequencing. These hydrogel structures may be particularly useful for addressing challenges associated with high throughput single-cell or single-colony sequencing on flow cells due to low starting nucleic acid input from single cells and an inability to compartmentalize sequencing libraries on flow cells. The disclosed systems and methods enable high-throughput single-cell or single-colony sequencing by providing on-flow cell entrapment or encapsulation of cells and genetic material in reversible hydrogel structures. These hydrogel structures entrap or compartmentalize individual cells or individual colonies while allowing efficient reagent exchange for cell lysis and ultimately in situ preparation of sequencing libraries.

Various implementations of the disclosed systems, devices, and methods may be useful for creating reversible, permeable three-dimensional polymer (e.g., hydrogel) structures within the fluidics channels on sequencing flow cells. These temporary polymer structures expand available sequencing surfaces from two-dimensions to three-dimensions, thereby providing a massive increase to the throughput of a sequencing flow cell.

Various implementations of the disclosed systems, devices, and methods may be useful for creating reversible three-dimensional polymer (e.g., hydrogel) structures within the fluidics channels on flow cells. These structures may be used for introducing temporary functional surfaces within the flow cell, in addition to pre-existing sequencing surfaces, for multiple applications including, for example, (i) target DNA enrichment; (ii) clustered regularly interspaced short palindromic repeats (CRISPR) screening; and (iii) highly multiplexed screening applications using DNA conjugated antigens.

As used herein, the term "hydrogel" refers to a substance formed when an organic polymer (natural or synthetic) is cross-linked by way of covalent, ionic, or hydrogen bonds to create a three-dimensional open-lattice structure that entraps water molecules to form a gel. In some versions, the hydrogel may be a biocompatible hydrogel, which refers to a polymer that forms a gel that is not toxic to living cells and allows sufficient diffusion of oxygen and nutrients to entrapped cells to maintain viability. In some versions, the hydrogel polymer includes about 60-90% fluid, such as water, and about 10-30% polymer, wherein in other versions, the water content of hydrogel is about 70-80%.

As used herein, the term "adapter" refers to a linear oligonucleotide that can be fused to a nucleic acid molecule, for example, by ligation or tagmentation. In some examples, the adapter is substantially non-complementary to the 3' end or the 5' end of any target sequence present in a sample. In some examples, suitable adapter lengths are in the range of about 10-100 nucleotides, about 12-60 nucleotides, or about 15-50 nucleotides in length. Generally, an adapter can include any combination of nucleotides and/or nucleic acids. An adapter can also include one or more cleavable groups at one or more locations. An adapter can also include a sequence that is complementary to at least a portion of a primer, for example a primer including a universal nucleotide sequence. An adapter can also include a barcode (also referred to as a tag or index) to assist with downstream error correction, identification, or sequencing. As used herein, the term "index" refers to a sequence of nucleotides that can be used as a molecular identifier or barcode to tag a nucleic acid, or to identify the source of a nucleic acid. An index can be used to identify a single nucleic acid, or a subpopulation of nucleic acids.

A flow cell herein may refer to a flow cell to be used during a sequencing workflow. For example, the flow cell may be used for library preparation, sequencing, or both. In one implementation, the same flow cell may be used for both the library preparation and sequencing. An example flow cell includes channel comprising a surface across which one or more fluid reagents can be flowed and to which adapted fragments of sequencing libraries can transport and bind. A flow cell includes a solid support having a surface on which sequencing libraries bind. In some examples, the solid surface is covered with a hydrogel layer. In some examples, the surface contains a lawn of capture nucleotides that can bind to adapted fragments of a sequencing library. In some examples, the surface is a patterned surface. The term "patterned," when referring to a surface, may refer to an arrangement (such as an array) of different regions (such as amplification sites) in or on an exposed surface of a solid support. For example, one or more of the regions can be features where one or more amplification and/or capture primers are present. The features can be separated by interstitial regions where primers are not present. In some examples, the flow cell device has a channel height of about 50 μm, about 60 μm, about 70 μm, about 80 μm, about 90 μm, about 100 μm, about 110 μm, about 120 μm, about 130 μm, about 140 μm, or about 150 μm, or an amount within a range defined by any two of the aforementioned values.

Figure 1B:
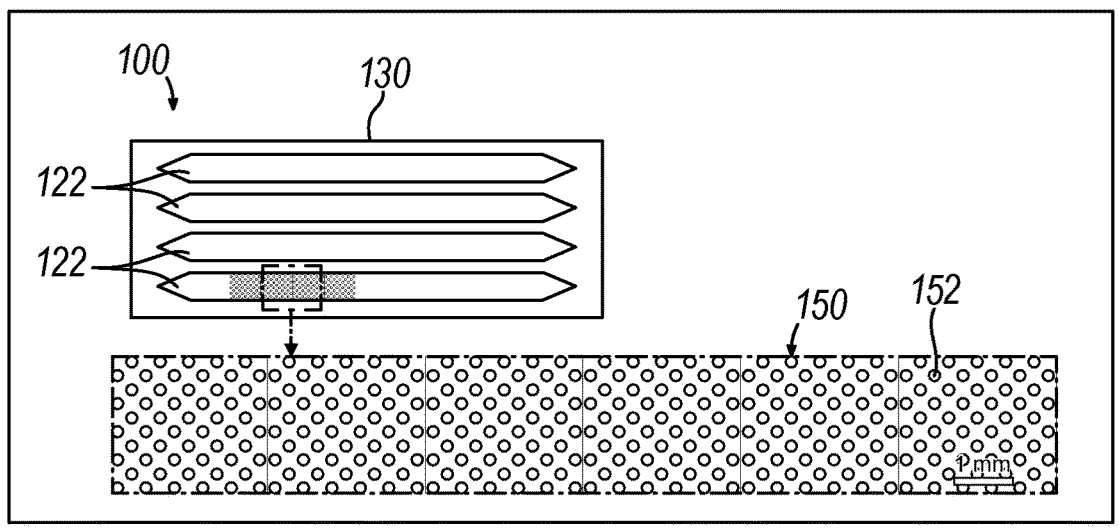
FIG. 1B is a top view and close-up top view of the flow cell of FIG. 1A wherein arrays of hydrogel structures have been formed on the flow cell.
Figure 1C:
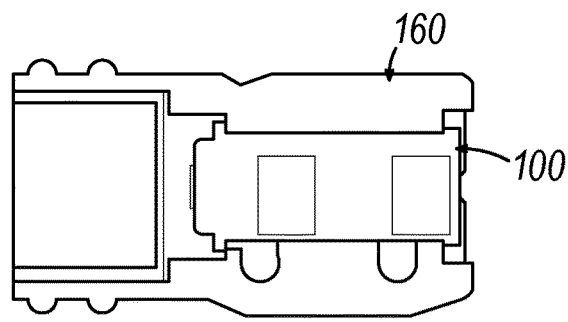
FIG. 1C depicts the flow cell of FIG. 1A properly inserted into a cartridge used in sequencing-by-synthesis processes.

As shown in FIG. 1A, an example sequencing flow cell 100 includes top layer of glass 110 having fluidic holes 112 formed therein; channel defining spacer 120, which includes a plurality of fluidic/sequencing channels 122 formed therein; and bottom layer of glass 130 on which array 150 is formed. Array 150 includes a plurality of individual structures 152 formed thereon by the disclosed methods. An individual structure 152 may be a three-dimensional structure. The structure may comprise a polymer. In one implementation, the polymer is a hydrogel. It is noted while hydrogel is used to reference structure 152 in some instances herein, "hydrogel" is only used as a representative material in this implementation, and the structure need not comprise hydrogel and instead can comprise any suitable polymer material. FIG. 1B depicts assembled flow cell 100 upon which an array 150 of individual three-dimensional hydrogel structures 152 has been fabricated in one of the sequencing channels 122 and FIG. 1C depicts flow cell 100 having multiple three-dimensional hydrogel structures 152 formed thereon inserted into sequencing cartridge 160, which is used with a sequencing-by-synthesis apparatus. Three-dimensional hydrogel structures having a specific, predetermined geometry may be formed on the flow cell by: (i) introducing a hydrogel precursor solution into a sequencing channel of the flow cell; (ii) placing a photomask having a specific pattern formed thereon over the sequencing channel on the flow cell, either before or after introducing the hydrogel precursor solution into the flow cell; and (iii) exposing the hydrogel precursor solution to light at a predetermined wavelength through the photomask, wherein the illumination of the hydrogel precursor solution polymerizes the contents thereof and forms three-dimensional structures on the flow cell that correspond to the pattern on the photomask. Once the hydrogel structures have served their purpose, they may be cleaved from the flow cell and washed away without affecting the overall functionality of the flow cell.

The hydrogel precursor solution may include monomer solutions that can be photopolymerized by activation of a photoinitiator. An example of one such system includes at least one type of monomer, a reversible or cleavable cross-linker, and a photoinitiator. In one version, the monomer is acrylamide, the reversible crosslinker is N,N'-Bis(acryloyl) cystamine (BAC), and the photoinitiator is lithium phenyl-2,4,6-trimethylbenzoylphosphinate (LAP), which is activated by ultraviolet (UV) light at a predetermined wavelength.

In other versions, the precursor solution may include polyethylene glycol (PEG)-thiol, PEG-acrylate, acrylamide, N,N'-bis(acryloyl)cystamine, PEG, polypropylene oxide (PPO), polyacrylic acid, poly(hydroxyethyl methacrylate) (PHEMA), poly(methyl methacrylate) (PMMA), poly(N-isopropylacrylamide) (PNIPAAm), poly(lactic acid) (PLA), poly(lactic-co-glycolic acid) (PLGA), polycaprolactone (PCL), poly(vinylsulfonic acid) (PVSA), poly(L-aspartic acid), poly(L-glutamic acid), polylysine, agar, agarose, alginate, heparin, alginate sulfate, dextran sulfate, hyaluronan, pectin, carrageenan, gelatin, chitosan, cellulose, collagen, bisacrylamide, diacrylate, diallylamine, triallylamine, divinyl sulfone, diethyleneglycol diallyl ether, ethyleneglycol diacrylate, polymethyleneglycol diacrylate, polyethyleneglycol diacrylate, trimethylopropoane trimethacrylate, ethoxylated trimethylol triacrylate, or ethoxylated pentaerythritol tetracrylate, or combinations thereof. In other versions, the monomer may include PEG-thiol/PEG-acrylate, acrylamide/N,N'-bis(acryloyl)cystamine (BACy), or PEG/PPO.

In some implementations of the disclosed methods, the monomer may be the compound of formula I:

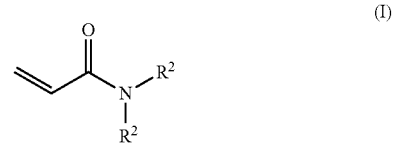

(I)

wherein each R² is independently hydrogen or (C₁₋₆) alkyl.

In some implementations of the disclosed methods that include a crosslinker, the crosslinker may be the compound of formula II:

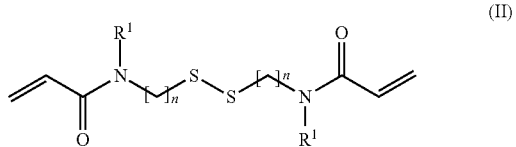

(II)

wherein:
each n is independently an integer from 1-6; and
each R¹ is independently a hydrogen or (C₁₋₆) alkyl.

A crosslinker is capable of crosslinking the polymer chains within the polymer. In one implementation, the polymer is a hydrogel. In some versions, a crosslinker can be cleaved, thereby unlinking the polymer chains, by the presence of a reducing agent; by elevated temperature; by an electric field; or by exposing the hydrogel structures to a wavelength of light that cleaves a photo-cleavable crosslinker that crosslinks polymer of the hydrogel. In some versions, the reducing agent may include phosphine compounds, water soluble phosphines, nitrogen containing phosphines and salts and derivatives thereof, dithioerythritol (DTE), dithiothreitol (DTT) (cis and trans isomers, respectively, of 2,3-dihydroxy-1,4-dithiolbutane), 2-mercaptoethanol or β-mercaptoethanol (BME), 2-mercaptoethanol or aminoethanethiol, glutathione, thioglycolate or thioglycolic acid, 2,3-dimercaptopropanol, tris(2-carboxyethyl)phosphine (TCEP), tris(hydroxymethyl)phosphine (THP), or P-[tris(hydroxymethyl)phosphine] propionic acid (THPP). In some versions, the crosslinker is cleaved by increasing the temperature to greater than about 50° C., about 55° C., about 60° C., about 65° C., about 70° C., about 75° C., about 80° C., about 85° C., about 90° C., about 95° C., or about 100° C. In some versions, the reducing agent is activated by ultraviolet light.

Other suitable photoinitiators include biocompatible photoinitiators for radical polymerization that do not damage nucleic acids such as, for example, a diazosulfonate initiator; monoacylphosphineoxide (MAPO) salts such as, for example, Na-TPO and Li-TPO; and bisacylphosphineoxide (BAPO) salts such as, for example, BAPO-ONa and BAPO-OLi.

In some examples, crosslinking the polymer chains of the hydrogel structure forms a hydrogel matrix having pores (i.e., a porous hydrogel matrix). In some versions, the size of the pores in the hydrogel structures are regulatable or tunable and may be formulated to encapsulate sufficiently large genetic material, such as cells or nucleic acids (e.g., of greater than about 300 base pairs), but to allow smaller materials, such as reagents, or smaller sized nucleic acids (e.g., of less than about 50 base pairs), such as primers, to pass through the pores, thereby passing in and out of the hydrogel structures. The hydrogels can have any pore size having a diameter sufficient to allow diffusion of reagents through the structure while retaining the encapsulated nucleic acid molecules. The term "pore size" can also refer to an average diameter or an average effective diameter of a cross-section of the pores, based on the measurements of a plurality of pores. The effective diameter of a cross-section that is not circular equals the diameter of a circular cross-section that has the same cross-sectional area as that of the non-circular cross-section. In some examples, the hydrogel structure can be swollen when the hydrogel is hydrated. The sizes of the pores can then change depending on the water content in the hydrogel of the hydrogel structure. In some examples, the pores have a diameter of from about 10 nm to about 100 nm.

In some examples, the pore size of the hydrogel structures is tuned by varying the ratio of the concentration of polymer to the concentration of crosslinker. In some examples, the ratio of polymer to crosslinker is about 30:1, about 25:1, about 20:1, about 19:1, about 18:1, about 17:1, about 16:1, about 15:1, about 14:1, about 13:1, about 12:1, about 11:1, about 10:1, about 9:1, about 8:1, about 7:1, about 6:1, about 5:1, about 4:1, about 3:1, about 2:1, about 1:1, about 1:2, about 1:3, about 1:4, about 1:5, about 1:6, about 1:7, about 1:8, about 1:9, about 1:10, about 1:15, about 1:20, or about 1:30, or about any one of these ratios, or a ratio within a range defined by any two of the aforementioned ratios.

Figure 2A:
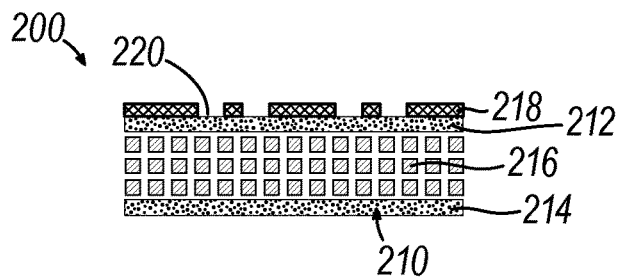
FIG. 2A depicts an example of the disclosed systems and methods for forming polymer (e.g., hydrogel) structures on a flow cell such as the flow cell shown in FIG. 1A, wherein a polymer precursor solution has been introduced into a fluidics channel of the flow cell and a prepatterned photomask has been placed over the channel.
Figure 2B:
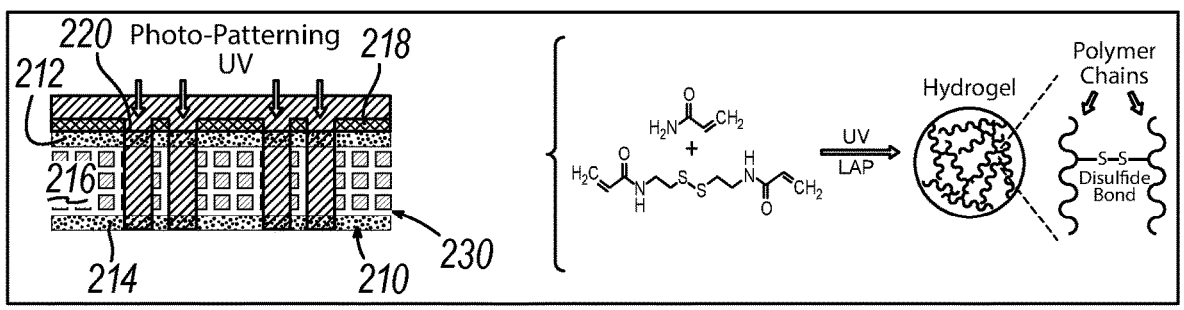
FIG. 2B depicts an example of the disclosed systems and methods for forming polymer (e.g., hydrogel) structures on a flow cell wherein ultraviolet light is directed into the channel of the flow cell though openings in the photomask for polymerizing the contents of the polymer precursor solution.
Figure 2C:
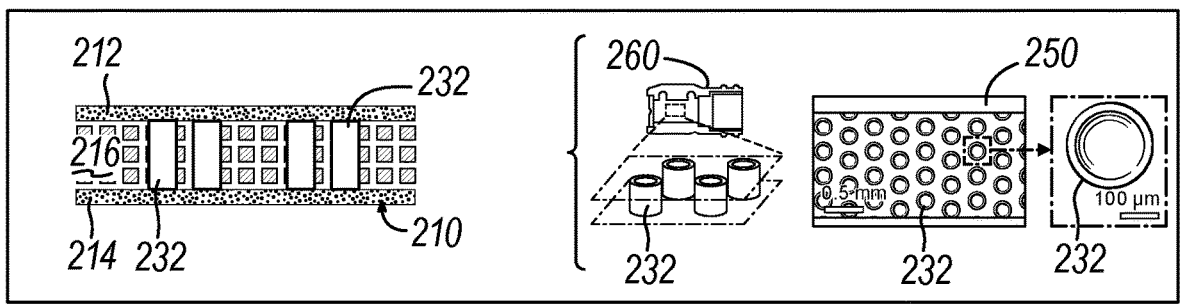
FIG. 2C depicts an array of hydrogel structures formed inside the channel of a flow cell wherein the hydrogel structures are cylindrical in shape and are attached to upper and lower internal surface of the channel.
Figure 2D:
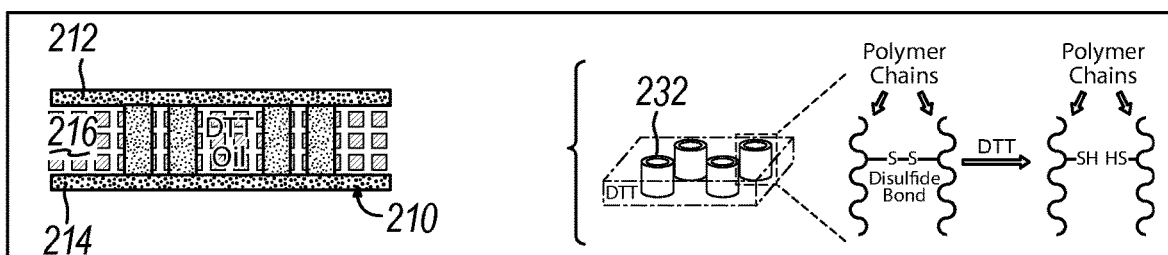
FIG. 2D depicts an example method for cleaving hydrogel structures formed in the channel of a flow cell by introducing oil containing a cleaving agent into the channel of the flow cell.
Figure 2E:
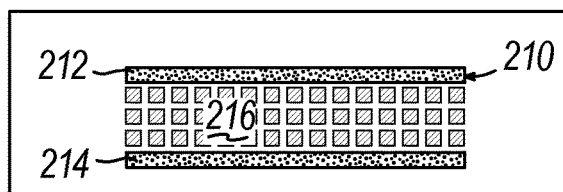
FIG. 2E depicts an example method for removing cleaved hydrogel structures from the channel of a flow cell by washing the channel.

FIGS. 2A-2E depict example method 200 for fabrication and subsequent removal of three-dimensional hydrogel structures on flow cell 210. Flow cell 210 includes upper internal surface 212 and lower internal surface 214 which together define flow cell channel 216. Pre-patterned photomask 218 has been laminated or otherwise attached to the upper surface of flow cell 210. FIG. 2A depicts introducing hydrogel precursor solution 230 containing: (i) monomer (e.g., acrylamide), (ii) crosslinker (e.g., BAC), and (iii) photo-initiator (e.g., LAP) into flow cell 210. FIG. 2B depicts exposing hydrogel precursor solution 230 to UV light at a predetermined wavelength through pre-patterned photomask 218, which has multiple apertures 200 formed therein. Exposing hydrogel precursor solution 230 to UV light activates the photoinitiator (LAP), thereby generating radicals that lead to controlled polymerization of the monomer (acrylamide) into hydrogel structures 232 containing disulfide bonds. FIG. 2C depicts the formation of hydrogel features 232, which are anchored to top and bottom surfaces 212 and 214 of sequencing channel(s) 216 of flow cell 210, which is adapted to be inserted into cartridge 260. FIG. 2C includes bright field micrograph 250 showing cylindrical hydrogel structure 232 (100-150 um in diameter) having dense gel walls with a less dense core. FIG. 2D depicts cleaving hydrogel features 232 from flow cell 210 using heat or a combination of heat and chemical cleavage of the crosslinker. For example, incubating hydrogel structures 232 with a reducing agent, such as an oil containing DTT, cleaves the structures by reducing the disulfide bonds in the hydrogel crosslinker to thiols, thereby permitting the hydrogel to be washed out of flow cell 210 as shown in FIG. 2E. The surfaces of flow cell 210 remain functional after the cleaved hydrogel structures have been washed out of the flow cell, i.e., removing the hydrogel structures from flow cell 210 does not affect the functionality of sequencing primers that have been bound to the flow cell prior to fabrication and subsequent removal of the hydrogel gel features.

Fabrication of hydrogel structures such as those previously described can be accomplished in both a factory environment and in a laboratory environment. However, known hydrogel fabrication techniques typically involve the use of expensive and unwieldy equipment such as, for example, a photomask aligner with a collimated UV light source and a chrome mask. Accordingly, to facilitate the fabrication of hydrogel structures on flow cells directly by consumers of sequencing products, a relatively small-scale, low-cost instrument for on-flow cell hydrogel fabrication is provided. By way of example, a generic implementation of this instrument includes: (i) a collimated LED UV light source such as, for example, Thor Labs model M385LP1-C1; (ii) a housing that is adapted to receive a flow cell (and flow cell cartridge) therein and that supports and properly positions the light source relative to the flow cell; (iii) a prepatterned Mylar® photomask that is adapted to be laminate adhered on the upper surface of a particular flow cell; and (iv) a shielding enclosure for containing the light source and housing. An opening in the shielding enclosure allows the flow cell to be inserted into the housing for UV illumination of the flow cell through the prepatterned photomask. The housing may include a movable or adjustable stage apparatus for replicating patterns along the length and width of a flow cell if the illumination zone of the housing is smaller than the area of on the flow cell that is to be photopatterned. In addition to operating as a wide-field illuminator, different versions of the disclosed instrument also perform various reagent exchanges and provide thermal control for facilitating automated library preparation. As described in greater detail below, certain implementations of the disclosed instrument operate as stand-alone library preparation devices that output a ready to cluster or ready to sequence library. The photomask may include (but need not necessarily be limited to) Mylar® (polyethylene terephthalate); a screen-printed light absorbing material such as carbon ink; or a chemically etched metal film; such aluminum, chrome, gold, or platinum, and other light absorbing materials.

Figure 3A:
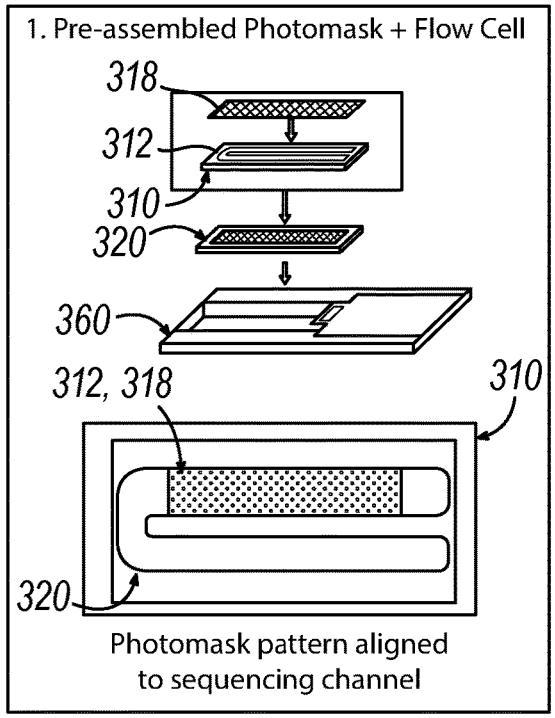
FIG. 3A depicts a first step in another example of the disclosed systems and methods for forming polymer (e.g., hydrogel) structures on a sequencing flow cell wherein a prepatterned photomask is placed on or attached to a flow cell that is then inserted into a cartridge.
Figure 3B:
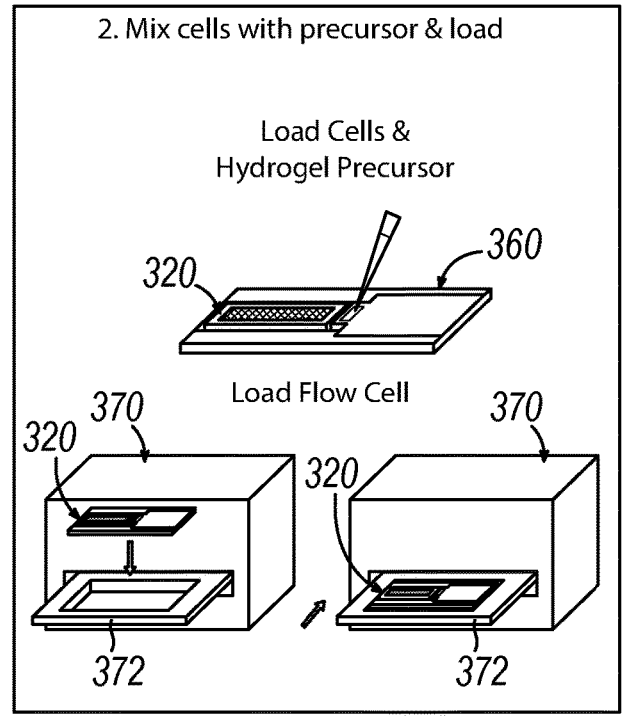
FIG. 3B depicts a second step in another example of the disclosed systems and methods for forming polymer (e.g., hydrogel) structures on a sequencing flow cell wherein a polymer precursor solution containing biological cells is loaded into the flow cell of FIG. 3A and the flow cell is then loaded into a device or instrument using an extendable tray.
Figure 3C:
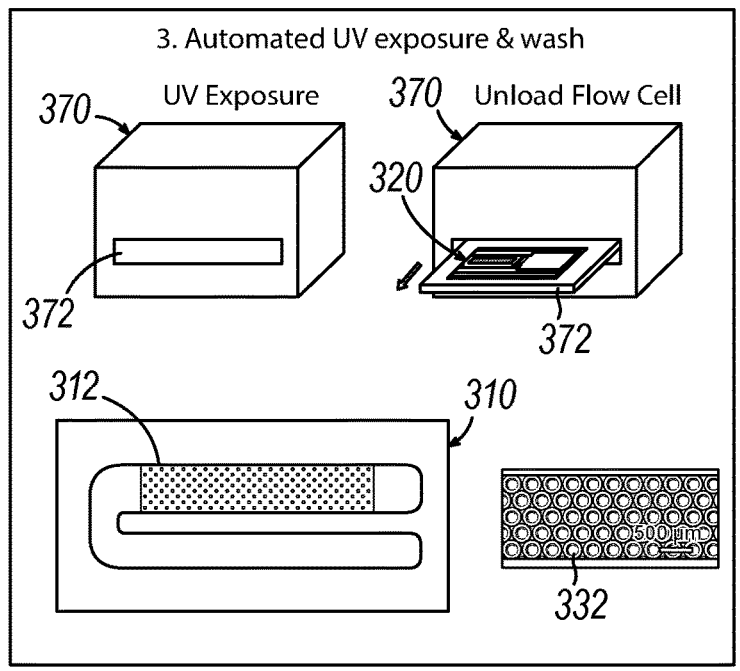
FIG. 3C depicts a third step in another example of the disclosed systems and methods for forming polymer (e.g., hydrogel) structures on a sequencing flow cell wherein the flow cell is exposed to ultraviolet light to form an array of hydrogel structures on the flow cell (which are shown in the bright field micrograph), and wherein the flow cell is then washed to remove unpolymerized material and unloaded from the instrument.

FIGS. 3A-3C depict an example implementation of the disclosed system and method for fabricating hydrogel structures on a flow cell, wherein the hydrogel structures contain a sample to be sequenced or otherwise analyzed. In this implementation, the disclosed instrument is automated, and the housing includes a processor that executes various programs residing thereon for illuminating the flow cell and for performing reagent exchange and other functions in an automated manner. As shown in FIG. 3A, a customer (or other user) orders flow cell 310 on which photomask 318 (having a region that includes a customer-specified pattern formed therein) has been laminated to form assembly 320. The patterned region of photomask 318 is placed over and aligned with channel(s) 312 on flow cell 310. Flow cell 310 is then inserted into an appropriate flow cell cartridge 360. As shown in FIG. 3B, the customer then mixes a sample of interest (e.g., biological cells or genomic DNA) with a hydrogel precursor solution that includes, for example, a monomer, a cross linker, and a photoinitiator, and loads the solution onto flow cell 310. As shown in FIG. 3C, assembly 320 and cartridge 360 are then loaded into housing 370 on which a UV light source has been mounted using moveable tray 372. Based on the layout or geometric pattern of photomask 318, the customer chooses an appropriate illumination program and exposes flow cell 310 to UV light for polymerizing the solution and patterning the desired hydrogel structures on flow cell 310. FIG. 3C includes a bright field micrograph of hydrogel pillars 332 fabricated on a flow cell using the disclosed system and method. Flow cell 310 is then washed to remove unpolymerized solution and excess sample and photomask 318 can be removed from flow cell 310. In one implementation, more than half of each of the unpolymerized solution, the excess sample, and the photomask is removed. In one implementation, all of each of the unpolymerized solution, the excess sample, and the photomask is removed. Flow cell 310 can then be placed into a sequencer or fluid handler for automated downstream processing such as lysis, tagmentation, bridge amplification, clustering, etc.

Several other implementations are provided regarding the assembly of the photomask and the flow cell. In one implementation, a user first inserts a flow cell into the housing and then inserts the photomask, which is separate from the flow cell (e.g., the photomask is not laminated to the flow cell). Because various photomask patterns and designs are possible, a user may select different photomasks based on required pitch or on specific applications or specific uses for the flow cell. In this and other implementations, the housing of the instrument is adapted to receive a variety of different flow cells including HiSeq™, NextSeq™ NovaSeq™, MiniSeq™, iSeq™, and MiSeq™ flow cells, or other suitable flow cells available from Illumina, Inc. In another implementation, the flow cell is provided pre-assembled with the photomask already applied to the exterior surface of the flow cell. Depending on the resolution, the photomask can be either printed on the flow cell using screen printing or laminated to the surface of the flow cell using an opaque adhesive film patterned to create structures on the flow cell. The photomask may be peeled off of the flow cell after it has been used, if desired. In another implementation, the photomask may be fabricated from aluminum, or another metal deposited inside a fluidic channel, during a microfabrication process used to create the flow cell. The photomask may then be etched away with a high pH buffer after creation of hydrogel structures on the flow cell is complete.

II. Cell Compartmentalization and In Situ Sequencing Library Preparation

The disclosed systems and methods may have a benefit of high-throughput single-cell or single-colony sequencing by providing on-flow cell compartmentalization of biological cells (and genetic material contained therein) that is achieved by encapsulating single cells or single cell colonies in reversible hydrogel structures that allow for efficient reagent exchange for cell lysis and sequencing library preparation. In situ library preparation and spatial indexing of clusters is accomplished using the following example implementation, which includes on-flow cell biological cell encapsulation, library preparation, library seeding, and bridge amplification. The flow cell is provided with two types of oligonucleotides (e.g., P5 and P7), referred to as surface primers or sequencing primers, bound to the upper and lower surfaces of the flow cell. The sequences of these surface primers are complimentary to library adapters, and the fragments of a DNA library are captured by these oligonucleotides. As used herein, P5 and P7 refer to a universal P5 or P7 sequence or P5 or P7 primer for capture and/or amplification purposes. A P5 sequence comprises a sequence defined by SEQ ID NO: 1 (AATGA-TACGGCGACCACCGA) and a P7 sequence comprises a sequence defined by SEQ ID NO: 2 (CAAGCAGAA-GACGGCATACGA).

"Genetic material", as used herein, refers to cells, microbiomes, or nucleic acids. In some versions, the cell is a single cell, including a prokaryotic or a eukaryotic cell. In some versions, the cell is a mammalian cell. In some versions, the cell is a human cell. In some versions, the cell is a bacterial cell. In some versions, the genetic material is a viral particle. In some versions, the nucleic acid is a long DNA molecule, genomic DNA, viral nucleic acid, bacterial nucleic acid, or mammalian nucleic acid. Any genetic materials of interest may be encapsulated within the disclosed hydrogel structures.

Genetic material encapsulated with the disclosed hydrogel structure is of sufficient size that it is entrapped within the hydrogel structure such that it cannot pass through the pores of the hydrogel structure. In some examples, the target nucleic acid molecule encapsulated within the hydrogel structure is at least about 100 nucleotides in length, at least about 150 nucleotides in length, at least about 200 nucleotides in length, at least about 300 nucleotides in length, at least about 500 nucleotides in length, at least about 1,000 nucleotides in length, at least about 5,000 nucleotides in length, at least about 10,000 nucleotides in length, at least about 20,000 nucleotides in length, at least about 50,000 nucleotides in length, at least about 100,000 nucleotides in length, or more nucleotides in length. In several examples, the nucleic acid molecules encapsulated within the hydrogel structures are genomic DNA fragments of from about 1,000 to about 10,000 nucleotides in length, from about 10,000 to about 20,000 nucleotides in length, from about 10,000 to about 50,000 nucleotides in length, from about 50,000 to about 100,000 nucleotides in length, or about 300, about 500, about 1000, about 10,000, about 20,000, about 50,000 or about 100,000 nucleotides in length, or a range between any two of the foregoing sizes, or a length longer than the foregoing sizes. In some examples, the encapsulated nucleic acid molecules are up to about 3 Mbases in length.

Some versions of the disclosed systems and methods relate to processing genetic material within a hydrogel structure to create a sequencing library, which can be defined as a collection of fragments of one or more target nucleic acid molecules, or amplicons of the fragments. In some versions, genetic material encapsulated within a hydrogel structure is contacted with one or more reagents for nucleic acid processing. In some versions, the genetic material is retained within the hydrogel structures, and reagents pass through the pores of the hydrogel structures. Reagents can include lysis reagents, nucleic acid purification reagents, DNA amplification reagents, tagmentation reagents, PCR agents, or other reagents used in processing of genetic materials (e.g., lysozyme, proteinase K, random hexamers, polymerase (for example, Φ29 DNA polymerase, Taq polymerase, Bsu polymerase), transposase (e.g., Tn5), primers (e.g., P5 and P7 adaptor sequences), ligase, catalyzing enzyme, deoxynucleotide triphosphates, buffers, or divalent cations. Thus, the hydrogel structures provide a microenvironment for controlled reactions of genetic materials within the hydrogel structures by allowing a barrier for reagents to pass in and out of the hydrogel structures, while retaining the genetic material itself within the structures. This has the benefit of enabling single cell processing for rapid and efficient processing of a target nucleic acid. In some versions, the encapsulated nucleic acids are sequenced in full or in part within the hydrogel structures. The encapsulated nucleic acids can be sequenced according to any suitable sequencing methodology, such as direct sequencing, including sequencing by synthesis, sequencing by ligation, sequencing by hybridization, nanopore sequencing and the like.

Figure 4A:
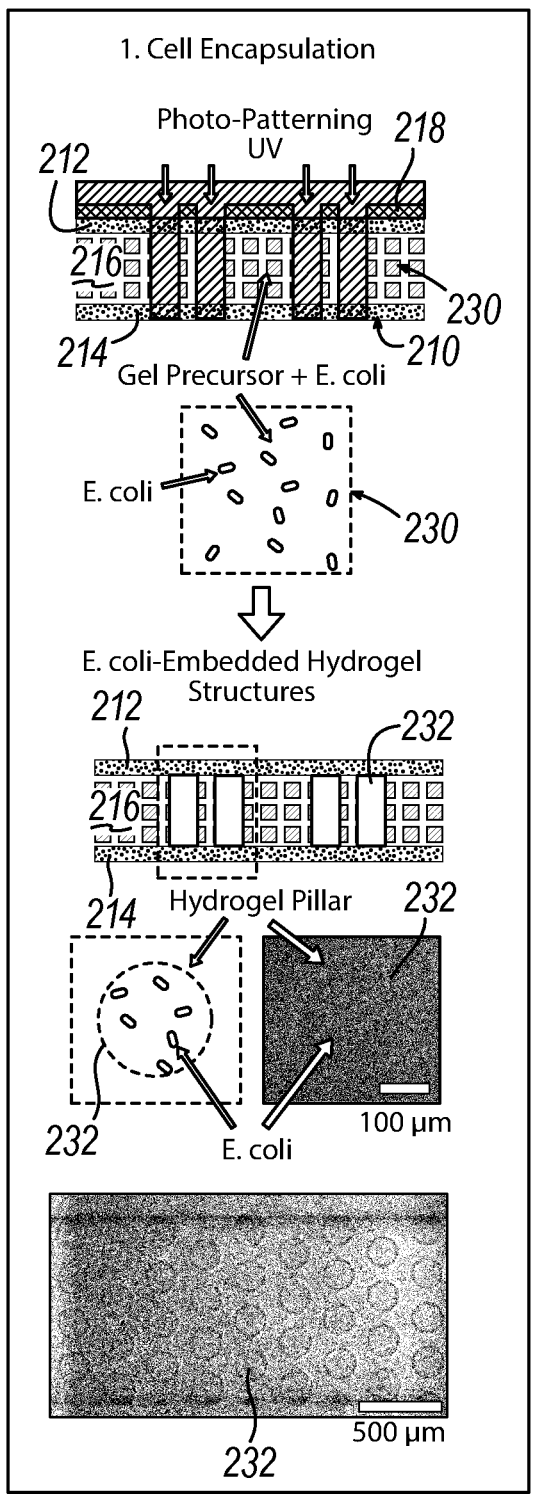
FIG. 4A depicts an example of the disclosed systems and methods for cell encapsulation and in situ preparation of sequencing libraries wherein single cells or colonies or cells are mixed with a polymer precursor solution and loaded into a flow cell and illuminated with ultraviolet light through a photomask to create an array of cell-embedded hydrogel structures (e.g., pillars) on the flow cell, which is shown in the bright field micrograph.
Figure 5A:
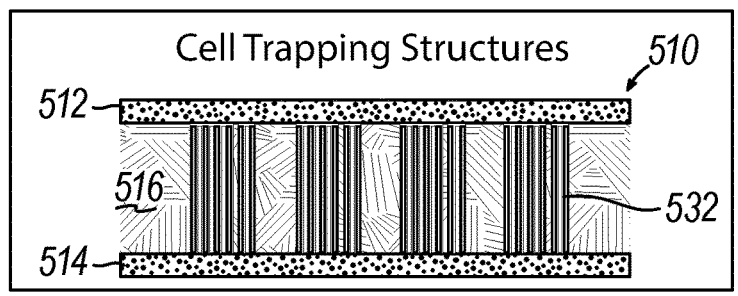
FIG. 5A is a side view of a group of hydrogel structures formed on a flow cell using an alternate version the disclosed systems and methods for on-flow cell capturing of cells for in situ library preparation, wherein the hydrogel structures have a reverse C-shaped geometry.
Figure 5B:
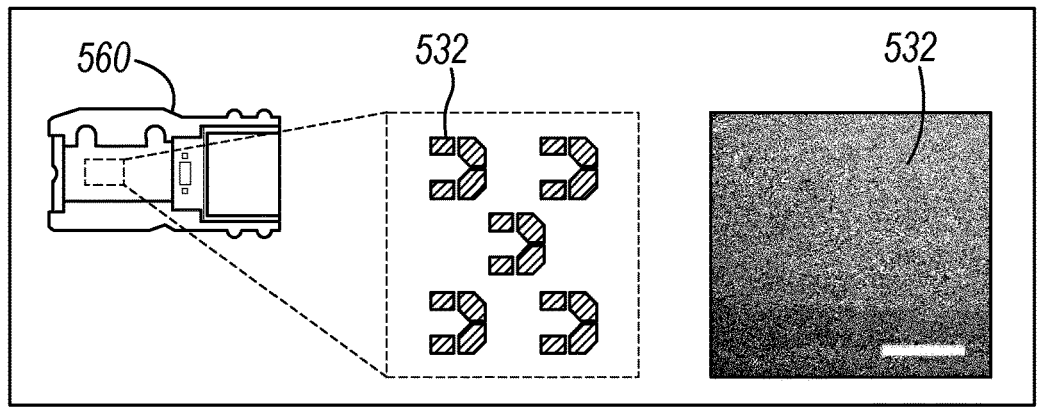
FIG. 5B are several top views of the cell-trapping hydrogel features of FIG. 5A, showing the reverse C-shaped geometry thereof.
Figure 5C:
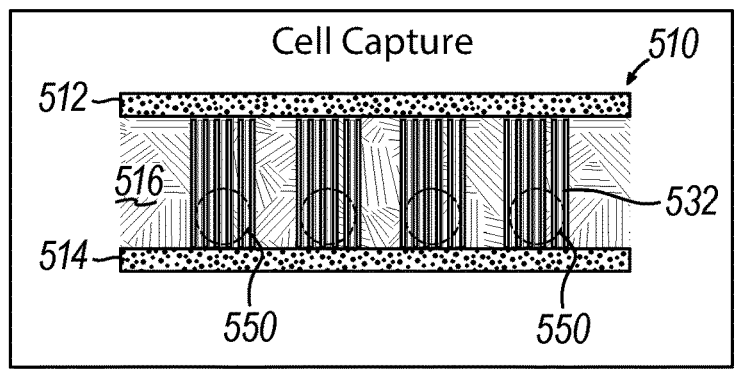
FIG. 5C is a side view of the hydrogel structures of FIG. 5A showing an individual cell captured in each hydrogel structure.
Figure 5D:
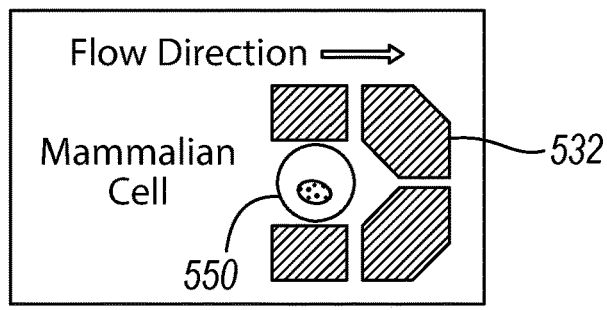
FIG. 5D is a side view of one of the hydrogel structures of FIG. 5C showing an individual cell captured in the hydrogel structure and the direction of cell-containing fluid directed into and through the flow cell.

For cell encapsulation, as shown in FIG. 4A, single cells or colonies are mixed with a polymer precursor solution that includes a monomer, a cleavable crosslinker, and a photoinitiator. The cell-containing solution is then loaded into a flow cell and illuminated with UV light through a photomask in the manner previously described to create an array of cell-embedded hydrogel structures (e.g., pillars) on the flow cell. Excess precursor solution is washed away to obtain a clear interstitial space between the hydrogel structures. A merged bright field and fluorescence micrograph showing a hydrogel structure with *E. coli* cells encapsulated therein and a bright field image of hydrogel pillars formed on a flow cell appear at the bottom of FIG. 4A. Alternately, as shown in FIGS. 5A-5D, an array of hydrogel structures 532 having cell-trapping features formed therein may be created on flow cell 510 first, and single cells or colonies may then be flowed through cell-trapping hydrogel features 532 such that the single cells or colonies become entrapped in the hydrogel features. FIG. 5A is a side-view depiction of example cell-trapping hydrogel features 532 that are attached to upper surface 512 and lower surface 514 of channel 516. FIG. 5B is a top view of the cell-trapping hydrogel feature of FIG. 5A. FIG. 5C is a side-view depiction an example cell-trapping hydrogel array in which cells 550 have become entrapped and FIG. 5D is a top view of one of the cell-trapping hydrogel features of FIG. 5C showing cell 550 trapped therein. As shown in FIG. 5D, hydrogel features 532 may include beveled edges and various channels and passages formed therein to facilitate the flow of fluid through and around the features.

Figure 4B:
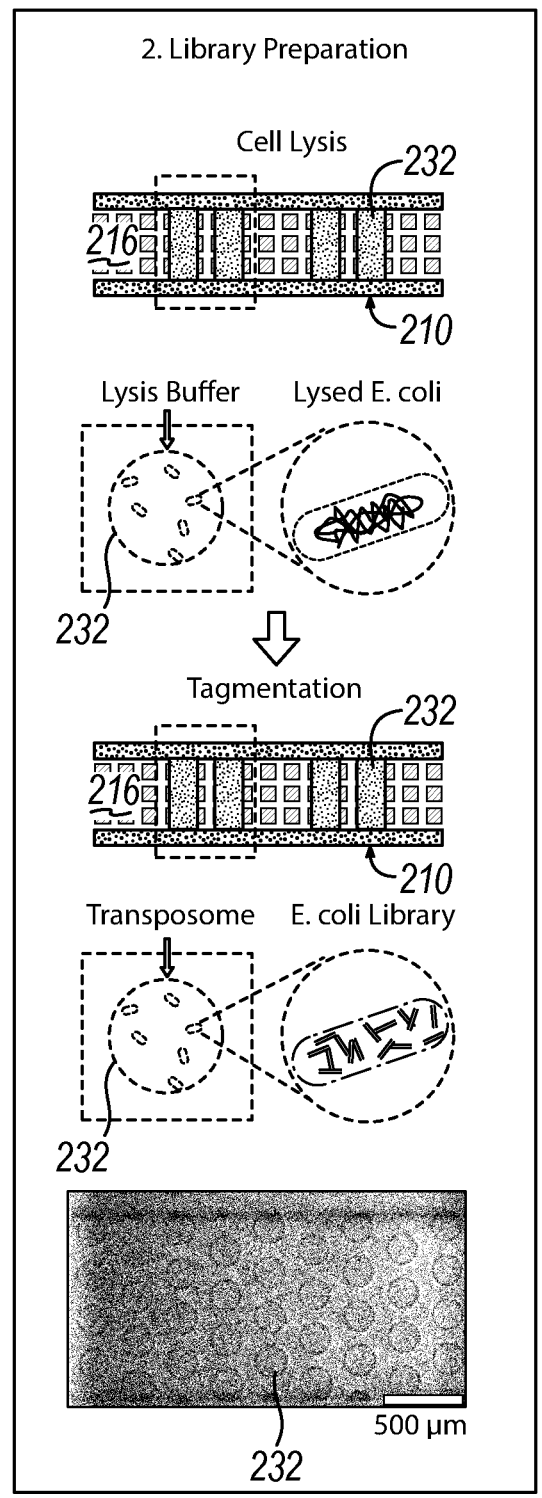
FIG. 4B depicts an example of the disclosed systems and methods for cell encapsulation and in situ preparation of sequencing libraries wherein lysis and tagmentation reagents are diffused into the hydrogel structures of FIG. 4A, and wherein the cells are then lysed and tagmented within the hydrogel structures.

In one implementation, for library preparation, as shown in FIG. 4B, lysis and tagmentation reagents are diffused into the hydrogel structures. Tuning or otherwise modifying the pore size of the hydrogel may allow optimization of buffer exchanges and efficient diffusion of reagents into and out of the hydrogel structures. Cells captured in the hydrogel structures are lysed with an enzymatic or chemical lysis buffer. DNA released by lysing the cells is then tagmented. Tagmentation involves modification of a nucleic acid molecule by a transposome complex to fragment the nucleic acid molecule and ligate adapters to the 5' and 3' ends of the fragments in a single step. Tagmentation reactions may combine random DNA fragmentation and adapter ligation into a single step to increase the efficiency of the sequencing library preparation process. Once the adapters have been ligated to the fragments, additional motifs such as indices, barcodes, and other kinds of molecular modifications that act as reference points during amplification, sequencing, and analysis may be added. Indices and barcodes are unique DNA sequences ligated to fragments within a sequencing library for downstream in silico sorting and identification. A bright field micrograph showing an array of hydrogel structures appears at the bottom of FIG. 4B.

As previously indicated, adaptors can include sequencing primer sites, amplification primer sites, and indexes. For example, an adaptor can include a P5 sequence, a P7 sequence, or a complement of either. As previously indicated, an "index" can include a sequence of nucleotides that can be used as a molecular identifier and/or barcode to tag a nucleic acid, and/or to identify the source of a nucleic acid. In some versions, an index can be used to identify a single nucleic acid, or a subpopulation of nucleic acids.

Figure 4C:
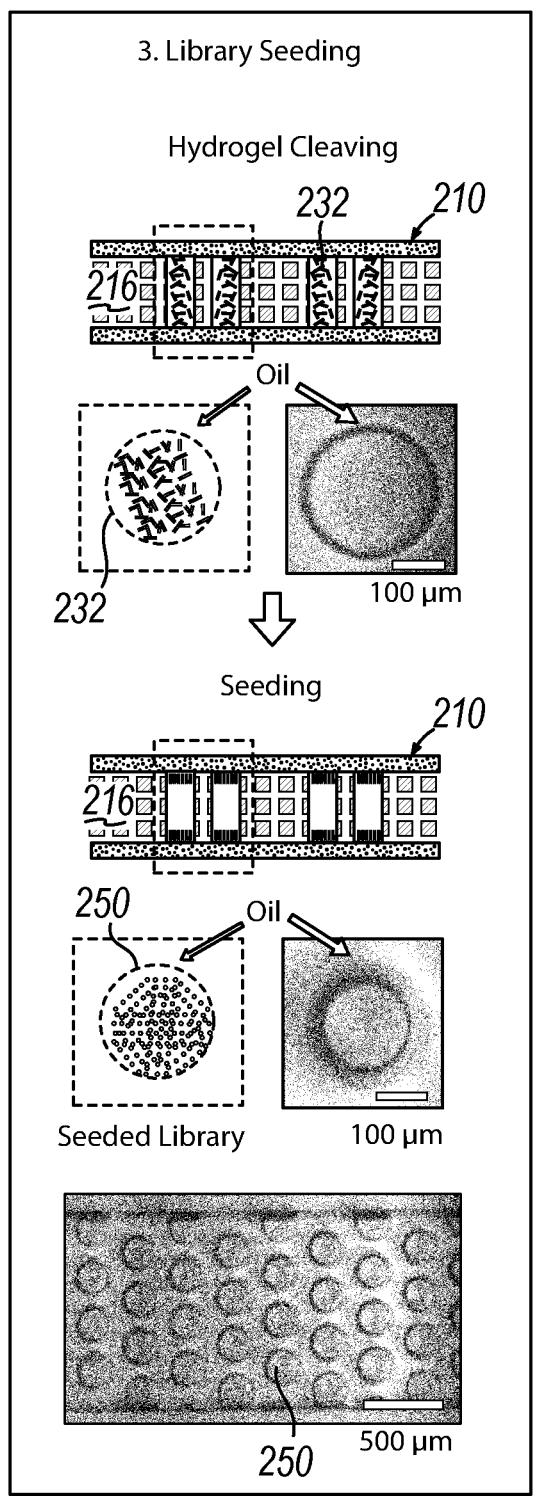
FIG. 4C depicts an example of the disclosed systems and methods for cell encapsulation and in situ preparation of sequencing libraries wherein the libraries of FIG. 4B are seeded onto the top and bottom surfaces of the flow cell by introducing oil into the flow cell and raising the temperature to release the library fragments contained in the hydrogel structures, which then hybridize to surface primers attached to the surfaces of the flow cell.

For library seeding, as shown in FIG. 4C, to seed the libraries resulting from library preparation onto the top and bottom surfaces of the flow cell while maintaining spatial compartmentalization, a liquid diffusion barrier is introduced into the flow cell. The liquid diffusion barrier may contain a cleaving agent such as DTT, which degrades the hydrogel structures. The temperature of the flow cell is raised, and the hydrogel structures are cleaved to release the library fragments contained therein, which then hybridize to the surface primers attached to the surfaces of the flow cell at areas 250. In this implementation, a wash step with an aqueous buffer is used to remove the cleaved hydrogels from the flow cell. A bright field micrograph showing melted hydrogel structures in mineral oil appears at the bottom of FIG. 4C.

The hydrogel structures are degraded while surrounded by a liquid diffusion barrier to release the sequencing libraries from the structures and seed the sequencing libraries on the flow cell. The liquid diffusion barrier is loaded onto the flow cell to fill the void volume between the hydrogel structures and to surround the hydrogel structures. Surrounding the captured hydrogel structures with the liquid diffusion barrier inhibits diffusion of the sequencing libraries outside of the structure volume when the structure is degraded, thereby reducing, and in some instances even preventing, cross-contamination between hydrogel structures. After structure degradation, the encapsulated sequencing libraries transport to the surface of the flow cell, where they are captured. Thus, in the presence of the liquid diffusion barrier, seeding on the flow cell occurs in close proximity to the footprint of each hydrogel structure. It should be noted that a diffusion barrier is used in certain implementations wherein discrete compartmentalization of library fragments generated within the hydrogel structures is desired. However, in implementations in which compartmentalization is not desired, a diffusion barrier may not be used. Accordingly, the diffusional barrier may be referred to as "optional".

In some examples, the liquid diffusion barrier can be a hydrophobic liquid such as an oil, examples of which include mineral oil, silicone oil, or perfluorinated oil, or a combination of two or more thereof. In some examples, the liquid diffusion barrier is a viscous aqueous solution, for example, containing polyethylene glycol (PEG), polyvinylpyrrolidone, pluronic dextran, sucrose, poly(N-isopropylacrylamide) or polyethylene oxide-polypropylene oxide-polyethylene oxide (PEO-PPO-PEOyiaponite, or a combination of two or more thereof. In some examples, a temperature responsive material can be used as the liquid diffusion barrier. The temperature responsive material is a non-viscous liquid at non-seeding temperature and can be easily loaded onto the flow cell to occupy the interstitial space between hydrogel structures. Upon heating to seeding temperature, the material solidifies to form a physical barrier and prevent library diffusion. In some examples, the temperature responsive material can be a poly(N-isopropylacrylamide) or polyethylene oxide-polypropylene oxide-polyethylene oxide (PEO—PPO-PEO)/laponite nanoparticle composite material. In some examples, the liquid diffusion barrier used in the disclosed implementations is composed of a combination of any two or more of the liquid diffusion barriers discussed above.

The hydrogel structures can be degraded using any appropriate method that does not substantially reduce the effectiveness of the liquid diffusion barrier for inhibiting diffusion of the sequencing libraries beyond the diameter of the hydrogel structures. The hydrogel structures do not need to be completely degraded to release the sequencing libraries from the hydrogel structures and seed the sequencing libraries on the flow cell. Sufficient degradation includes an increase in porosity of the hydrogel structures to allow for diffusion of the encapsulated sequencing libraries and transport of the sequencing libraries to the surface of the flow cell.

Figure 4D:
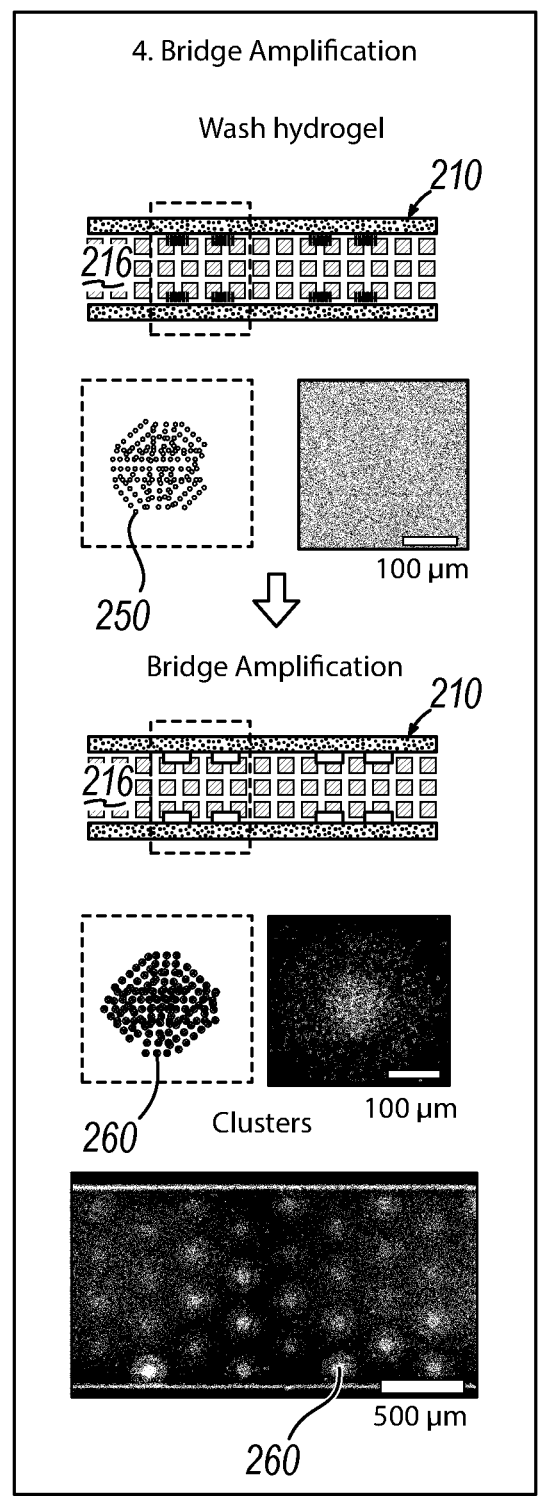
FIG. 4D depicts an example of the disclosed systems and methods for cell encapsulation and in situ preparation of sequencing libraries wherein the hybridized library fragments of FIG. 4C are then clonally amplified using the bridge amplification process for cluster generation.

For bridge amplification, as shown in FIG. 4D, the hybridized library fragments are then clonally amplified using the bridge amplification process for cluster generation. During bridge amplification, polymerases move along a single stranded DNA fragment (polynucleotide) bound to the flow cell, creating its complementary polynucleotide. The original polynucleotide is washed away, leaving only the reverse polynucleotide. At the top of the reverse polynucleotide there is an adapter sequence (e.g., P5 or P7). The DNA fragment bends and attaches to an oligonucleotide on the flow cell surface that is complementary to the top adapter sequence. Polymerases attach to the reverse polynucleotide, and its complementary polynucleotide (which is identical to the original) is made. The now double stranded DNA is denatured so that each polynucleotide can separately attach to an oligonucleotide sequence anchored to the flow cell. One will be the reverse strand; the other, the forward. The process is then repeated over and over and may occur simultaneously for millions of clusters resulting in clonal amplification of all the fragments in the DNA library. Following bridge amplification, resulting clusters 260 are localized to the top and bottom surfaces of the flow cell where the hydrogel structures had previously been anchored. A fluorescence micrograph at the bottom of FIG. 4D shows the presence of sequencing clusters 260 after staining with SYTOX™ intercalator dye, commercially available from ThermoFisher Scientific.

Figure 6:
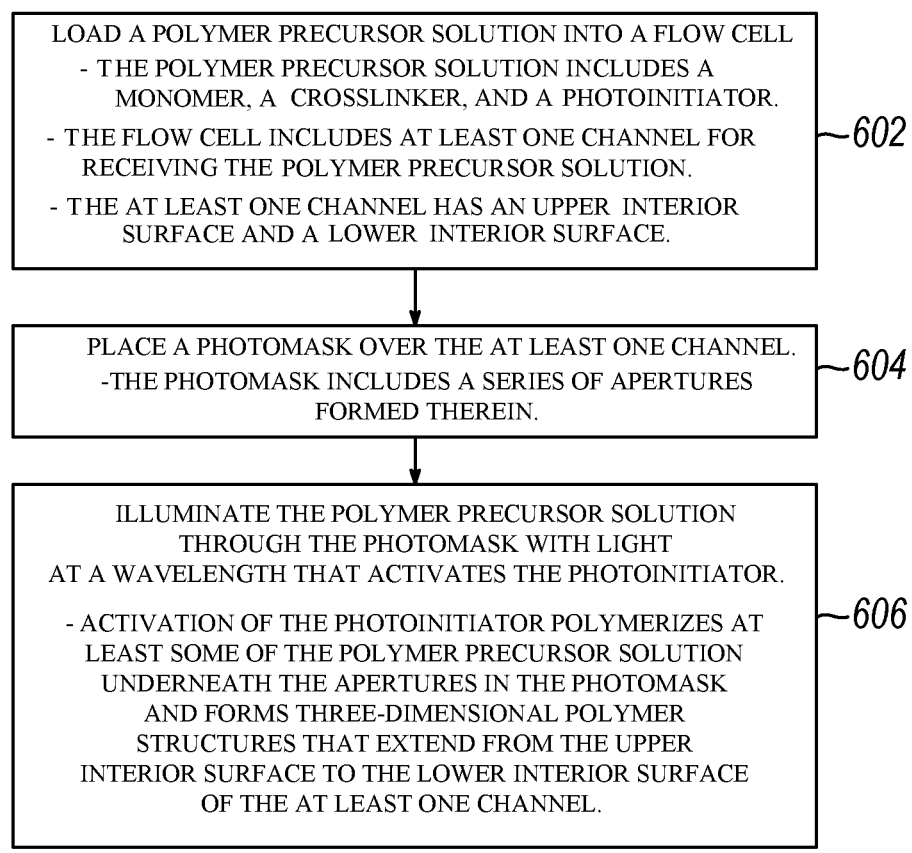
FIG. 6 is a flow chart depicting an example implementation of a method for making reversible, permeable three-dimensional polymer structures on a flow cell.

FIG. 6 is a flowchart depicting an example implementation of a method for making three-dimensional polymer structures on a flow cell. Method 600 includes loading a polymer precursor solution into a flow cell at block 602, wherein the polymer precursor solution includes a monomer, a crosslinker, and a photoinitiator, wherein the flow cell includes at least one channel for receiving the polymer precursor solution, and wherein at least one channel has an upper interior surface and a lower interior surface; placing a photomask over the at least one channel at block 604, wherein the photomask includes a series of apertures formed therein; and illuminating the polymer precursor solution through the photomask with light at a wavelength sufficient to activate the photoinitiator at block 606. Activation of the photoinitiator polymerizes at least some of the polymer precursor solution underneath the apertures in the photomask and forms three-dimensional polymer structures that extend from the upper interior surface to the lower interior surface of the at least one channel. In other implementations, the photomask is integrated with the flow cell rather than being placed on or attached thereto.

Figure 7:
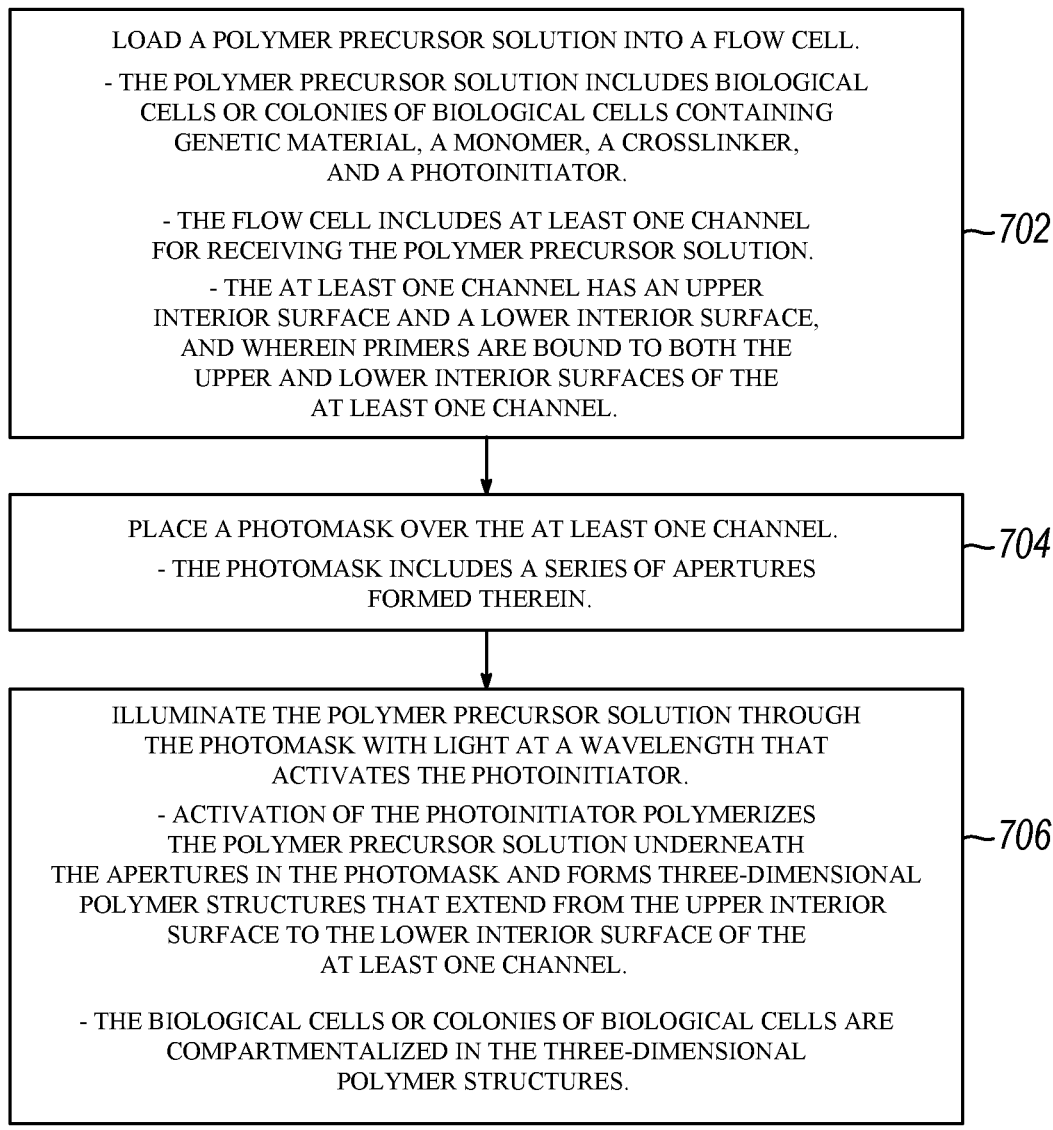
FIG. 7 is a flow chart depicting an example implementation of a method for sequencing library preparation using reversible, permeable three-dimensional polymer structures formed on a flow cell.

FIG. 7 is a flowchart depicting another example implementation of a method for making three-dimensional polymer structures on a flow cell. Method 700 includes loading a polymer precursor solution into a flow cell at block 702, wherein the polymer precursor solution includes biological cells or colonies of biological cells containing genetic material, a monomer, a crosslinker, and a photoinitiator, wherein the flow cell includes at least one channel for receiving the polymer precursor solution, wherein the at least one channel has an upper interior surface and a lower interior surface, and wherein primers are bound to both the upper and lower interior surfaces of the at least one channel; placing a photomask over the at least one channel at block 704, wherein the photomask includes a series of apertures formed therein; and illuminating the polymer precursor solution through the photomask with a light at a wavelength that activates the photoinitiator at block 706, wherein activation of the photoinitiator polymerizes at least some of the polymer precursor solution underneath the apertures in the photomask and forms three-dimensional polymer structures that extend from the upper interior surface to the lower interior surface of the at least one channel; and wherein the biological cells or colonies of biological cells are compartmentalized in the three-dimensional polymer structures. In other implementations, the photomask is integrated with the flow cell rather than being placed on or attached thereto.

Figure 8:
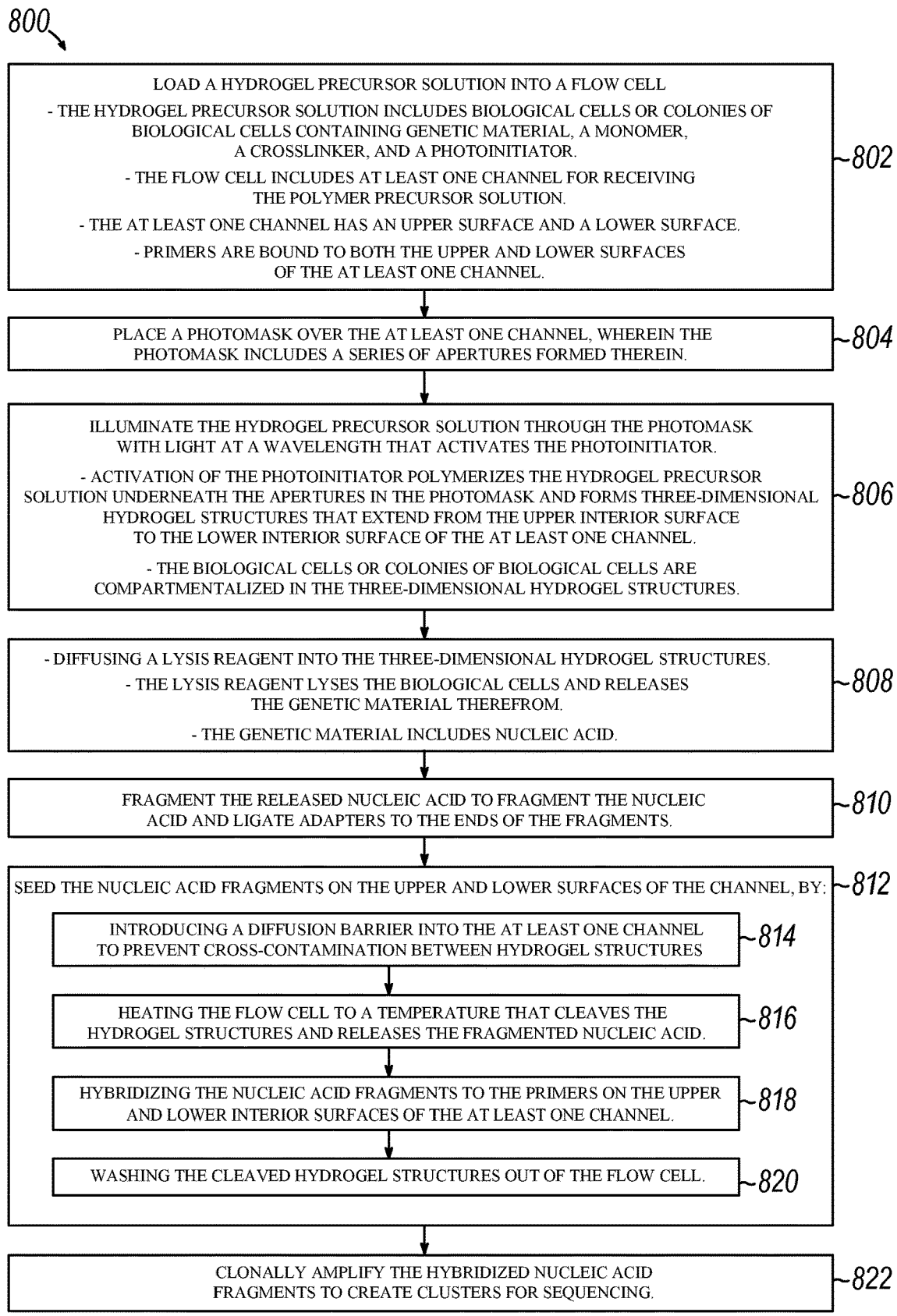
FIG. 8 is a flow chart depicting an example implementation of a method for sequencing library preparation using reversible, permeable three-dimensional hydrogel structures formed on a flow cell.

FIG. 8 is a flowchart depicting yet another example implementation of a method for making three-dimensional hydrogel structures on a flow cell. Method 800 includes loading a hydrogel precursor solution onto a flow cell at 802, wherein the hydrogel precursor solution includes biological cells or colonies of biological cells containing genetic material, a monomer, a crosslinker, and a photoinitiator, wherein the flow cell includes at least one channel for receiving the polymer precursor solution, wherein the at least one channel has an upper interior surface and a lower interior surface, and wherein primers are bound to both the upper and lower interior surfaces of the at least one channel; placing a photomask over the at least one channel at block 804, wherein the photomask includes a series of apertures formed therein; illuminating the hydrogel precursor solution through the photomask with light at a wavelength that activates the photoinitiator at block 806, wherein activation of the photoinitiator polymerizes the hydrogel precursor solution underneath the apertures in the photomask and forms three-dimensional hydrogel structures that extend from the upper interior surface to the lower interior surface of the at least one channel, and wherein the biological cells or colonies of biological cells are compartmentalized in the three-dimensional hydrogel structures; diffusing a lysis reagent into the three-dimensional hydrogel structures at block 808, wherein the lysis reagent lyses the biological cells and releases the genetic material therefrom, and wherein the genetic material includes nucleic acid; fragmenting the released nucleic acid and ligating adapters to the end of the nucleic acid fragments at block 810; seeding the nucleic acid fragments on the upper and lower surfaces of the channel at block 812 by introducing a diffusion barrier into the at least one channel to prevent cross-contamination between hydrogel structures at 814, heating the flow cell to a temperature that cleaves the hydrogel structures and releases the nucleic acid fragments at 816, hybridizing the nucleic acid fragments to the primers on the upper and lower interior surfaces of the at least one channel at 818, and washing the cleaved hydrogel structures out of the flow cell at 820; and clonally amplify the hybridized nucleic acid to create clusters for sequencing at block 822. In other implementations, the photomask is integrated with the flow cell rather than being placed on or attached thereto.

The methods and systems described herein provide certain benefits. Versions of the "spatial indexing" methods and techniques described herein shorten data analysis and simplify the process of library preparation from single cells and long DNA molecules. Existing protocols for single cell sequencing involve efficient physical separation of the cells and uniquely barcoding each isolated cell and pooling cells back together for sequencing. Current protocols for synthetic long reads also involve cumbersome barcoding, pooling barcoded fragments together for sequencing, and performing data analysis to distinguish genetic information derived from each barcoded cell. During these long processes, there is also loss of genetic material which causes dropouts in the nucleotide sequences. Versions described herein not only shorten the entire sequencing process but also increase data resolution for single cells.

The following non-limiting working examples are provided to illustrate particular features of certain examples, but the scope of the claims should not be limited to those features exemplified.

Example 1: On-Flow Cell Integration of Library Preparation from Genomic DNA

This example illustrates sequencing of genomic DNA trapped in hydrogel structures, wherein library preparation though sequencing is integrated and performed directly on a flow cell.

A hydrogel precursor solution of 10% T was prepared from a 40% (w/v) acrylamide/N,N'bis(acryloyl)cystamine (BA Cy) (19:1) monomer stock solution (3.8 g of acrylamide, 0.2 g of BACy, and 6 mL of double distilled (dd) H20), with 1 mg/mL of LAP photoinitiator and *E. coli* genomic DNA (0.008 ng/µL). Solution was introduced into a MiSeq™ flow cell and the flow cell was exposed to collimated UV light (OAI mask aligner, power in the range of ~30-40 mW/cm$^2$) through a chrome mask (HTA Photomasks) patterned with 200 µm circular features to form the hydrogel structures.

Precursor solution containing excess genomic DNA was washed out with PR-2. The flow cell was incubated with tagmentation enzyme solution for 15 minutes at 55° C., followed by a PR-2 wash and an incubation with Tagmentation Stop buffer (10 minutes at 37° C.). The flow cell was then washed with PR-2 and AMS-1 enzyme was incubated at 50° C. for 5 minutes. The library was denatured with an NaOH 0.1 M wash, followed by an HT-2 wash. The flow cell was incubated with HT-1 for 5 minutes and then loaded with mineral oil with surfactants and DTT (312.5 µL of mineral oil+4.5% Span 80, 0.4% Tween 20, and 0.05% Triton X-100 and 0.5 µL of 12 mg DTT/400 µL EtOH). Seeding was achieved by incubating flow cell at a temperature ramp of 60° C., 40° C. and 20° C.

The flow cell was then washed with HT-1 and the seeded library was extended with AMS-1 (50° C. for 5 minutes). Remaining hydrogel was then melted with CLM (40° C. for 5 minutes) and the flow cell was washed with PR-2. The flow cell was then inserted into a sequencer for bridge amplification (24 cycles) and sequencing. This method demonstrates that genomic DNA may be trapped within on-flow cell hydrogel structures and that library preparation and sequencing of the library may be performed directly on the flow cell.

Example 2: On-Flow Cell Integration of Library Preparation for Mini Metagenomic Sequencing The following example illustrates direct integration of microbial cell sequencing, from lysis and library preparation of microbes encapsulated in on-flow cell hydrogel structures, to seeding, clustering and sequencing of library molecules.

A hydrogel solution of 10% T was prepared from a 40% (w/v) acrylamide/N,N'bis(acryloyl)cystamine (BA Cy) (19:1) monomer stock solution (3.8 g of acrylamide, 0.2 g of BACy, and 6 mL of double distilled (dd) H20), with 1 mg/mL of LAP photoinitiator and 0.01 M Tris/HCl and a mix of 10 microbes (ZYMOMICS Microbial Community Standard D6300) and the solution was introduced into a MiSeq™ flow cell. The flow cell was exposed to collimated UV light (OAI mask aligner, power in the range of ~30-40 mW/cm$^2$) through a chrome mask (HTA Photomasks) patterned with 200 µm circular features to form the hydrogel structures.

Excess precursor solution was washed out with PR-2 and microbes are lysed using a ChargeSwitch gDNA mini bacteria kit (Thermo Fisher CS11301); a first incubation with lysozyme and lysostaphin, followed by a second incubation with proteinase K. The flow cell was washed with PR-2 and tagmentation enzyme solution was introduced and incubated at 55° C. for 15 minutes, followed by a PR-2 wash and an incubation with Tagmentation Stop buffer (10 minutes at 37° C.). The flow cell was then washed with PR-2 and AMS-1 enzyme was incubated at 50° C. for 5 minutes. Library was then denatured with an NaOH 0.1 M wash, followed by an HT-2 wash. The flow cell was incubated with HT-1 for 5 minutes, and then loaded with mineral oil with surfactants and DTT (312.5 µL of mineral oil+4.5% Span 80, 0.4% Tween 20, and 0.05% Triton X-100 and 0.5 µL of 12 mg DTT/400 µL EtOH). Seeding was achieved by incubating flow cell at a temperature ramp of 60° C., 40° C. and 20° C.

The flow cell was then washed with HT-1 and seeded library was extended with AMS-1 (50° C. for 5 minutes). Remaining hydrogel was then melted with CLM (40° C. for 5 minutes) and flow cell was washed with PR-2. The flow cell was then inserted into a sequencer for bridge amplification (24 cycles) and sequencing. This method demonstrates that microbes may be trapped within on-flow cell hydrogel structures and that genomic library preparation and sequencing of the library may be performed directly on the flow cell.

Example 3: On-Flow Cell Integration of Library Preparation from Mammalian Cells

The following example demonstrates on-flow cell encapsulation, lysis, library preparation and sequencing of genomic material from mammalian cells.

A hydrogel solution of 10% T was prepared from a 40% (w/v) acrylamide/N,N'bis(acryloyl)cystamine (BA Cy) (19:1) monomer stock solution (3.8 g of acrylamide, 0.2 g of BACy, and 6 mL of PBS), with 1 mg/mL of LAP photoinitiator and mammalian cells (GM12878 cells). The solution was introduced into a MiSeq™ flow cell and the flow cell was exposed to collimated UV light (OAI mask aligner, power in the range of ~30-40 mW/cm$^2$) through a chrome mask (HTA Photomasks) patterned with 200-500 µm circular features to form the hydrogel structures encapsulating the cells. The flow cell was then washed with PBS.

Cells are lysed with ChargeSwitch Lysis Buffer and proteinase K (10 minutes, 50° C.). The flow cell was washed with PR-2 and tagmentation enzyme solution was added to the flow cell (55° C. for 15 minutes) followed by a PR-2 wash and an incubation with Tagmentation Stop buffer (10 minutes at 37° C.). The flow cell was washed with PR-2 and AMS-1 enzyme was incubated at 50° C. for 5 minutes. The library was then denatured with an NaOH 0.1 M wash, followed by an HT-2 wash and an incubation with HT-1 for 5 minutes. The flow cell was loaded with mineral oil with surfactants and DTT (312.5 µL of mineral oil+4.5% Span 80, 0.4% Tween 20, and 0.05% Triton X-100 and 0.5 µL of 12 mg DTT/400 µL EtOH) and incubated at a temperature ramp of 60° C., 40° C. and 20° C.

The flow cell was washed with HT-1, followed by an incubation with AMS-1 (50° C. for 5 minutes). Any remaining hydrogel was cleaved with CLM (40° C. for 5 minutes) and the flow cell was washed with PR-2. The flow cell was inserted into a MiSeq™ sequencer for bridge amplification (24 cycles) and subsequent sequencing. This method demonstrates that mammalian cells may be trapped within on-flow cell hydrogel structures and that genomic library preparation and sequencing of the library may be performed directly on the flow cell.

Example 4: On-Flow Cell Integration of Amplicon Sequencing from Genomic DNA

This example illustrates on-flow cell integration of amplicon sequencing, wherein genomic DNA was encapsulated in hydrogel structures for subsequent amplification of target regions, addition of sequencing primers, seeding and sequencing.

Genomic DNA was encapsulated in hydrogel structures by first mixing genomic DNA with a hydrogel solution of 10% T was prepared from a 40% (w/v) acrylamide/N,N'bis (acryloyl)cystamine (BA Cy) (19:1) monomer stock solution (3.8 g of acrylamide, 0.2 g of BACy, and 6 mL of PBS), with 1 mg/mL of LAP photoinitiator. This hydrogel precursor solution was introduced into a MiSeq™ flow cell. The flow cell was exposed to collimated UV light (OAI mask aligner, power in the range of ~30-40 mW/cm$^2$) through a chrome mask (HTA Photomasks) patterned with 200 µm circular features, resulting in the formation of hydrogel pillars containing genomic DNA. Excess solution and DNA was washed out with PR-2.

10 µL of 1 µM oligo pair (forward and reverse primer pairs containing target sequence and Illumina adapter sequence overhang) was mixed with 25 µL of KAPA HiFi 2× mix (Roche) and 5 µL Resuspension Buffer and introduced into the flow cell. PCR was performed on a thermal cycler using the following program: 92° C. for 5 minutes, 25 cycles of: (i) 92° C. 30 seconds, (ii) 55° C. 30 seconds and (iii) 72° C. for 2 minutes, 72° C. for 5 minutes. The flow cell was then washed with PR-2.

Next, 8 cycles of PCR are run using the thermal cycler program described in the previous paragraph, this time with 5 µL of Nextera XT Primer 1, 5 µL of Nextera XT Primer 2, 25 µL KAPA HiFi 2× mix, 15 µL PCR grade water. The flow cell was then washed with PR-2.

Library molecules are denatured with an NaOH 0.1 M wash, followed by an HT-2 wash and an incubation with HT-1 for 5 minutes. The flow cell was loaded with mineral oil with surfactants and DTT (312.5 µL of mineral oil+4.5% Span 80, 0.4% Tween 20, and 0.05% Triton X-100 and 0.5 µL of 12 mg DTT/400 µL EtOH) and incubated at a temperature ramp of 60° C., 40° C. and 20° C. The flow cell was washed with HT-1, followed by an incubation with AMS-1 (50° C. for 5 minutes). Any remaining hydrogel was cleaved with CLM (40° C. for 5 minutes) and the flow cell was washed with PR-2. The flow cell was then inserted into a MiSeq™ sequencer for bridge amplification (24 cycles) and subsequent sequencing. This method demonstrates that genomic DNA may be encapsulated within on-flow cell hydrogel structures and that subsequent amplification of target regions, addition of sequencing primers, seeding and sequencing may be performed on the flow cell.

In the examples disclosed herein, each individual hydrogel structure contains a sequencing library produced from the genetic material or nucleic acid contained within the hydrogel structure. Accordingly, a sequencing library seeded from a single hydrogel structure corresponds to the nucleic acid that was encapsulated within that hydrogel structure. Because seeding occurs in close proximity to the footprint on the flow cell of each hydrogel structure, the seeded sequencing library from each structure is spatially segregated (or "indexed") on the flow cell based on the location of the structure.

III. Nucleic Acid Sequencing in Three Dimensions

As previously discussed, the operational throughput of current top-performing next-generation sequencing (NGS) platforms is determined by: (i) two-dimensional nucleic cluster density; and (ii) the overall size of the active surface area of the flow cell, both of which have already reached practical limits of manufacturing. Example implementations provide systems and methods for overcoming these limitations by expanding the surface upon which sequencing may occur from two dimensions to three dimensions, thereby providing a massive increase to sequencing flow cell throughput and data generation.

The increase to sequencing flow cell throughput and data generation is facilitated by filling a flow cell (or other item such as, for example, a capillary tube or a miniaturized cuvette) with materials or three-dimensional structures that occupy the entire volume of the flow cell and which support cluster formation at a desired density throughout the entire flow cell volume. Sequencing-by-synthesis or sequencing by another suitable method is then completed, with cluster identification and base calling occurring by optically interrogating a series of stacked two-dimensional slices throughout the flow cell. Example methods for sequentially imaging individual two dimensional slices throughout the flow cell include: (i) using a confocal microscope capable of focusing on discrete two-dimensional slices of the flow cell and repeatedly measuring the same two-dimensional planes; and (ii) using a light-sheet illumination microscope that can rapidly image three-dimensional volumes. In other implementations, multiphoton fluorescence (such as two-photon excited fluorescence (2PEF)) or another multiphoton imaging technique such as three-photon excitation fluorescence (3PEF) or multi-harmonic generation (MHG) is used for imaging the three-dimensional matrix. Multiphoton imaging is a confocal-like excitation modality with similar sectioning capabilities that involves the use of pulsed lasers, but typically at Near-Infrared (NIR) wavelengths, thereby greatly reducing potential photodamage to the matrix and its contents.

In example implementations, three-dimensional clusters are created throughout permeable hydrogel matrices, such as those described above, by using click chemistry to attach alkyne-linked capture primers (e.g., P5 and P7) to an acrylamide hydrogel matrix that includes poly(N-(5-azidoacetamidylpentyl) acrylamide-co-acrylamide) (PAZAM) containing azide moieties. The azide-alkyne click reaction involves the copper-catalyzed reaction of an azide with and alkyne to form a 5-membered heteroatom ring: a Cu(I)-catalyzed azide-alkyne cycloaddition (CuAAC). The azide-alkyne click reaction may be photoinitiated using Cu (II) and a photoinitiator system such as a Type II photoinitiator system, e.g., camphorquinone, which can use blue light at 470 nm as an excitation source. A sequencing library containing nucleic acid fragments with adapters ligated to the fragment is then diffused into the hydrogel matrix and is clustered by using cluster amplification, bridge amplification, or another suitable method. In some implementations, the nucleic acid fragments are circularized after the adapters are added to create nucleic acid "nanoballs". The permeability of the hydrogel allows for enzymes and other reagents to diffuse into the hydrogel and perform nucleic acid amplification. As discussed in greater detail below, the hydrogel matrix can be polymerized in various shapes and geometries, such as an array of pillars, posts, or linear trenches, for facilitating reagent exchange around the hydrogel matrix and rapid diffusion into and out of the hydrogel matrix.

Sequencing flow cells are provided with two types of oligonucleotides (e.g., P5 and P7), referred to in the alternative as grafting primers, capture primers, surface primers, or sequencing primers, bound to the upper and lower surfaces of the flow cell using hydrogel layers or other attachment methods. The sequences of these primers are complimentary to library adapters, and the fragments of a DNA library are captured by these oligonucleotides. As used herein, P5 and P7 refer to a universal P5 or P7 sequence or P5 or P7 primer for capture and/or amplification purposes. A P5 sequence comprises a sequence defined by SEQ ID NO: 1 (AATGATACGGCGACCACCGA) and a P7 sequence comprises a sequence defined by SEQ ID NO: 2 (CAAGCAGAAGACGGCATACGA).

Figure 9A:
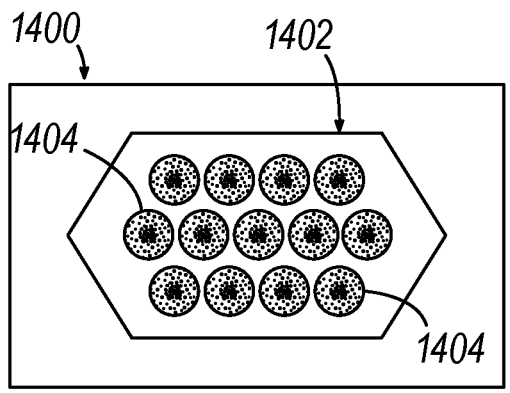
FIGS. 9A-9B depict a flow cell having an array of individual hydrogel pillars located inside the flow cell that were created using a photolithographic method, wherein the pillars contain P5/P7 primers and support the growth of clusters inside the hydrogel matrix.
Figure 9B:
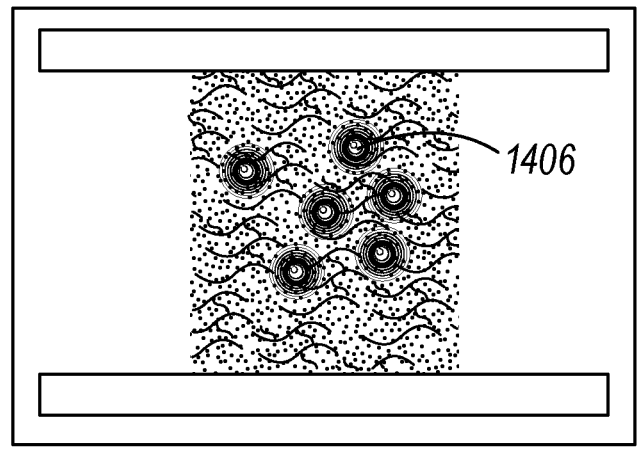
Figure 10A:
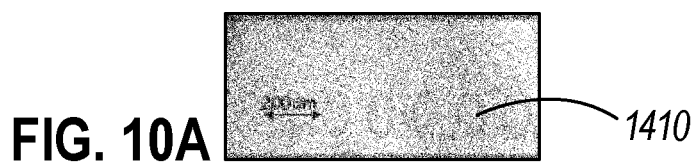
FIG. 10A depicts hydrogel pillars fabricated inside a MiSeq™ flow cell and FIGS. 10B-10K depict time-series images showing the introduction of a fluorescent dye into the flow cell, diffusion of the dye into hydrogel pillars, and the washing out of the dye from the hydrogel pillars.
Figure 10B:
Figure 10C:
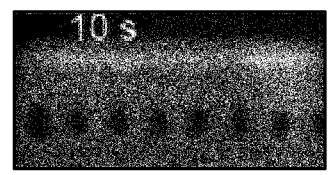
Figure 10D:
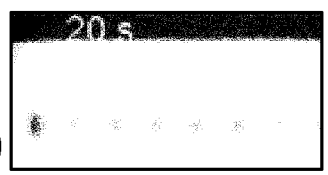
Figure 10E:
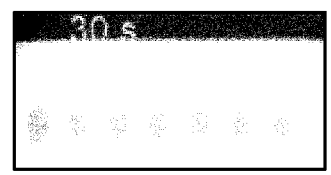
Figure 10F:
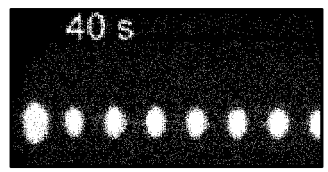
Figure 10G:
Figure 10H:
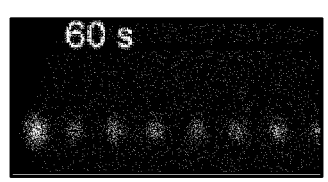
Figure 10I:
Figure 10J:
Figure 10K:

FIGS. 9A and 9B depict flow cell 1400, which includes an array 1402 of individual hydrogel pillars 1404 that are formed inside the flow cell using a photolithographic method such as that described above. The pillars contain P5/P7 primers and support the growth of clusters 1406 inside the hydrogel matrix. FIG. 10A depicts hydrogel pillars 1410 fabricated inside a MiSeq™ flow cell and FIGS. 10B-10F depict time-series images showing the introduction of a fluorescent dye into the flow cell, diffusion of the dye into hydrogel pillars, and the washing out of the dye from the hydrogel pillars. FIGS. 11-11B depict hydrogel beads 1412 doped with PAZAM containing P5/P7 primers. The beads are initially soaked with a sequencing library and then soaked in ExAmp to generate clusters throughout the three-dimensional volume of each bead. FIGS. 12A-12B depict index-free sequencing, wherein each hydrogel bead contains clusters (1420, 1422, 1424, 1426) from a sample in which it was incubated. Hydrogel beads containing such clusters are loaded on a flow cell and sequenced. The beads from each sample type can be distinguished from one another other using a variety of means such as, for example, fluorophores embedded in beads that are removed before sequencing.

FIG. 13A depicts sequencing flow cell 1430, wherein sequencing is occurring in a two-dimensional network of clusters on top interior surface 1440 and bottom interior surface 1450, and wherein top interior surface 1440 and bottom interior surface 1450 are separated by a known distance along the Z-axis (e.g., 100 μm). FIG. 13B depicts sequencing flow cell 1430, wherein sequencing is occurring in a three-dimensional network of clusters on top interior surface 1440 and bottom interior surface 1450 and in regions 1442, 1444, and 1446, which are located between top interior surface 1440 and bottom interior surface 1450, and wherein top interior surface 1440 and bottom interior surface 1450 are separated by a known distance along the Z-axis (e.g., 100 μm). Advantages and benefits of this example implementation over existing NGS systems and methods include: (i) enhancing the throughput of an individual flow cell by >50 fold; (ii) fabrication of high-throughput flow cells that do not involve X, Y translation of the optical system; (iii) more efficient consumption of sequencing reagents based on utilization of the entire flow cell volume, thereby reducing waste and improving the economic aspects of the sequencing process; and (iv) compatibility with most or all existing sequencing platforms. In some implementations, cluster locations are identified during first scans and assigned X,Y,Z coordinates for subsequent scans. Drift in the X and Y dimensions can be accounted for by using a 'reference cluster map' that is generated during the first scan. Herein, the terms X, Y, and Z, or X-axis, Y-axis, and Z-axis refer to the three-dimensional Cartesian coordinate system.

Throughput can be calculated for a given platform and flow cell size using the number of clusters per two-dimensional plane and the number of two-dimensional slices that can be imaged within the flow cell. The latter is specific to the optical detection system of a specific platform and depends on the optical section thickness (dz) along the Z dimension, which can be calculated using the following formula:

$$dz \cong \frac{0.64 \times \lambda_{em}}{n - \sqrt{n^2 - NA^2}} \quad (1)$$

wherein $\lambda_{em}$ is the wavelength of excitation, n is the refractive index of the sample, and NA is the numerical aperture. Calculated dz values obtained for a high and low numerical aperture (NA) platform are compiled in TABLE 1, below. Higher magnification objectives may have higher NA (i.e., wider angle for collection of information), which also means better resolution in Z (i.e., smaller dz values). In practice, the maximum resolution in Z is about 2× to 3× poorer than in the xy-dimension. Moreover, shorter wavelengths yield higher resolution.

TABLE 1

Calculated optical thickness (dz) values for a low and high NA platform.

| Platform | NA | n | λ (nm) | dz (μm) |
|---|---|---|---|---|
| NextSeq | 0.35 | 1.36 | 550 | 7.7 |
|  |  |  | 600 | 8.4 |
|  |  |  | 675 | 9.4 |
|  |  |  | 740 | 10.3 |
| HiSeq | 0.75 | 1.36 | 550 | 1.6 |
|  |  |  | 600 | 1.7 |
|  |  |  | 675 | 1.9 |
|  |  |  | 740 | 2.1 |

Using the dz values and the flow cell thickness, the number of optical sections (or individual two-dimensional slices) that are accessible for each flow cell and potential data output can be extrapolated (see TABLE 2, below). For example, the HiSeq™ system with an optical section thickness of about 2 μm may allow 50 individual 2D slices to be imaged, whereas the NextSeq™ system, having a larger dz of around 10 μm, may allow 10 optical sections. Using this three-dimensional sequencing strategy and assuming a constant cluster density in three-dimensions, the yield can be increased from 120 to 600 Gb for a NextSeq™ flow cell and from 1460 to 22500 Gb for a HiSeq™ flow cell. Even greater increases in data density are possible by using thicker flow-cells in order to maximize the space for cluster growth in three dimensions.

TABLE 2

Calculated data output for a low and high NA platform.

| Platform | dz (μm) | Interposer (μm) | 2D slices | Yield/2D slice (Gb) | Total yield (Gb) |
|---|---|---|---|---|---|
| NextSeq | 10 | 100 | 10 | 60 | 600 |
| HiSeq | 2 | 100 | 50 | 450 | 22500 |

Similar to confocal microscopy, selective-plane illumination microscopy (SPIM), also referred to as light-sheet microscopy, is an example optical microscopy method for imaging three-dimensional structures. There are multiple implementations for light-sheet microscopy, all of which employ a dual-objective configuration. The first objective, typically low-cost and low-NA, is used for excitation; and the second higher-NA objective is used for collection of fluorescence emission from the sample of interest (see FIG. 14). In this geometry, the lateral (XY) resolution of the system is determined by the collection optics, while the axial (Z) resolution is determined by the excitation objective and wavelength of excitation. This modality is routinely used to image live biological samples from cells to whole organisms up to several millimeters in size with micron-scale resolution at hundreds of images per second. FIG. 14 depicts an example SPIM setup 1460, wherein excitation is delivered using low-NA objective 1462 into sample 1464, and wherein the fluorescence emission is collected by high-NA emission objective 1466. The beam can be shaped with a cylindrical lens to simultaneously excite a full sheet of fluorophores or a single-line beam can be raster-scanned across the focal plane of the emission objective to create a full image. Subsequent translation of the sample by way of mechanical stage permits rapid volumetric imaging at high-resolution.

Figure 15:
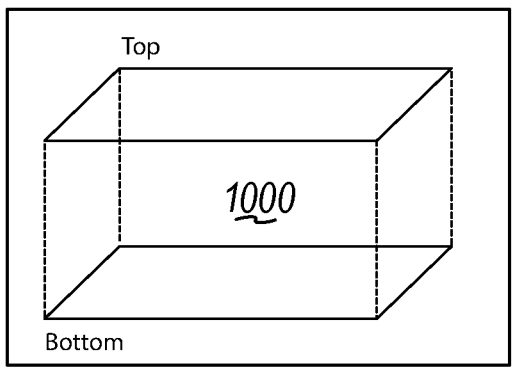
FIG. 15 depicts a large hydrogel network within a sequencing flow cell.
Figure 16:
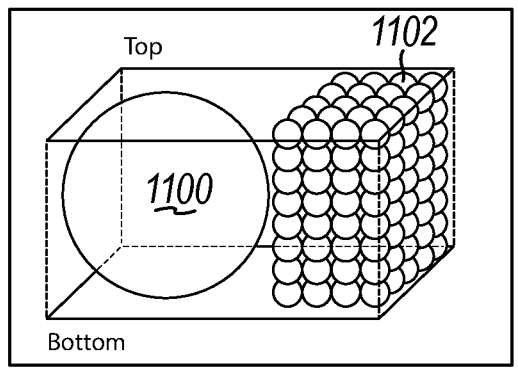
FIG. 16 depicts a matrix of large particles, small particles, or a combination of large and small particles within a sequencing flow cell.
Figure 17:
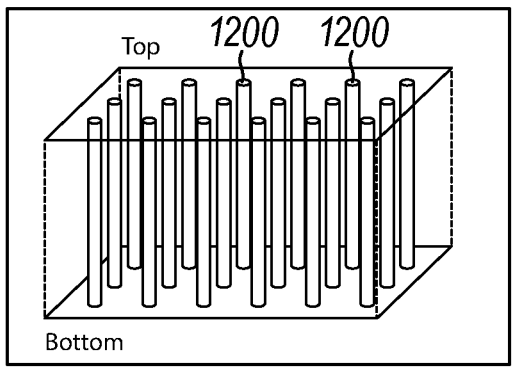
FIG. 17 depicts periodic columnar posts within a sequencing flow cell.
Figure 18:
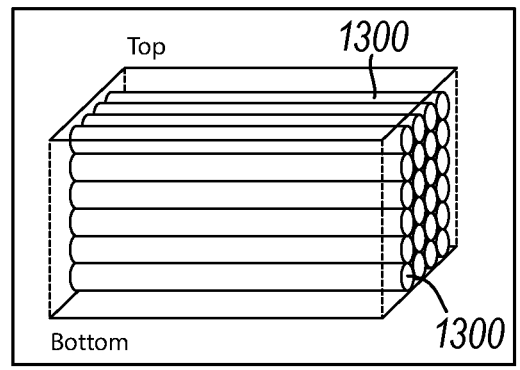
FIG. 18 depicts mesoporous crystalline materials within a sequencing flow cell.

As previously stated, the disclosed systems and methods provide materials and structures that occupy the entire volume of the flow cell and which support cluster formation and enable three-dimensional sequencing. Suitable materials: (i) occupy the entire height of the flow cell channel; (ii) permit the incorporation of oligonucleotides through various polymerization strategies or through the presence of useful functional groups (e.g., azides); (iii) have a controllable density of functional groups for controlling cluster density; (iv) support the flow of reagents with minimal diffusion gradients; and (v) support confocal microscopy throughout the depth of the flow cell with minimal scattering. Examples of suitable materials include hydrogel networks of a predetermined size; a matrix of large particles, small particles, or a combination of large and small particles (e.g., particles of the same size or particles of different sizes); periodic columnar posts; and mesoporous crystalline materials. FIG. 15 depicts a large hydrogel network 1000 within a sequencing flow cell; FIG. 16 depicts a matrix of large particles 1100, small particles 1102, or a combination of large particles 1100 and small particles 1102 within a sequencing flow cell; FIG. 17 depicts periodic columnar posts 1200 within a sequencing flow cell; and FIG. 18 depicts mesoporous or microporous crystalline materials 1300 within a sequencing flow cell. In some implementations, a three-dimensional matrix may be created from silk fibroin or polymer fibers such as, for example, cellulose/cellulosics and constructions thereof (e.g., as paper) upon which clusters may be formed.

Figure 19A:
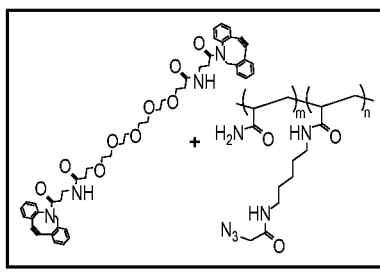
FIGS. 19A-19D depict an example implementation of a method for forming a hydrogel within a flow cell by polymerization of PAZAM+di-DBCO-PEG.
Figure 19B:
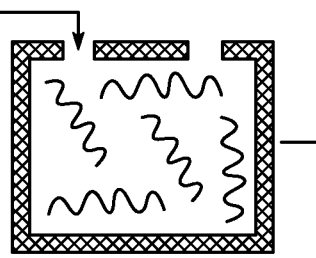
Figure 19C:
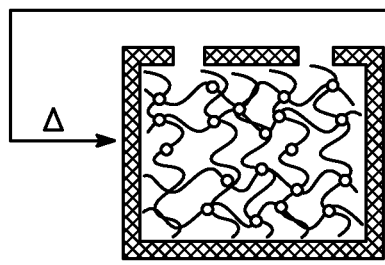
Figure 19D:
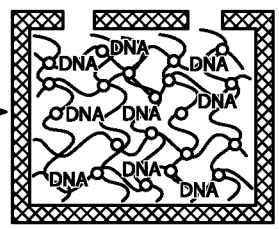

A large hydrogel network such as that shown in FIG. 15 may be constructed by polymerizing a functional hydrogel within a flow cell, thereby creating a continuous polymer network with evenly distributed functional groups that support cluster formation. In one implementation, PAZAM is reacted with DBCO-functionalized PEG. The density of the network may be controlled by adjusting the concentration of PAZAM and the relative concentrations of PAZAM:DBCO-PEG to optimize the density of functional groups and the diffusion characteristics of the hydrogel. This method uses the soft polymeric network as a three-dimensional scaffold with nucleic acid anchor points that define where clusters are located within the hydrogel matrix. FIGS. 19A-14D depict an example implementation of a method for forming a hydrogel within a flow cell by polymerization of PAZAM+ di-DBCO-PEG.

A three-dimensional matrix of solid or porous particles such as that shown in FIG. 16 provides a robust network where sequencing reactions occur on the surface of the particles or inside the particles and diffusion of reagents occurs in the interstitial areas between particles. Clusters are located on the surface of the particles or throughout the particles. In this implementation, the particles are designed to provide optimal surface area, modulus, and optical transparency. Examples include porous hydrogel beads (e.g., acrylamide gels), solid polymer particles (e.g., polystyrene), polymer core-shells, and inorganic materials (e.g., silica particles); all bearing grafting primers on their surfaces and/or throughout their three-dimensional structures.

Figure 20:
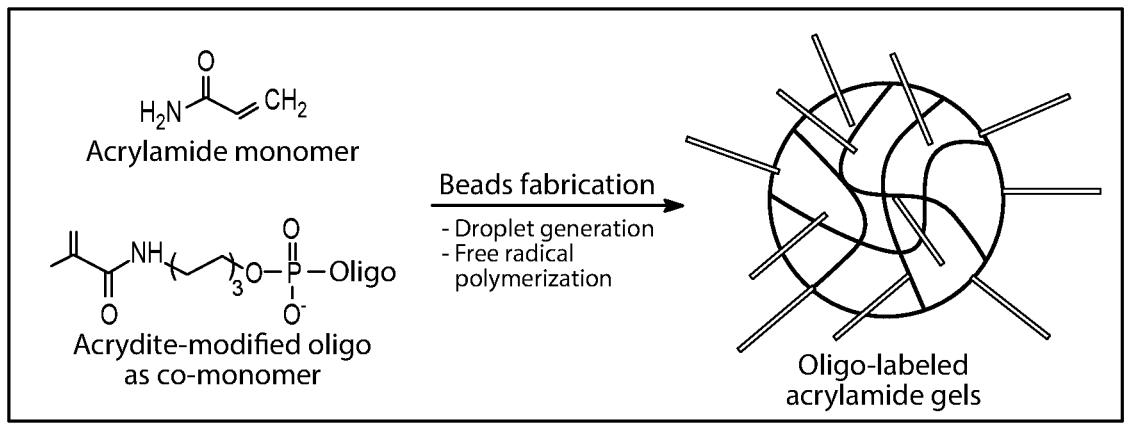
FIG. 20 depicts the copolymerization of acrylamide and acrydite-modified oligos into large polyacrylamide beads.
Figure 21A:
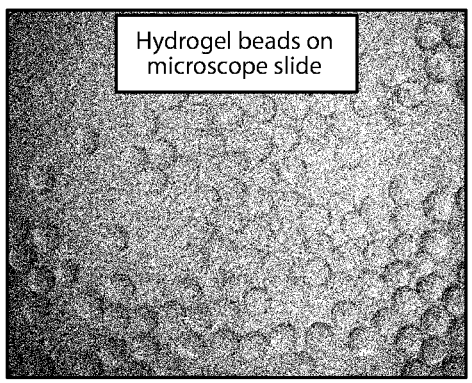
FIG. 21A is a brightfield microscopic image depicting hydrogel beads on a glass slide.
Figure 21B:
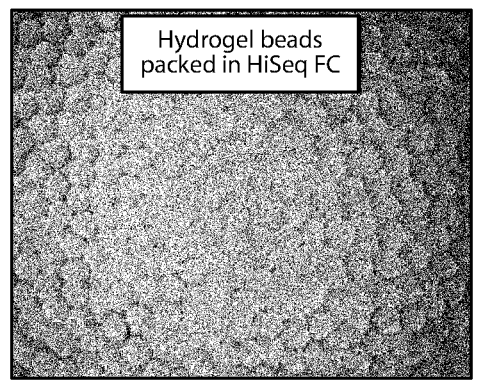
FIG. 21B is a brightfield microscopic image depicting hydrogel beads packed inside a HiSeq™ flow cell.
Figure 22A:
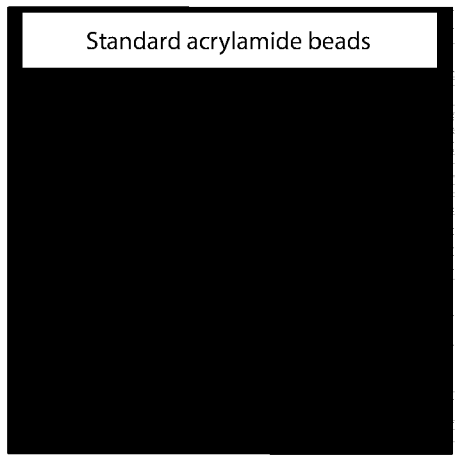
FIG. 22A is a fluorescence microscopic image of standard acrylamide beads after incubation with a dye-labeled complementary strand.
Figure 22B:
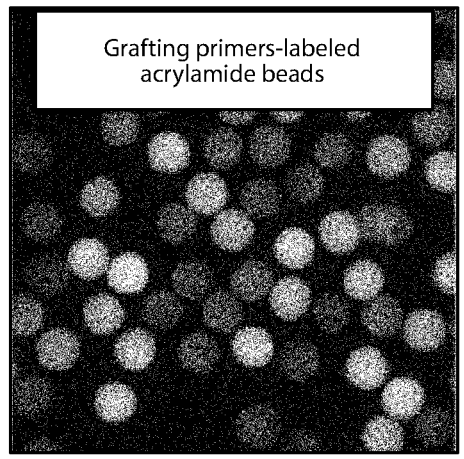
FIG. 22B is a fluorescence microscopic image of oligo-modified acrylamide beads after incubation with a dye-labeled complementary strand.

With reference to FIG. 20, in an example implementation, oligo-bearing hydrogel beads were fabricated using simple droplet generation combined with copolymerization of acrylamide and acrydite-modified oligos (commercially available from Integrated DNA Technologies, Inc.). FIG. 20 depicts the copolymerization of acrylamide and acrydite-modified oligos into large polyacrylamide beads. Because the hydrogel beads are slightly larger in size (~120 μm) than the height between the top surface and bottom surface of a typical flow cell (e.g., 100 μm), hydrogel beads can be tightly packed and trapped inside flow cell lanes without any form of chemical attachment thereto. FIG. 21A is a brightfield microscopic image depicting hydrogel beads on a glass slide; and FIG. 21B is a brightfield microscopic image depicting hydrogel beads packed inside a HiSeq™ flow cell. To demonstrate that reagents can readily diffuse into and out of porous hydrogel beads fabricated by the disclosed methods, a dye-labeled complementary strand was hybridized to the oligo-labeled acrylamide beads for detecting fluorescence throughout the entire hydrogel matrix. The control standard acrylamide beads, which were not grafted with oligos, did not show a fluorescence signal upon incubation with the complementary dye-labeled strand, thereby confirming that the signal detected for the oligo-modified acrylamide beads was driven by hybridization and that oligos could be retained within the beads without the presence of hydrogel-bounded complementary strands. FIG. 22A is a fluorescence microscopic image of standard acrylamide beads after incubation with a dye-labeled complementary strand; and FIG. 17B is fluorescence microscopic image of oligo-modified acrylamide beads after incubation with a dye-labeled complementary strand.

This implementation is easily transformable into a simple method for executing long reads, wherein the hydrogel beads bearing grafting primers encapsulate long DNA library fragments (~100 kb) and act as a reaction vessel for enzymatic processes such as, for example, tagmentation, ligation, and clustering to create unique spatially-isolated clusters of linked reads. Internally tagmented and ligated DNA fragments bind to P5 and P7 primers distributed within the hydrogel beads to allow bridge amplification-assisted cluster formation throughout the entire three-dimensional hydrogel structure, and formation of a unique spatial barcode. FIG. 23A depicts hydrogel beads in which long DNA fragments have been encapsulated trapped within a flow cell; FIG. 23B depicts enzymatic processes for library preparation occurring within the trapped hydrogel beads of FIG. 23A; and FIG. 23C depicts an amplified library generating clusters of linked reads distributed in three-dimensions within each hydrogel bead.

Certain implementations utilizing three-dimensional matrices of solid or porous particles include particles having complex physical and chemical structures outside of a flow cell that are directed into the flow cell and immobilized therein by crosslinking. Clonal amplification of nucleic acid libraries may occur initially on the beads outside of the flow cell, and the beads are then directed into the flow cell in an aqueous solution containing hydrogel precursors such as those previously described. The hydrogel precursors are then crosslinked using previously described methods to create a scaffold within the flow cell. FIG. 24A depicts template capture and extension occurring on hydrogel beads bearing oligonucleotides; and FIG. 24B depicts clonal amplification of library inserts on the hydrogel beads for creating clusters. FIG. 25A depicts clustered beads delivered into a flow cell in a hydrogel precursor solution; and FIG. 25B depicts immobilization of the clustered beads within a crosslinked hydrogel matrix to preserve the spatial locations of the beads in three dimensions during sequencing and subsequent imaging.

Figure 26:
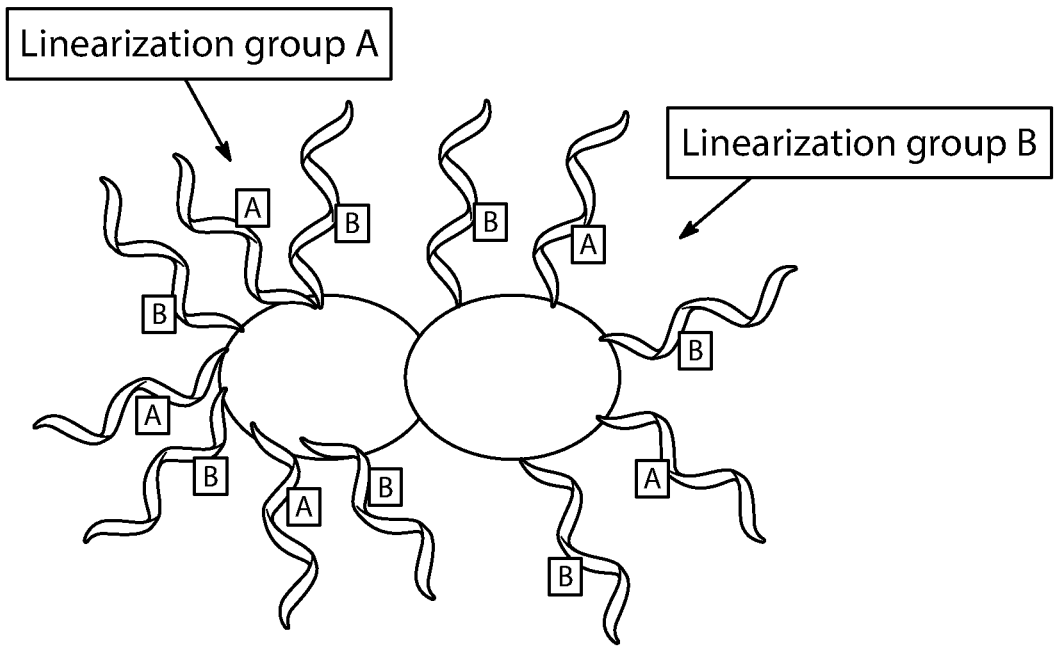
FIG. 26 depicts dimer particles having different orthogonal linearization chemistries.
Figure 27:
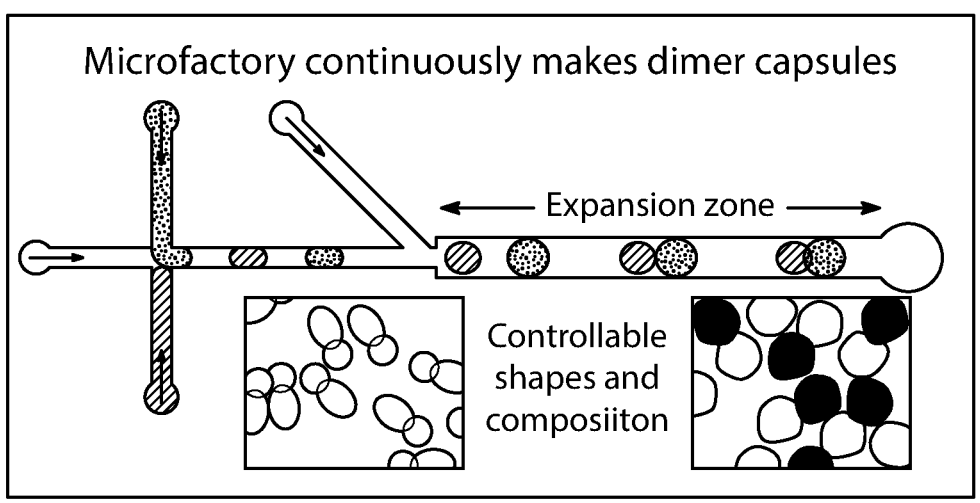
FIG. 27 depicts an example system for synthesizing similar dimer particles.

By using external hydrogel bead preparation, spatially co-localized regions of orthogonal linearization chemistries can be prepared in solution by utilizing specific bead design. Such beads may then be delivered into the flow cell and used for simultaneous forward/reverse strand sequencing in three dimensions. This is achieved using hydrogel particles possessing spatially segregated oligo primers having unique linearization chemistries. Particle dimers having different surface chemistries have been demonstrated using continuous flow reactions, where pre-particles are synthesized and functionalized before dimerization. Dimer particles may be used for spatially linked forward and reverse reads in three dimensions. FIG. 26 depicts dimer particles having different orthogonal linearization chemistries; and FIG. 27 depicts a prior art system for synthesizing similar dimer particles.

Some implementations of the disclosed systems and methods provide functional three-dimensional scaffolds by utilizing columnar posts that extend vertically from bottom of a flow cell to the top of the flow cell, such as those depicted in FIG. 17. These columnar posts may be fabricated using top-down microfabrication techniques such as, for example, photolithography; thin film deposition; and selective etching. The surfaces of the posts can be functionalized using previously described methods that include PAZAM, for providing a rigid network of chemically active columns while permitting liquid flow and chemical diffusion to occur throughout interstitial areas between the posts. Certain implementations utilize columns that are fabricated to have alternating material composition in the Z-direction. Such posts may be selectively functionalized on the surface of one of the two materials, thereby permitting control of cluster spatial distribution in the Z-direction for limiting multiclonality and aiding optical imaging. The manifold of Z-slices for optical interrogation is spatially organized in a systematic fashion in this implementation. FIGS. 28A and 28B depict spatial control of clusters in three dimensions using a three-dimensional matrix of columnar posts having alternating material composition in the Z-direction.

Some implementations utilize microporous crystalline materials for creating on-flow cell scaffolds such as that depicted in FIG. 18. Microporous crystalline materials possess well-defined structures that include pores that are ordered and aligned in one direction. Thus, these materials essentially provide multiplexed fluidic channels, with each pore representing a single fluidic channel. The surfaces of many porous materials can be functionalized; therefore, a microporous material with aligned pores can function as a matrix for three-dimensional sequencing with chemical reactions occurring on the walls of the pores. With reference to FIG. 18, both the direction of fluidic flow and optical imaging occurs in the Z-direction, as viewed down the long axis of the pore. Microporous silicon is one example of a material that can be fabricated to have pre-oriented pores of controlled size. Lateral dimensions and thickness of microporous silicon films are easily controlled by selecting a precursor wafer, and flow cells may be prepared by mounting microporous silicon films onto a separate fluidic cell.

Some implementations utilize polymer scaffolds for on-flow cell sequencing in three-dimensions. FIGS. 29A-29D depict a simplified example method for creating a polymer scaffold, wherein an unpolymerized monomer solution is embedded with salt particles having a predetermined size distribution. The salt particles displace the monomer, thereby creating a three-dimensional network within the solution. The monomer solution is polymerized to form a three-dimensional polymer scaffold around the salt particles and the salt particles are dissolved, resulting in a random, three-dimensional array of pores, which define the scaffold. Such scaffolds may be activated and coated with a hydrogel such as PAZAM. Although such scaffolds are not necessarily equally spaced, multilayer structures such as those previously described, a suitable imaging strategy would image the entire scaffold, and image processing would then be used to identify different clusters. The salt particles used in this example implementation may be spiked with passivated metal particles. After dissolving the salt particles, these particles would remain in the scaffold in fixed locations. During imaging, these particles can be used to provide points to which clusters may be aligned, thereby essentially acting as fiducials.

Figure 30:
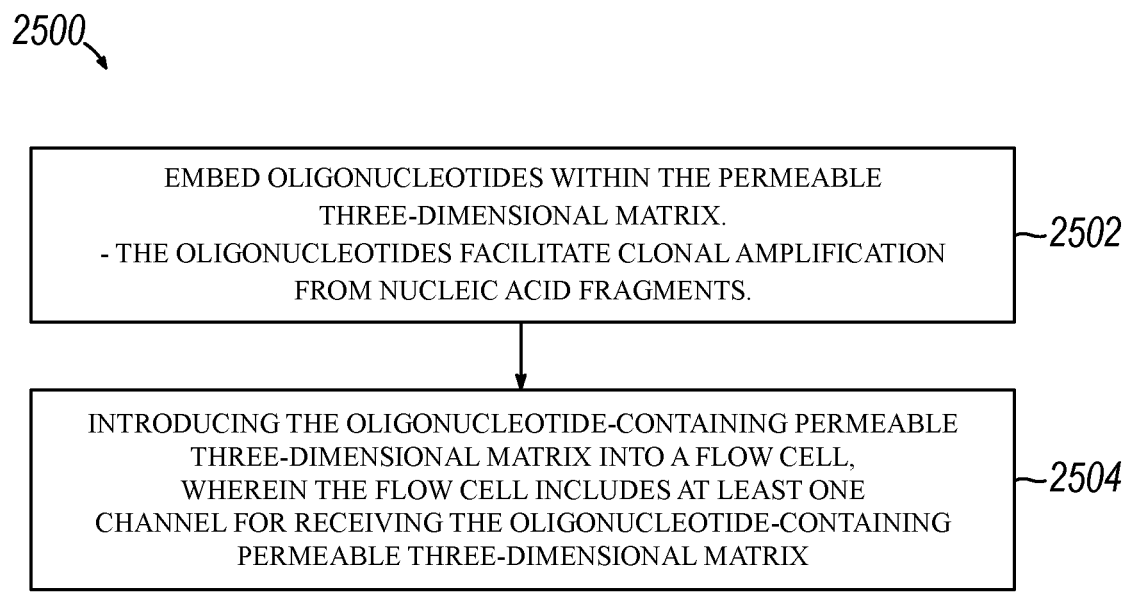
FIG. 30 is a flow chart depicting an example method for making a permeable three-dimensional matrix on a sequencing flow cell.

FIG. 30 is a flow chart depicting an example method for making a permeable three-dimensional matrix on a flow cell. Method 2500 comprises embedding oligonucleotides within the permeable three-dimensional matrix at block 2502; and introducing the oligonucleotide-containing permeable three-dimensional matrix into a flow cell at block 2504, wherein the flow cell includes at least one channel for receiving the oligonucleotide-containing permeable three-dimensional matrix.

Figure 31:
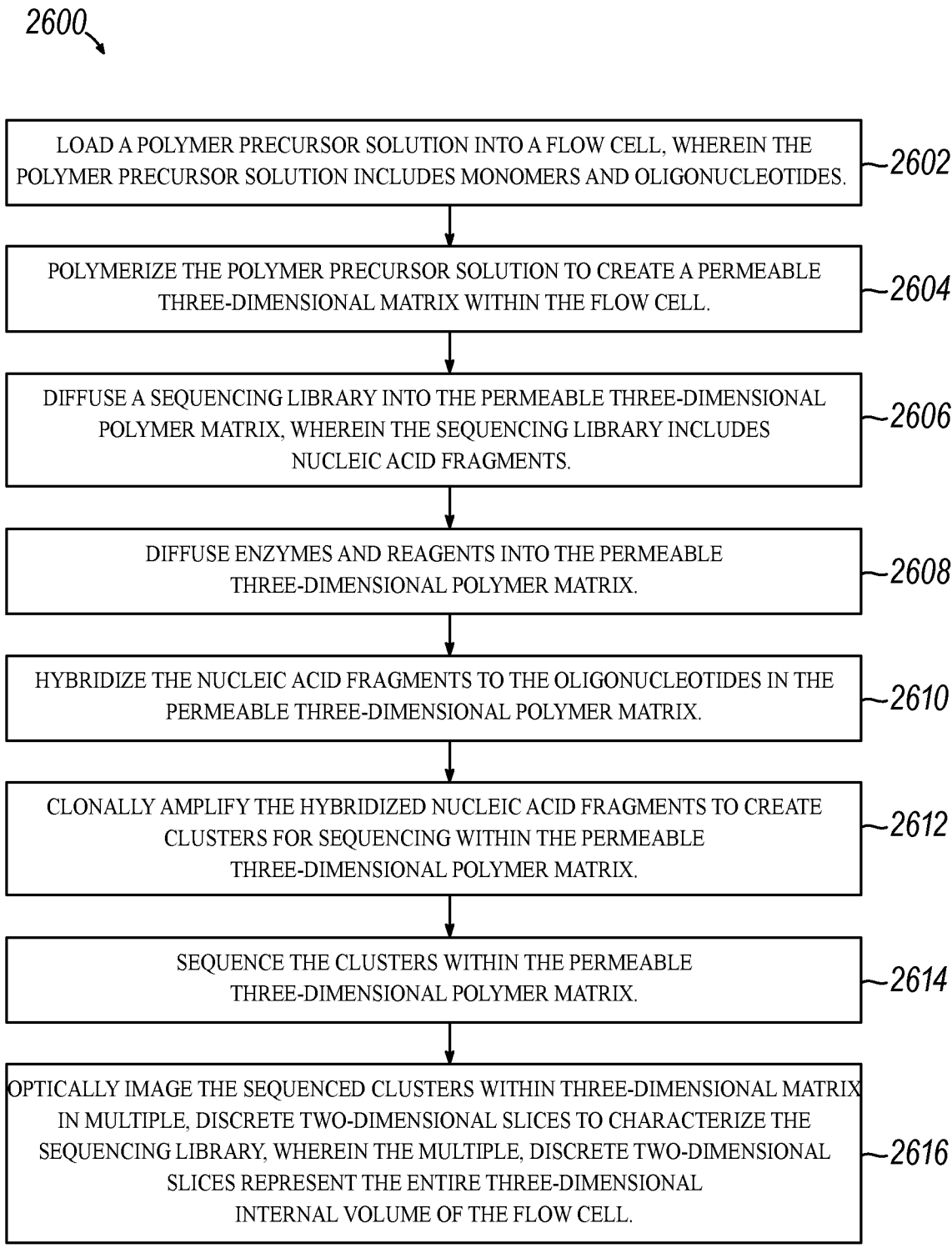
FIG. 31 is a flow chart depicting a first example method for nucleic acid library sequencing in three-dimensions.

FIG. 31 is a flow chart depicting a first example method for nucleic acid library sequencing in three-dimensions. Method 2600 comprises loading a polymer precursor solution into a flow cell at block 2602, wherein the polymer precursor solution includes monomers and oligonucleotides; polymerizing the polymer precursor solution to create a permeable three-dimensional matrix within the flow cell at block 2604; diffusing a sequencing library into the permeable three-dimensional polymer matrix at block 2606, wherein the sequencing library includes nucleic acid fragments; diffusing enzymes and reagents into the permeable three-dimensional polymer matrix at block 2608; hybridizing the nucleic acid fragments to the oligonucleotides in the permeable three-dimensional polymer matrix at block 2610; clonally amplifying the hybridized nucleic acid fragments to create clusters for sequencing within the permeable three-dimensional polymer matrix at block 2612; sequencing the clusters within the permeable three-dimensional polymer matrix at block 2614; and optically imaging the sequenced clusters within three-dimensional matrix in multiple, discrete two-dimensional slices to characterize the sequencing library at block 2614, wherein the multiple, discrete two-dimensional slices represent the entire three-dimensional internal volume of the flow cell.

Figure 32:
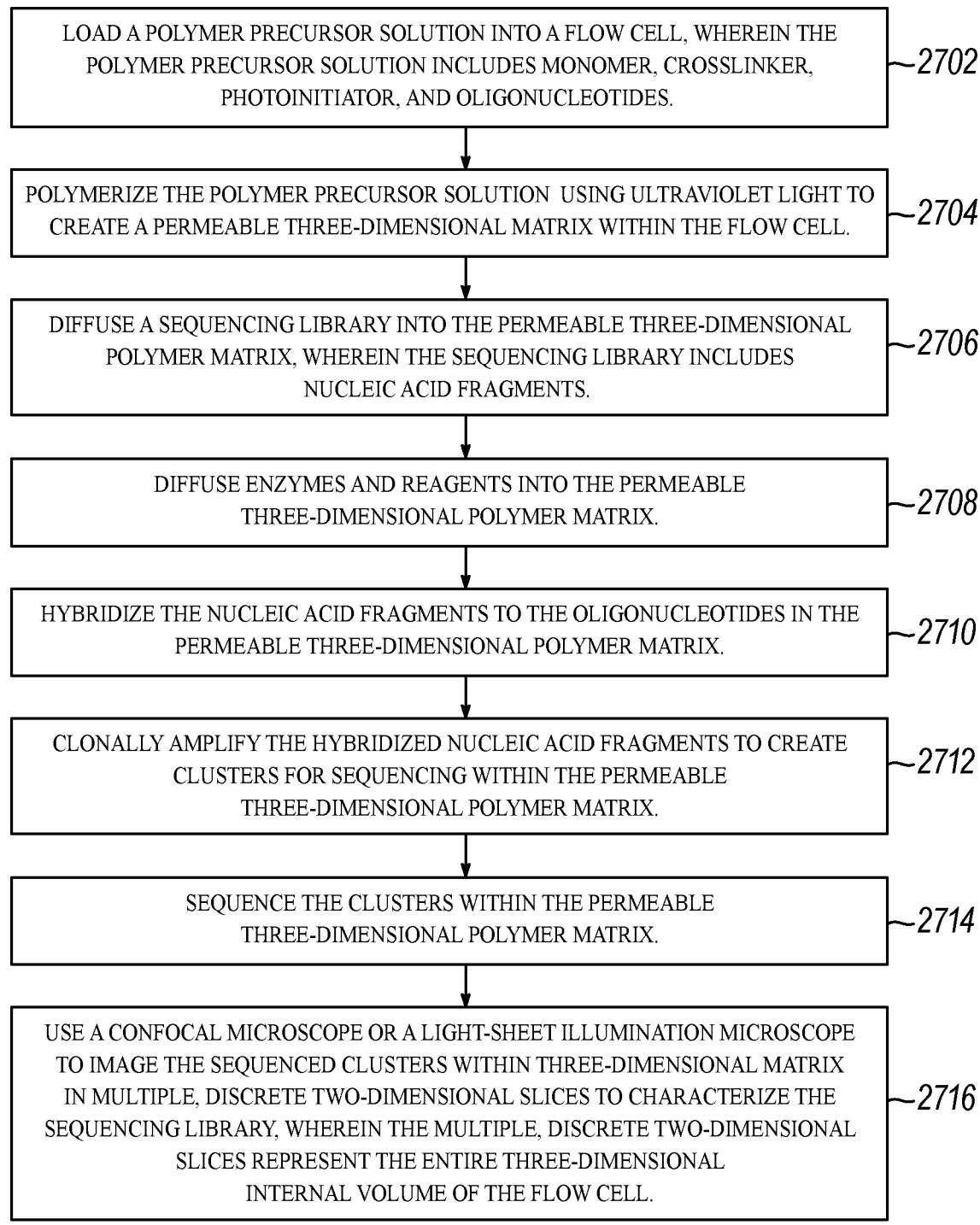
FIG. 32 is a flow chart depicting a second example method for nucleic acid library sequencing in three-dimensions.

FIG. 32 is a flow chart depicting a second example method for nucleic acid library sequencing in three-dimensions. Method 2700 comprises loading a polymer precursor solution into a flow cell at block 2702, wherein the polymer precursor solution includes monomer, crosslinker, photoinitiator, and oligonucleotides; polymerizing the polymer precursor solution using ultraviolet light to create a permeable three-dimensional matrix within the flow cell at block 2604; diffusing a sequencing library into the permeable three-dimensional polymer matrix at block 2606, wherein the sequencing library includes nucleic acid fragments; diffusing enzymes and reagents into the permeable three-dimensional polymer matrix at block 2608; hybridizing the nucleic acid fragments to the oligonucleotides in the permeable three-dimensional polymer matrix at block 2610; clonally amplifying the hybridized nucleic acid fragments to create clusters for sequencing within the permeable three-dimensional polymer matrix at block 2612; sequencing the clusters within the permeable three-dimensional polymer matrix at block 2614; and using a confocal microscope or a light-sheet illumination microscope to image the sequenced clusters within three-dimensional matrix in multiple, discrete two-dimensional slices to characterize the sequencing library at block 2616, wherein the multiple, discrete two-dimensional slices represent the entire three-dimensional internal volume of the flow cell.

IV. Functionalization of Hydrogel Structures on Flow Cell

Various implementations of the disclosed systems, devices, and methods may be used to create reversible hydrogel structures within the fluidics channels on flow cells that may be used for introducing temporary functional surfaces within the flow cell, in addition to pre-existing sequencing surfaces. These temporary functional surfaces may be used for multiple applications including, for example, (i) target DNA enrichment; (ii) clustered regularly interspaced short palindromic repeats (CRISPR) screening; and (iii) highly multiplexed screening applications using DNA conjugated antigens. Using methods disclosed herein (including those discussed above) on-flow cell hydrogel micro-pillars decorated with streptavidin moieties are fabricated. As discussed in greater detail below, biotinylated capture oligonucleotides bind to streptavidin and immobilize target library molecules to the hydrogel structures for on-flow cell library enrichment. Similarly, proteins and oligonucleotides can be attached to the hydrogel pillars using biotin-streptavidin linkage for enabling of variety of other screening processes such as CRISPR screening. Disclosed implementations provide a much greater surface area for binding reactions due to the porous nature of hydrogels and permit screening of the entire volume of a flow cell for binding events, rather than just the surface, thereby resulting in higher binding capacity and reaction rates.

Figure 33:
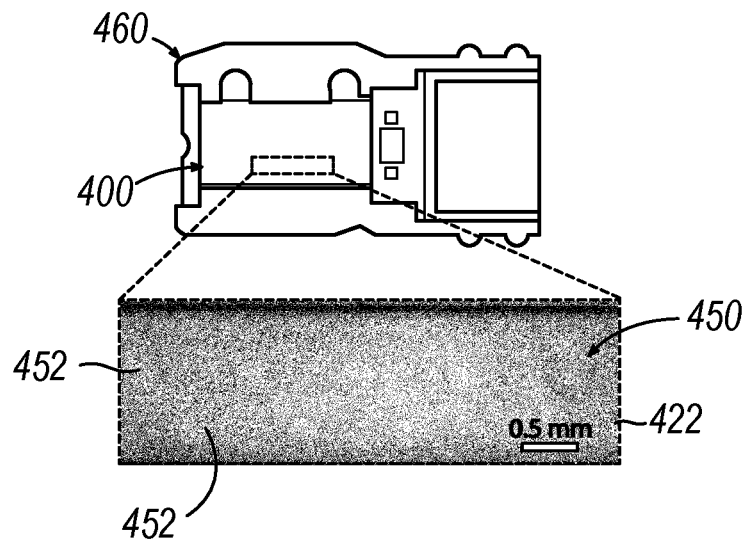
FIG. 33 depicts the formation of hydrogel micropillars on a channel within a flow cell, wherein individual hydrogel micropillars are visible in the bright field micrograph.
Figures 34A, 34B, 34C:
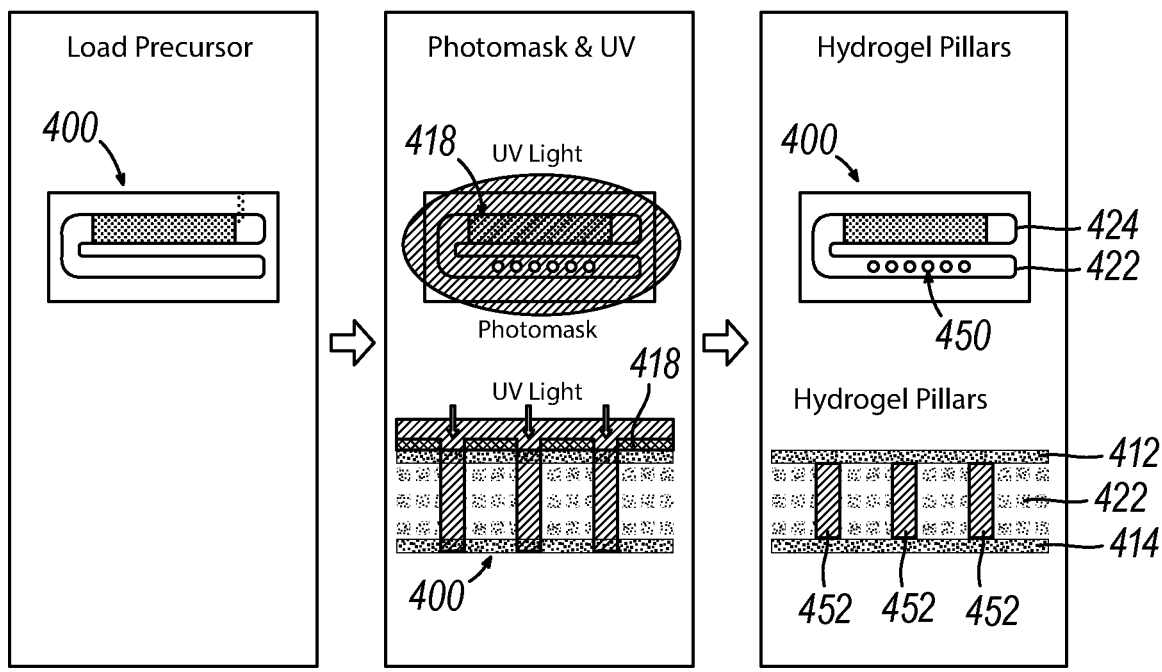
FIG. 34A depicts an example method for on-flow cell fabrication of hydrogel micropillars, wherein hydrogel precursor solution that includes monomers and photo-initiator is introduced into a flow cell.
FIG. 34B depicts an example method for on-flow cell fabrication of hydrogel micropillars, wherein a prepatterned photomask is placed on the flow cell of FIG. 34A and illuminated with ultraviolet light.
FIG. 34C depicts an example method for on-flow cell fabrication of hydrogel micropillars, wherein hydrogel micropillars are formed on the flow cell of FIG. 34A, and wherein the hydrogel micropillars are attached to the upper and lower surfaces of one of the channels in the flow cell.

An example implementation is shown in FIG. 33, which depicts the formation of hydrogel micropillars on a channel within a flow cell using the previously described method for on-flow fabrication of hydrogel microstructures. In FIG. 33, flow cell 400 is shown inserted into cartridge 460. An array 450 of individual hydrogel micropillars 452 have been formed within channel 422 and are visible in the bright field micrograph at the bottom of FIG. 33. In an example implementation, hydrogel micropillars 452 are created by co-polymerization of acrylamide monomer and N,N'-bis(acryloyl)cystamine crosslinker. Control of spatial patterning is accomplished using photo-initiator lithium phenyl-2,4,6-trimethylbenzoylphosphinate (LAP) to initiate the polymerization reaction by directing ultraviolet light through a photomask that has been positioned on flow cell 400 above channel 422. FIGS. 34A-34C depict on-flow cell fabrication of hydrogel micropillars 452, wherein hydrogel precursor solution that includes acrylamide and crosslinker monomers and photo-initiator is introduced into flow cell 400 (FIG. 34A) and then exposed to UV light through photomask 418 (FIG. 34B) which has been pre-patterned with desired features (e.g., apertures having a particular geometry) to form hydrogel pillars (FIG. 34C). In FIGS. 34A-34C flow cell 400 includes narrow channel 422 in which hydrogel micropillars 452 are formed and wide channel 424. Hydrogel micropillars 452 are attached to both upper surface 412 and lower surface 414 of narrow channel 422.

Flow cell 400 is provided with two types of oligonucleotides (e.g., P5 and P7), referred to as surface primers or sequencing primers, bound to the upper and lower surfaces of the flow cell. The sequences of these surface primers are complimentary to library adapters, and the fragments of a DNA library are captured by these oligonucleotides. As used herein, P5 and P7 refer to a universal P5 or P7 sequence or P5 or P7 primer for capture and/or amplification purposes. A P5 sequence comprises a sequence defined by SEQ ID NO: 1 (AATGATACGGCGACCACCGA) and a P7 sequence comprises a sequence defined by SEQ ID NO: 2 (CAAGCAGAAGACGGCATACGA).

Example 5: PAZAM-Conjugated Biotin

In the example implementation shown in FIGS. 35A-6E, functionalized reversible hydrogel structures were formed within a channel on a flow cell by utilizing poly(N-(5-azidoacetamidylpentyl) acrylamide-co-acrylamide) (PAZAM) into which azide moieties have been incorporated; and the azide-alkyne click reaction. The azide-alkyne click reaction involves the copper-catalyzed reaction of an azide with and alkyne to form a 5-membered heteroatom ring: a Cu(I)-catalyzed azide-alkyne cycloaddition (CuAAC). The azide-alkyne click reaction may be photoinitiated using Cu (II) and a photoinitiator system such as a Type II photoinitiator system, e.g., camphorquinone, which can use blue light at 470 nm as an excitation source.

In this example implementation, hydrogel micropillars are first fabricated within a MiSeq™ flow cell (or any other suitable flow cell) using UV-mediated co-polymerization of acrylamide, crosslinker, and PAZAM into which azide moieties have been incorporated. A biotin-polyethylene glycol (PEG)-alkyne complex is then clicked onto the azide moieties of the PAZAM and used to bind streptavidin. The multiple binding sites of streptavidin then allow the immobilized streptavidin to immobilize oligo capture probes, which in turn hybridize to sequencing library molecules of interest that are introduced into the flow cell. Any non-hybridized library fragments are washed out of the flow cell. Bound sequencing library fragments are then eluted from hydrogel micropillars located in the narrow channel (non-sequencing area) of the flow cell and seeded in the wide channel (sequencing area) of the flow cell in preparation for amplification, clustering, and sequencing-by-synthesis or sequencing by another method.

FIGS. 35A-35E depict an example implementation of a method for fabricating functionalized hydrogel structures on a flow cell. In FIG. 35A, a hydrogel precursor solution containing 10% polyacrylamide (PA), crosslinker, and 0.25% PAZAM into which azide moieties have been incorporated is loaded onto flow cell 400. In FIG. 35A, flow cell 400 is a MiSeq™ flow cell having both a narrow channel 422 and a wide channel 424. In FIG. 35B, photomask 418, which includes a plurality of 200 µm apertures formed therein, is placed on top of flow cell 400, which is then exposed to UV light for 10 seconds to co-polymerize the acrylamide and PAZAM and form an array 450 of azide-functionalized hydrogel micropillars 452 in narrow channel 422. In FIG. 35C, 5 µM biotin-PEG-alkyne is clicked onto the azide moieties during Blackpool incubation. In FIG. 35D, streptavidin labeled with Fluorescein (1:500) binds the biotin in hydrogel micropillars 452. In FIG. 35E, the streptavidin binds biotinylated capture oligonucleotides to enable immobilization of target sequencing library molecules that have been tagged during library preparation with sequences complementary to the sequences of the capture oligonucleotides.

Figure 36A:
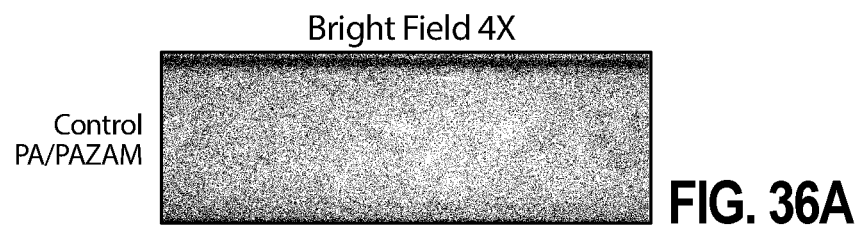
FIG. 36A depicts a 4× bright field micrograph of PA/PAZAM control (no biotin)
Figure 36B:
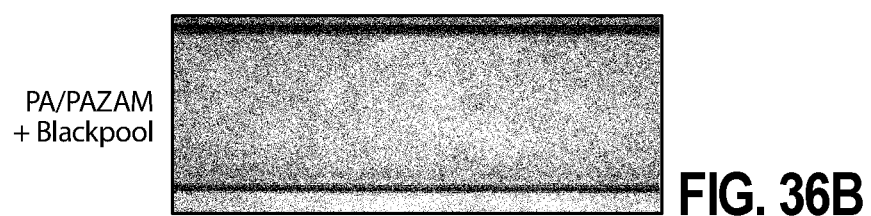
FIG. 36B depicts a 4× bright field micrograph of PA/PAZAM plus Blackpool.
Figure 36C:
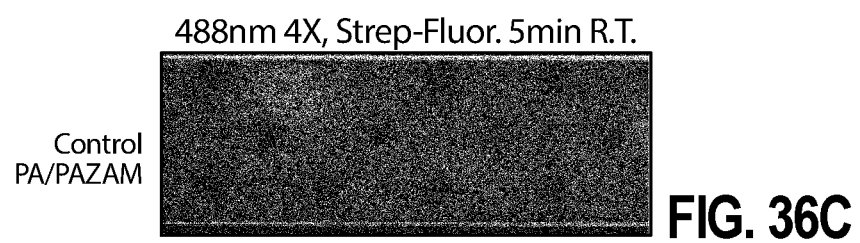
FIG. 36C depicts a 4× fluorescence micrograph of PA/PAZAM control (no biotin) after a reaction time of five minutes.
Figure 36D:
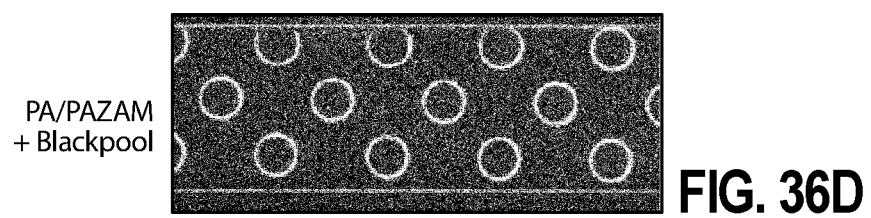
FIG. 36D depicts a 4× fluorescence micrograph of PA/PAZAM plus Blackpool after a reaction time of five minutes.
Figure 36E:
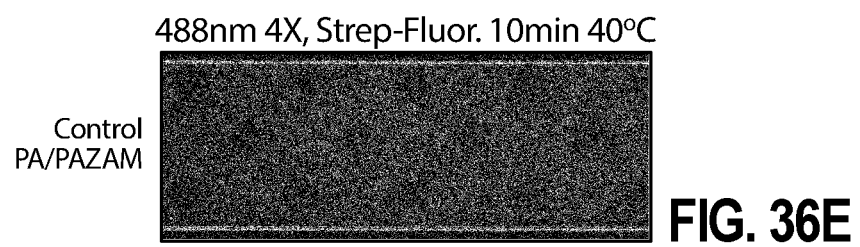
FIG. 36E depicts a 4× fluorescence micrograph of PA/PAZAM control (no biotin) after a reaction time of ten minutes at 40° C.
Figure 36F:
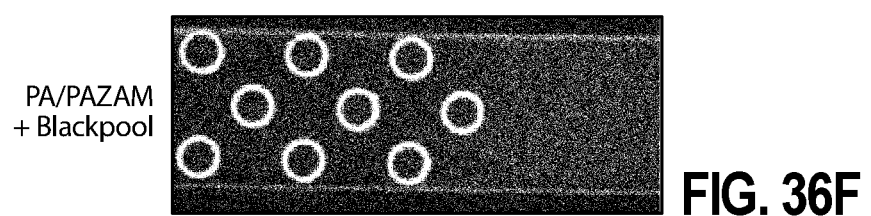
FIG. 36F depicts a 4× fluorescence micrograph of PA/PAZAM plus Blackpool after a reaction time of ten minutes at 40° C.

FIGS. 36A-36F are a series of bright field and fluorescence micrographs (488 nm excitation) depicting fluorescein-streptavidin staining of biotinylated hydrogel micropillars. FIG. 36A is 4× bright field micrograph of PA/PAZAM control (no biotin). FIG. 36B is a 4× bright field micrograph of PA/PAZAM plus Blackpool. FIG. 36C is a 4× fluorescence micrograph of PA/PAZAM control (no biotin) after a reaction time of five minutes. FIG. 36D is a 4× fluorescence micrograph of PA/PAZAM plus Blackpool after a reaction time of five minutes. FIG. 36E is a 4× fluorescence micrograph of PA/PAZAM control (no biotin) after a reaction time of ten minutes at 40° C. FIG. 36F is a 4× fluorescence micrograph of PA/PAZAM plus Blackpool after a reaction time of ten minutes at 40° C. FIGS. 36D and 7F demonstrate that fluorescein-labeled streptavidin binds biotin-conjugated hydrogel micropillars. In the control experiment (FIGS. 36C and 36E), polyacrylamide/PAZAM micropillars without biotin did not bind fluorescein-labeled streptavidin. These Figures clearly demonstrate that the biotin-conjugated (functionalized) hydrogel micropillars effectively bind targets of interest, i.e., fluorescein-labeled streptavidin, in this particular example.

Example 6: Streptavidin-Acrylamide Co-Polymer

In the example implementation shown in FIGS. 37A-37D, functionalized reversible hydrogel structures are formed within a channel on a flow cell by photopolymerization of acrylamide monomer, crosslinker, and streptavidin-labeled acrylamide monomer. Streptavidin functionalities of the hydrogel bind biotinylated capture oligonucleotides, which in turn hybridize to sequence library molecules of interest that are introduced into the flow cell. non-hybridized library fragments are washed out of the flow cell. Bound sequencing library fragments are then eluted from hydrogel micropillars located in the narrow channel (non-sequencing area) of the flow cell and seeded in the wide channel (sequencing area) of the flow cell in preparation for amplification, clustering, and sequencing-by-synthesis or sequencing by another method.

In FIG. 37A, a hydrogel precursor solution containing 10% polyacrylamide (PA) and 0.25% streptavidin-labeled acrylamide monomer is loaded onto flow cell 400. In FIG. 37A, flow cell 400 is a MiSeq™ flow cell having both a narrow channel 422 and a wide channel 424. In FIG. 37B, photomask 418, which includes a plurality of 200 µm apertures formed therein, is placed on top of flow cell 400, which is then exposed to UV light for 10 seconds to co-polymerize the acrylamide streptavidin-labeled acrylamide monomers and form an array 450 of streptavidin functionalized hydrogel micropillars 452 in narrow channel 422. In FIG. 37C, biotinylated capture oligonucleotides are bound to the streptavidin moieties in the hydrogel structures, and target library molecules hybridize to the biotinylated capture oligonucleotide and become immobilized on the hydrogel micropillars. In FIG. 37D, the immobilized target molecules are eluted from the capture oligonucleotides and seeded on wide channel 424 of flow cell 400 for amplification, clustering, and sequencing-by-synthesis or sequencing by another method.

With reference to FIGS. 38A-38C, streptavidin on the surface of hydrogel pillars 452 can be detected by incubation with biotinylated primers P5 and P7. FIG. 38A depicts biotinylated P5 and P7 primers (908 and 906 respectively) binding to streptavidin functionalized hydrogel micropillar 452. FIG. 38B depicts the biotinylated P5 and P7 primers (908 and 906 respectively) being incubated with TET-labeled complementary P5' and P7' oligonucleotides (909 and 907 respectively). FIG. 38C depicts the TET-labeled complementary P5' and P7' oligonucleotides (909 and 907 respectively) hybridized to the biotinylated P5 and P7 primers (908 and 906 respectively). Control hydrogel micropillars fabricated without streptavidin do not show staining with TET-labeled primers while streptavidin-containing pillars demonstrate staining with TET-labeled primers.

Figure 39A:
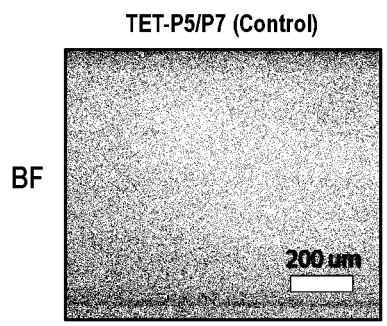
FIG. 39A is a bright field micrograph showing hydrogel micropillars incubated with TET-P5' and TET-P7' in the absence of biotin-P5 and biotin-P7 oligonucleotides.
Figure 39B:
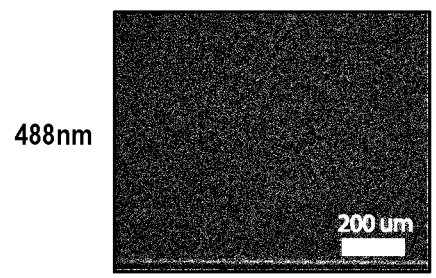
FIG. 39B is a fluorescence micrograph (488 nm excitation) showing hydrogel micropillars incubated with TET-P5' and TET-P7' in the absence of biotin-P5 and biotin-P7 oligonucleotides, wherein uniform staining of flow cell surface P5 and P7 primers was observed.
Figure 39C:
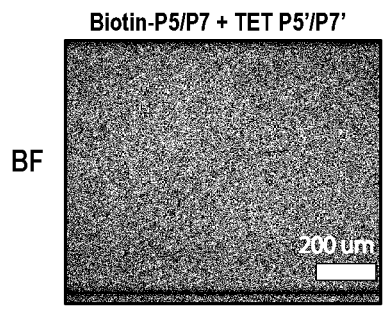
FIG. 39C is a bright field micrograph showing hydrogel micropillars incubated with TET-P5' and TET-P7' after incubation with biotin-P5 and biotin-P7 oligonucleotides.
Figure 39D:
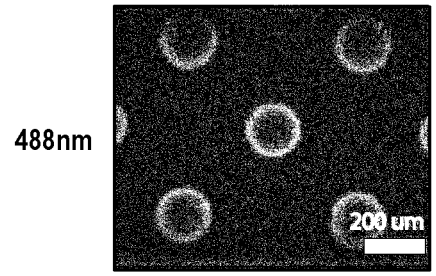
FIG. 39D is a fluorescence micrograph (488 nm excitation) showing of hydrogel micropillars incubated with TET-P5' and TET-P7' after incubation with biotin-P5 and biotin-P7 oligonucleotides, wherein localization of TET staining to the edge of the hydrogel micropillars was observed, indicating the TET-labeled oligonucleotides have hybridized to the streptavidin-bound biotinylated P5 and P7 primers.

FIG. 39A is a bright field micrograph showing hydrogel micropillars 452 incubated with TET-P5' and TET-P7' in the absence of biotin-P5 and biotin-P7 oligonucleotides. FIG. 39B is a fluorescence micrograph (488 nm excitation) showing hydrogel micropillars 452 incubated with TET-P5' and TET-P7' in the absence of biotin-P5 and biotin-P7 oligonucleotides, wherein uniform staining of flow cell surface P5 and P7 primers was observed. FIG. 39C is a bright field micrograph showing hydrogel micropillars 452 incubated with TET-P5' and TET-P7' after incubation with biotin-P5 and biotin-P7 oligonucleotides. FIG. 39D is a fluorescence micrograph (488 nm excitation) showing of hydrogel micropillars 452 incubated with TET-P5' and TET-P7' after incubation with biotin-P5 and biotin-P7 oligonucleotides, wherein localization of TET staining to the edge of the hydrogel micropillars was observed, indicating the TET-labeled oligonucleotides have hybridized to the streptavidin-bound biotinylated P5 and P7 primers.

Figure 40A:
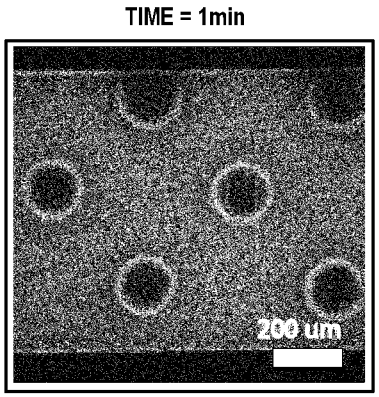
FIG. 40A is a fluorescence micrograph depicting the level of TET-P5'/TET-P7' oligonucleotides in interstitial spaces between hydrogel micropillars at an incubation time of one minute.
Figure 40B:
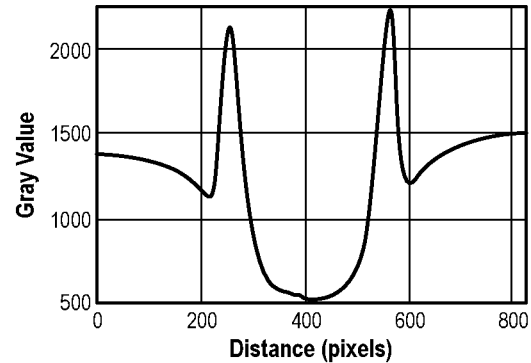
FIG. 40B is a graph depicting the level of TET-P5'/TET-P7' oligonucleotides in interstitial spaces between hydrogel micropillars at an incubation time of one minute.
Figure 40C:
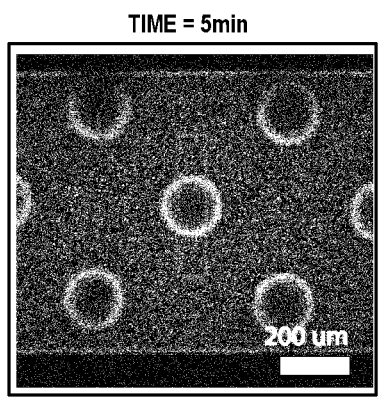
FIG. 40C is a fluorescence micrograph depicting the level of TET-P5'/TET-P7' oligonucleotides in interstitial spaces between hydrogel micropillars at an incubation time of five minutes.
Figure 40D:
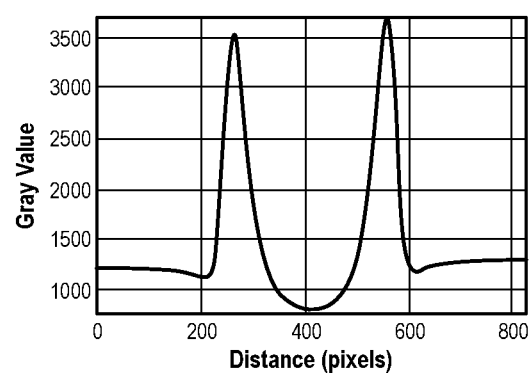
FIG. 40D is a graph depicting the level of TET-P5'/TET-P7' oligonucleotides in interstitial spaces between hydrogel micropillars at an incubation time of five minutes.
Figure 40E:
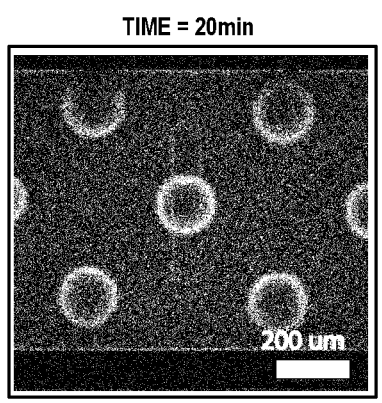
FIG. 40E is a fluorescence micrograph depicting the level of TET-P5'/TET-P7' oligonucleotides in interstitial spaces between hydrogel micropillars at an incubation time of ten minutes.
Figure 40F:
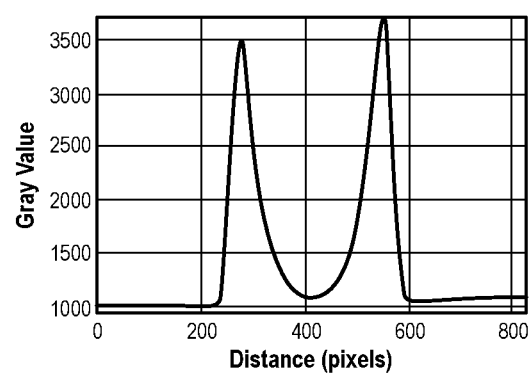
FIG. 40F is a graph depicting the level of TET-P5'/TET-P7' oligonucleotides in interstitial spaces between hydrogel micropillars at an incubation time of ten minutes.

When incubating TET-P5'/TET-P7' oligonucleotides with streptavidin containing micropillars that were previously incubated with biotin-P5 and biotin-P7 oligonucleotides, a depletion of TET-labeled primers was observed in the interstitial space between the micropillars on the flow cell as fluorescence increased at the surface of the micropillars and penetrated the hydrogel. FIG. 40A is a fluorescence micrograph depicting the level of TET-P5'/TET-P7' oligonucleotides in interstitial spaces between hydrogel micropillars at an incubation time of one minute and FIG. 40B is a graph depicting the level of TET-P5'/TET-P7' oligonucleotides in interstitial spaces between hydrogel micropillars at an incubation time of one minute, with distance shown on the X-axis and level shown on the Y-axis. FIG. 40C is a fluorescence micrograph depicting the level of TET-P5'/TET-P7' oligonucleotides in interstitial spaces between hydrogel micropillars at an incubation time of five minutes and FIG. 40D is a graph depicting the level of TET-P5'/TET-P7' oligonucleotides in interstitial spaces between hydrogel micropillars at an incubation time of five minutes, with distance shown on the X-axis and level shown on the Y-axis. FIG. 40E is a fluorescence micrograph depicting the level of TET-P5'/TET-P7' oligonucleotides in interstitial spaces between hydrogel micropillars at an incubation time of ten minutes and FIG. 40F is a graph depicting the level of TET-P5'/TET-P7' oligonucleotides in interstitial spaces between hydrogel micropillars at an incubation time of ten minutes, with distance shown on the X-axis and level shown on the Y-axis. The fluorescence intensity profiles represented by these micrographs demonstrate that binding of TET-labeled oligonucleotides to a hydrogel surface depletes the oligonucleotides in the interstitial areas between the micropillars.

With reference to FIGS. 41A-41C, to demonstrate the ability to capture and release target library molecules using the above-described example implementation, a PhiX library was incubated with biotinylated P5 and P7 primers (1:10). FIG. 41A depicts hybridizing P7' and P5' regions of sequencing library molecules (902 and 904 respectively) to biotinylated P5 and P7 oligonucleotides (906 and 908 respectively). FIG. 41B depicts capturing sequencing library molecules 902 and 904 with streptavidin-functionalized hydrogel pillars 452, which are attached to the surface of flow cell 400. FIG. 41C depicts seeding bound sequencing library molecules 902 and 904 by incubation at 85° C. to denature hybridized biotinylated primers 906 and 908 and then ramping the temperature to 20° C. to allow hybridization of library molecules 902 and 904 to surface primers 510 and 912 respectively. The hybridized PhiX library (1 pM) was then incubated in either an untreated flow cell (control) or streptavidin-pillar patterned flow cell. After incubation with library molecules hybridized to biotin-primers, flow cells were washed with HT-1, followed by seeding (80° C. 5 min, 60° C. 5 min, 40° C. 2 min and 20° C. 2 min), first extension (AMS-1, 50° C. 5 min) and 24 cycles of bridge amplification. While the control flow cell showed no clusters (see FIGS. 42A-42B), the streptavidin-pillar flow cells showed high cluster density (see FIGS. 42C-42F), demonstrating successful capture of a library hybridized to biotin-P5/biotin-P7.

Figure 43A:
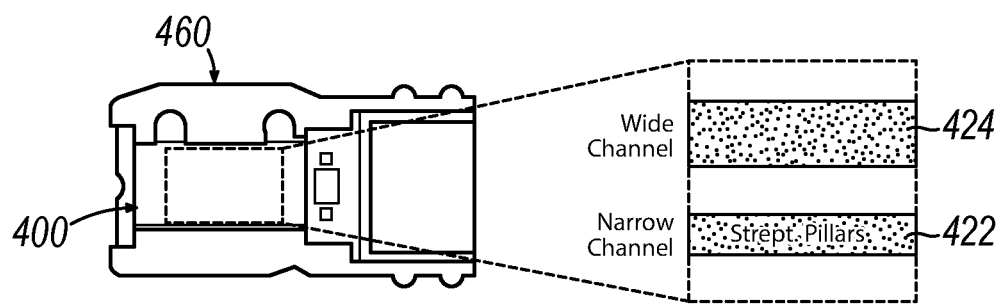
FIG. 43A depicts a flow cell in a cartridge, wherein streptavidin micropillars have been formed in the narrow channel, but not in wide channel of the flow cell.
Figure 43B:
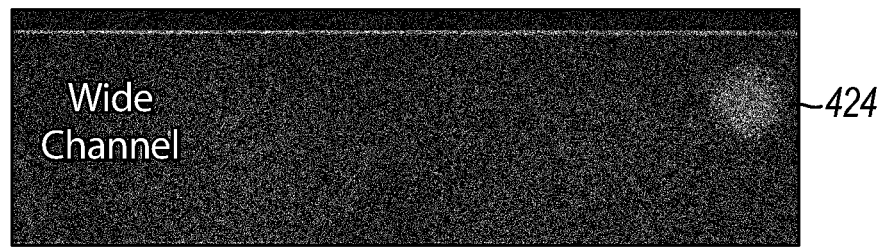
FIG. 43B is a micrograph of the wide channel of the flow cell of FIG. 43A stained with SYTOX dye after 24 cycles of bridge amplification.
Figure 43C:
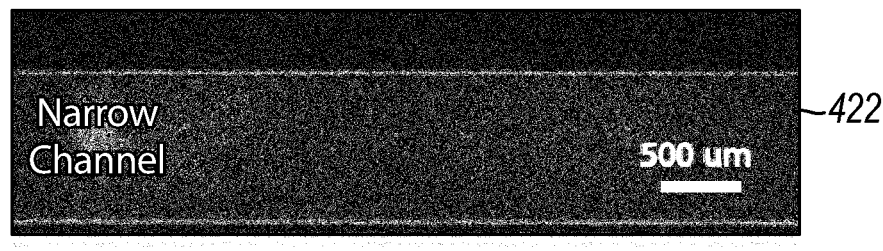
FIG. 43C is a micrograph of the narrow channel of the flow cell of FIG. 43A stained with SYTOX dye after 24 cycles of bridge amplification.

FIG. 42A is a bright field micrograph of an untreated flow cell (control) and FIG. 42B is a fluorescence micrograph (488 nm) of a SYTOX (ThermoFisher Scientific) stained untreated flow cell (control) showing no clusters. FIG. 42C is a bright field micrograph of a flow cell having streptavidin micropillars and FIG. 42D is a fluorescence micrograph (488 nm) of a SYTOX-stained flow cell having streptavidin micropillars. FIG. 42E is a bright field micrograph of the hydrogel micropillar of FIG. 42C. FIG. 42F is a fluorescence micrograph (488 nm) of the SYTOX-stained micropillar of FIG. 42D. The fluorescence micrographs of SYTOX-stained flow cells demonstrate that while untreated flow cells show no clusters, the flow cell having streptavidin-hydrogel pillars demonstrates high cluster density and pillar "footprints" where hydrogel micropillars had been patterned. Furthermore, when patterning only one channel (narrow channel) of a flow cell with streptavidin pillars, clusters show a gradient in density within the same flow cell, where cluster density close to pillars is higher. FIG. 43A depicts flow cell 400 in cartridge 460, wherein streptavidin micropillars have been formed in narrow channel 422, but not in wide channel 422. When streptavidin pillars are patterned only in the narrow channel of a MiSeq™ flow cell, cluster density forms a gradient from high close to the micropillars (narrow channel) to low far away from the micropillars (wide channel). FIG. 43B is a micrograph of wide channel 424 stained with SYTOX dye after 24 cycles of bridge amplification and FIG. 43C is a micrograph of narrow channel 422 stained with SYTOX dye after 24 cycles of bridge amplification. The descriptions below provide some additional examples related to the methods provided herein. They are not necessarily part of the non-limiting working examples provided above.

FIG. 44 is a flowchart depicting a first method for making functionalized three-dimensional polymer structures on a flow cell. Method 1500 comprises loading a polymer precursor solution into a flow cell at block 1902, wherein the polymer precursor solution includes a monomer, a cross-linker, a photoinitiator, and a functionalized polymer such as, for example, PAZAM containing azide moieties, and wherein the flow cell includes at least one channel for receiving the polymer precursor solution, and wherein the at least one channel has an upper interior surface and a lower interior surface; placing a photomask over the at least one channel at block 1904, wherein the photomask includes a series of apertures formed therein; and illuminating the polymer precursor solution through the photomask with a light source at block 1906, wherein the light source emits light at a wavelength that activates the photoinitiator, and wherein activation of the photoinitiator polymerizes the polymer precursor solution underneath the apertures in the photomask and forms three-dimensional polymer structures extending from the upper interior surface to the lower interior surface of the at least one channel.

Figure 45:
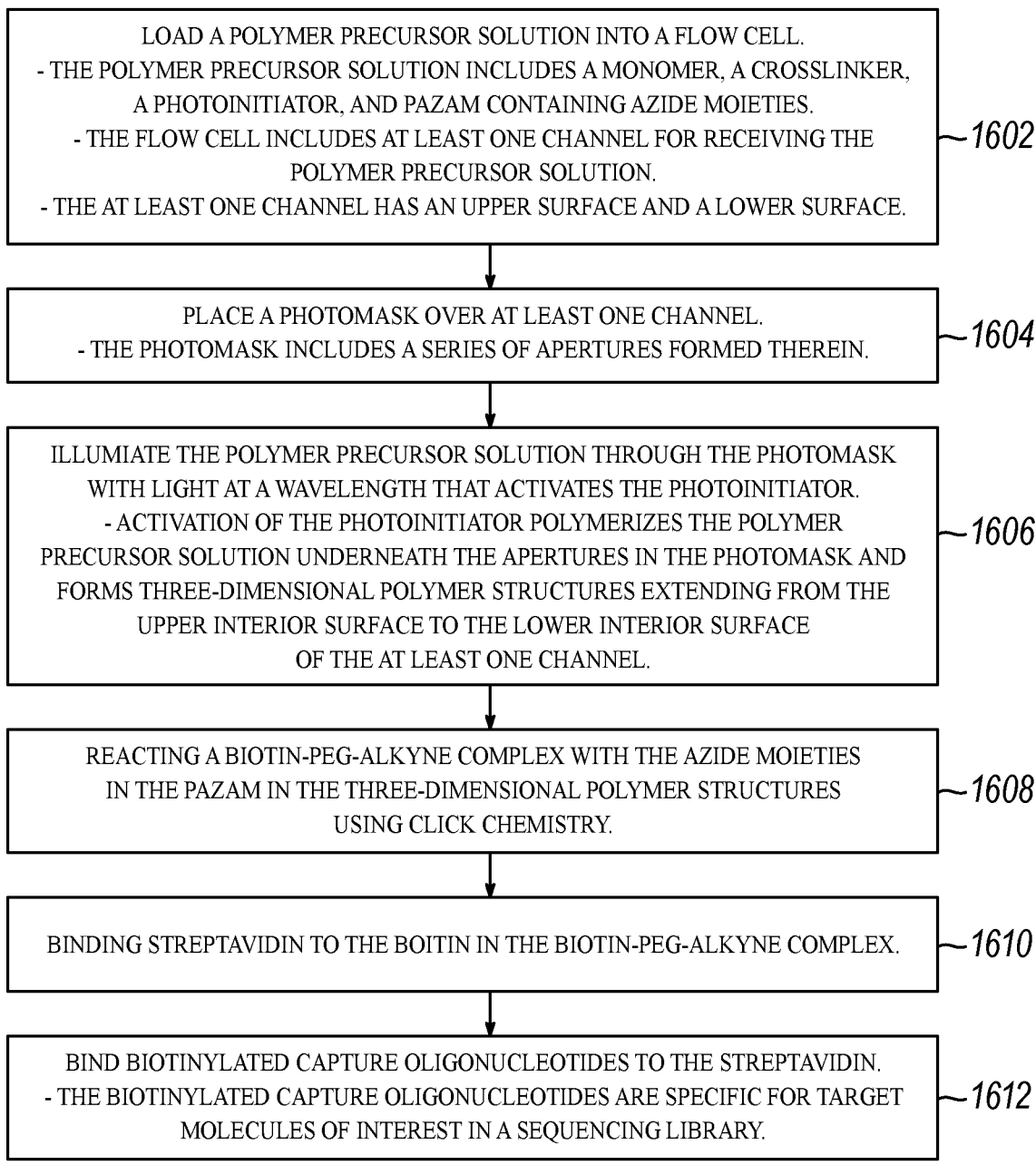
FIG. 45 is a flowchart depicting a second method for making functionalized three-dimensional polymer structures on a flow cell.

FIG. 45 is a flowchart depicting a second method for making functionalized three-dimensional polymer structures on a flow cell. Method 1600 comprises loading a polymer precursor solution into a flow cell at block 1602, wherein the polymer precursor solution includes a monomer, a crosslinker, a photoinitiator, and PAZAM containing azide moieties, and wherein the flow cell includes at least one channel for receiving the polymer precursor solution, and wherein the at least one channel has an upper interior surface and a lower interior surface; placing a photomask over the at least one channel at block 1604, wherein the photomask includes a series of apertures formed therein; illuminating the polymer precursor solution through the photomask with a light source at block 1606, wherein the light source emits light at a wavelength that activates the photoinitiator, and wherein activation of the photoinitiator polymerizes the polymer precursor solution underneath the apertures in the photomask and forms three-dimensional polymer structures extending from the upper interior surface to the lower interior surface of the at least one channel; reacting a biotin-PEG-alkyne complex with the azide moieties in the PAZAM in the three-dimensional polymer structures using an azide-alkyne click reaction at block 1608; binding streptavidin to the biotin in the biotin-PEG-alkyne complex at block 1610; and binding biotinylated capture oligonucleotides to the streptavidin at block 1612, wherein the biotinylated capture oligonucleotides are specific for target molecules of interest in a sequencing library.

Figure 46:
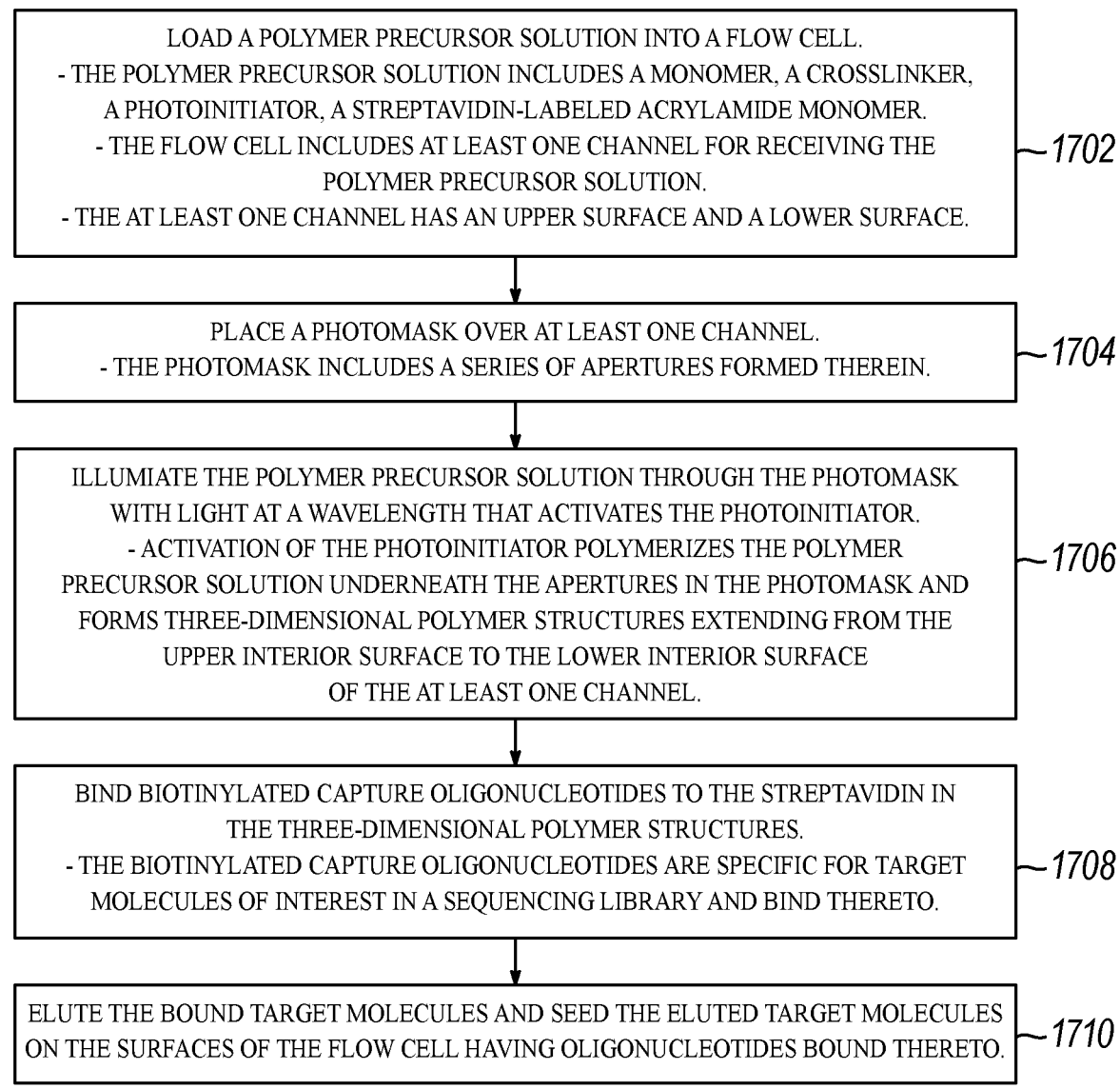
FIG. 46 is a flowchart depicting a third method for making functionalized three-dimensional polymer structures on a flow cell.

FIG. 46 is a flowchart depicting a third method for making functionalized three-dimensional polymer structures on a flow cell. Method 1700 comprises loading a polymer precursor solution into a flow cell at block 1702, wherein the polymer precursor solution includes a monomer, a crosslinker, a photoinitiator, and a streptavidin-labeled acrylamide monomer, and wherein the flow cell includes at least one channel for receiving the polymer precursor solution, and wherein the at least one channel has an upper interior surface and a lower interior surface; placing a photomask over the at least one channel at block 1704, wherein the photomask includes a series of apertures formed therein; illuminating the polymer precursor solution through the photomask with a light source at block 1706, wherein the light source emits light at a wavelength that activates the photoinitiator, and wherein activation of the photoinitiator polymerizes the polymer precursor solution underneath the apertures in the photomask and forms three-dimensional polymer structures extending from the upper interior surface to the lower interior surface of the at least one channel; binding biotinylated capture oligonucleotides to the streptavidin in the three-dimensional polymer structures at block 1708, wherein the biotinylated capture oligonucleotides are specific for target molecules of interest in a sequencing library and bind thereto; and eluting the bound target molecules and seeding the eluted target molecules on the surfaces of the flow cell having oligonucleotides bound thereto at block 1710.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated references and similar materials differs from or contradicts this application, including but not limited to defined terms, term usage, described techniques, or the like, this application controls.

As used herein, the singular forms "a," "an," and "the," refer to both the singular as well as plural, unless the context clearly indicates otherwise. The term "comprising" as used herein is synonymous with "including," "containing," or "characterized by," and is inclusive or open-ended and does not exclude additional, unrecited elements or method steps. Although many methods and materials similar or equivalent to those described herein can be used, particular suitable methods and materials are described herein. Unless context indicates otherwise, the recitations of numerical ranges by endpoints include all numbers subsumed within that range. Furthermore, references to "one implementation" are not intended to be interpreted as excluding the existence of additional implementations that also incorporate the recited features. Moreover, unless explicitly stated to the contrary, implementations "comprising" or "having" an element or a plurality of elements having a particular property may include additional elements whether or not they have that property.

The terms "substantially" and "about" used throughout this specification are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%, and/or 0%.

There may be many other ways to implement the subject technology. Various functions and elements described herein may be partitioned differently from those shown without departing from the scope of the subject technology. Various modifications to these implementations may be readily apparent to those skilled in the art, and generic principles defined herein may be applied to other implementations. Thus, many changes and modifications may be made to the subject technology, by one having ordinary skill in the art, without departing from the scope of the subject technology. For instance, different numbers of a given module or unit may be employed, a different type or types of a given module or unit may be employed, a given module or unit may be added, or a given module or unit may be omitted.

Underlined and/or italicized headings and subheadings are used for convenience only, do not limit the subject technology, and are not referred to in connection with the interpretation of the description of the subject technology. All structural and functional equivalents to the elements of the various implementations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

What is claimed is:

1. A method for making on-flow cell three-dimensional polymer structures with biological cells or genetic material embedded in the three-dimensional polymer structures, comprising:
    loading a polymer precursor solution onto a flow cell,
        wherein the polymer precursor solution includes the biological cells or genetic material,
        a monomer, a crosslinker, and a photoinitiator,
        wherein the flow cell includes at least one channel for receiving the polymer precursor solution, and
        wherein the at least one channel has an upper interior surface defined by an upper flow cell substrate and a lower interior surface defined by a lower flow cell substrate; and
    illuminating the polymer precursor solution through the upper flow cell substrate via a patterned photomask using a light at a wavelength sufficient to activate the photoinitiator, wherein activation of the photoinitiator polymerizes at least some of the polymer precursor solution underneath apertures in the patterned photomask and forms three-dimensional polymer structures in which the biological cells or genetic material is embedded that extend from the upper interior surface to the lower interior surface of the at least one channel.

2. The method of claim 1, further comprising a light source, wherein the light source is an ultraviolet light source.

3. The method of claim 1, further comprising cleaving at least some of the three-dimensional polymer structures from the flow cell using heat, cleaving chemicals, or a combination of heat and cleaving chemicals.

4. The method of claim 1, wherein the monomer is the compound of formula I:

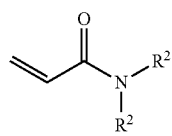

(I)

wherein each $R^2$ is independently hydrogen or $(C_{1-6})$ alkyl.

5. The method of claim 1, wherein the crosslinker is a compound of formula II:

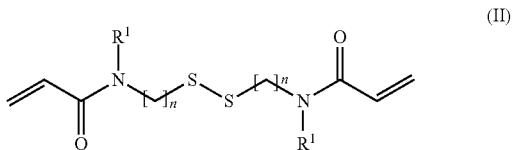

(II)

wherein:
    each n is independently an integer from 1-6; and
    each $R^1$ is independently hydrogen or $(C_{1-6})$ alkyl.

6. The method of claim 1, wherein the photoinitiator is a diazosulfonate initiator; a monoacylphosphineoxide (MAPO) salt; a bisacylphosphineoxide (BAPO) salt; or combinations thereof.

7. The method of claim 1, wherein the monomer is acrylamide, the crosslinker is N,N'-Bis(acryloyl) cystamine (BACy), and the photoinitiator is lithium phenyl-2,4,6-trimethylbenzoylphosphinate (LAP).

8. The method of claim 1, wherein the polymer precursor solution includes polyethylene glycol (PEG)-thiol, PEG-acrylate, acrylamide, N,N'-Bis(acryloyl)cystamine (BACy), PEG, polypropylene oxide (PPO), polyacrylic acid, poly(hydroxyethyl methacrylate) (PHEMA), poly(methyl methacrylate) (PMMA), poly(N-isopropylacrylamide) (PNIPAAm), poly(lactic acid) (PLA), poly(lactic-co-glycolic acid) (PLGA), polycaprolactone (PCL), poly(vinylsulfonic acid) (PVSA), poly(L-aspartic acid), poly(L-glutamic acid), polylysine, agar, agarose, alginate, heparin, alginate sulfate, dextran sulfate, hyaluronan, pectin, carrageenan, gelatin, chitosan, cellulose, collagen, bisacrylamide, diacrylate, diallylamine, triallylamine, divinyl sulfone, diethyleneglycol diallyl ether, ethyleneglycol diacrylate, polymethyleneglycol diacrylate, polyethyleneglycol diacrylate, trimethylopropaane trimethacrylate, ethoxylated trimethylol triacrylate, ethoxylated pentaerythritol tetracrylate, or combinations thereof.

9. The method of claim 1, wherein the polymer precursor solution includes polyethylene glycol (PEG)-thiol/PEG-acrylate; acrylamide/N,N'-bis(acryloyl)cystamine (BACy); PEG/polypropylene oxide (PPO), or combinations thereof.

10. The method of claim 1, wherein the photomask comprises polyethylene terephthalate, carbon ink, a chemically etched metal film, or combinations thereof.

11. The method of claim 1, wherein the three-dimensional polymer structures are cylindrical.

12. The method of claim 1, wherein the three-dimensional polymer structures are reverse C-shaped.

13. The method of claim 1, further comprising reacting a bi-functional linker, having a first end and a second end, with a functionalized polymer, wherein the first end of the bi-functional linker is chemically or enzymatically attached to the functionalized polymer, and wherein the second end of the bi-functional linker selectively binds predetermined types of molecules.

14. The method of claim 13, wherein the functionalized polymer is poly(N-(5-azidoacetamidylpentyl) acrylamide-co-acrylamide (PAZAM) containing azide moieties and wherein the bi-functional linker is a biotin-PEG-alkyne complex, and the method further comprising reacting the biotin-PEG-alkyne complex with the azide moieties in the PAZAM using an azide-alkyne click reaction.

15. The method of claim 14, further comprising binding a streptavidin to a biotin in the biotin-PEG-alkyne complex.

16. The method of claim 15, further comprising binding a biotinylated capture oligonucleotide to the streptavidin, wherein the biotinylated capture oligonucleotide is specific for a target of interest in a sequencing library.

17. A method for sequencing in three-dimensions using an on flow-cell three-dimensional sequencing matrix, comprising:
   loading a polymer precursor solution into a flow cell, wherein the polymer precursor solution includes monomers and oligonucleotides;
   polymerizing the polymer precursor solution to create a permeable three-dimensional polymer matrix within the flow cell;
   diffusing a sequencing library into the permeable three-dimensional polymer matrix, wherein the sequencing library includes nucleic acid fragments;
   diffusing enzymes and reagents into the permeable three-dimensional polymer matrix;
   hybridizing the nucleic acid fragments to the oligonucleotides in the permeable three-dimensional polymer matrix to produce hybridized nucleic acid fragments;
   clonally amplifying the hybridized nucleic acid fragments to create clusters for sequencing within the permeable three-dimensional polymer matrix;
   sequencing the clusters within the permeable three-dimensional polymer matrix; and
   optically imaging the sequenced clusters within the three-dimensional polymer matrix in multiple, discrete two-dimensional slices to characterize the sequencing library, wherein the multiple, discrete two-dimensional slices represent the entire three-dimensional internal volume of the flow cell.

18. The method of claim 17, further comprising fragmenting a released nucleic acid and ligating adapters to the ends of the nucleic acid fragments.

19. The method of claim 18, further comprising seeding the nucleic acid fragments on upper and lower surfaces of at least one sequencing channel by:
   introducing a diffusion barrier into the at least one sequencing channel,
   heating the flow cell to a temperature that cleaves the polymer structures and releases the nucleic acid fragments therefrom,
   hybridizing the nucleic acid fragments to the oligonucleotides on the upper and lower surfaces of the at least one sequencing channel, and
   washing the cleaved polymer structures out of the flow cell.

20. A flow cell, comprising:
   a channel, wherein the channel includes an upper interior surface having primers coated thereon and a lower interior surface having primers coated thereon; and
   reversible, permeable, three-dimensional polymer structures in the channel from a polymer precursor solution, wherein the three-dimensional polymer structures extend from the upper interior surface of the channel to the lower interior surface of the channel.

* * * * *

SEQUENCE LISTING

```
<160> NUMBER OF SEQ ID NOS: 2

<210> SEQ ID NO 1
<211> LENGTH: 20
<212> TYPE: DNA
<213> ORGANISM: Artificial Sequence
<220> FEATURE:
<223> OTHER INFORMATION: P5

<400> SEQUENCE: 1
aatgatacgg cgaccaccga                                                 20

<210> SEQ ID NO 2
<211> LENGTH: 21
<212> TYPE: DNA
<213> ORGANISM: Artificial Sequence
<220> FEATURE:
<223> OTHER INFORMATION: P7

<400> SEQUENCE: 2
caagcagaag acggcatacg a                                               21
```